(12) United States Patent
Masuoka et al.

(10) Patent No.: US 9,741,801 B2
(45) Date of Patent: Aug. 22, 2017

(54) METHOD FOR PRODUCING A SEMICONDUCTOR DEVICE

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/213,565

(22) Filed: Jul. 19, 2016

(65) Prior Publication Data

US 2016/0329404 A1    Nov. 10, 2016

Related U.S. Application Data

(62) Division of application No. 14/744,588, filed on Jun. 19, 2015, now Pat. No. 9,431,501.

(30) Foreign Application Priority Data

Aug. 7, 2014 (WO) .................. PCT/JP2014/070877

(51) Int. Cl.
*H01L 21/336* (2006.01)
*H01L 29/40* (2006.01)
(Continued)

(52) U.S. Cl.
CPC ...... *H01L 29/401* (2013.01); *H01L 21/02532* (2013.01); *H01L 21/02587* (2013.01);
(Continued)

(58) Field of Classification Search
CPC ........... H01L 29/42392; H01L 27/0921; H01L 29/401; H01L 29/0653; H01L 21/3247; H01L 21/02532; H01L 21/02587; H01L 21/02639; H01L 21/31105; H01L 21/762
See application file for complete search history.

(56) References Cited

U.S. PATENT DOCUMENTS 5,308,778 A    5/1994 Fitch et al.
5,378,652 A    1/1995 Samata et al.
(Continued)

FOREIGN PATENT DOCUMENTS

EP    1804286 A1    7/2007
JP    H02-071556 A    3/1990
(Continued)

OTHER PUBLICATIONS

Office Action in corresponding U.S. Appl. No. 14/744,588, dated Jan. 4, 2016, 6 pages.
(Continued)

*Primary Examiner* — A. Sefer
(74) *Attorney, Agent, or Firm* — Brinks Gilson & Lione

(57) ABSTRACT

A method for producing a semiconductor device includes depositing an oxide film containing an impurity having a first conductivity type on a substrate. A nitride film is deposited and a first oxide film is deposited that contains an impurity having a second conductivity type that differs from the first conductivity type. The first oxide film, the nitride film, and the second oxide film are etched to form a contact hole. An epitaxial growth process is carried out form a first pillar-shaped silicon layer in the contact hole. The nitride film is removed and epitaxial growth process is performed to form an output terminal.

2 Claims, 59 Drawing Sheets

(51) Int. Cl.
*H01L 21/02* (2006.01)
*H01L 21/311* (2006.01)
*H01L 21/324* (2006.01)
*H01L 21/762* (2006.01)
*H01L 27/092* (2006.01)
*H01L 29/06* (2006.01)
*H01L 29/423* (2006.01)
*H01L 29/78* (2006.01)
*H01L 21/8238* (2006.01)

(52) U.S. Cl.
CPC .. *H01L 21/02639* (2013.01); *H01L 21/31105* (2013.01); *H01L 21/31111* (2013.01); *H01L 21/324* (2013.01); *H01L 21/3247* (2013.01); *H01L 21/762* (2013.01); *H01L 21/823885* (2013.01); *H01L 27/092* (2013.01); *H01L 27/0921* (2013.01); *H01L 29/0653* (2013.01); *H01L 29/42392* (2013.01); *H01L 29/7827* (2013.01); *H01L 21/823814* (2013.01)

(56) References Cited

U.S. PATENT DOCUMENTS

| | | |
|---|---|---|
| 5,721,168 A | 2/1998 | Wu |
| 9,230,810 B2* | 1/2016 | Lu ................... H01L 21/2205 |
| 2003/0170954 A1* | 9/2003 | Rudeck ............ H01L 21/76816 438/266 |
| 2010/0270611 A1 | 10/2010 | Masuoka et al. |
| 2012/0273863 A1 | 11/2012 | Ozawa et al. |

FOREIGN PATENT DOCUMENTS

| | | | |
|---|---|---|---|
| JP | H02-188966 | A | 7/1990 |
| JP | H03-145761 | A | 6/1991 |
| JP | 06-013623 | A | 1/1994 |
| JP | 2008-300558 | A | 12/2008 |
| JP | 2011-023543 | * | 2/2011 |
| JP | 2011-023543 | A | 2/2011 |
| JP | 2011-108895 | A | 6/2011 |
| JP | 2014-057068 | A | 3/2014 |

OTHER PUBLICATIONS

Office Action in corresponding U.S. Appl. No. 14/744,588, dated Apr. 18, 2016, 7 pages.

Notice of Allowance in corresponding U.S. Appl. No. 14/744,588, dated Jun. 16, 2016, 7 pages.

English language translation of International Preliminary Report on Patentability in corresponding International Application No. PCT/JP2014/070877, dated Feb. 16, 2017, 8 pages.

* cited by examiner

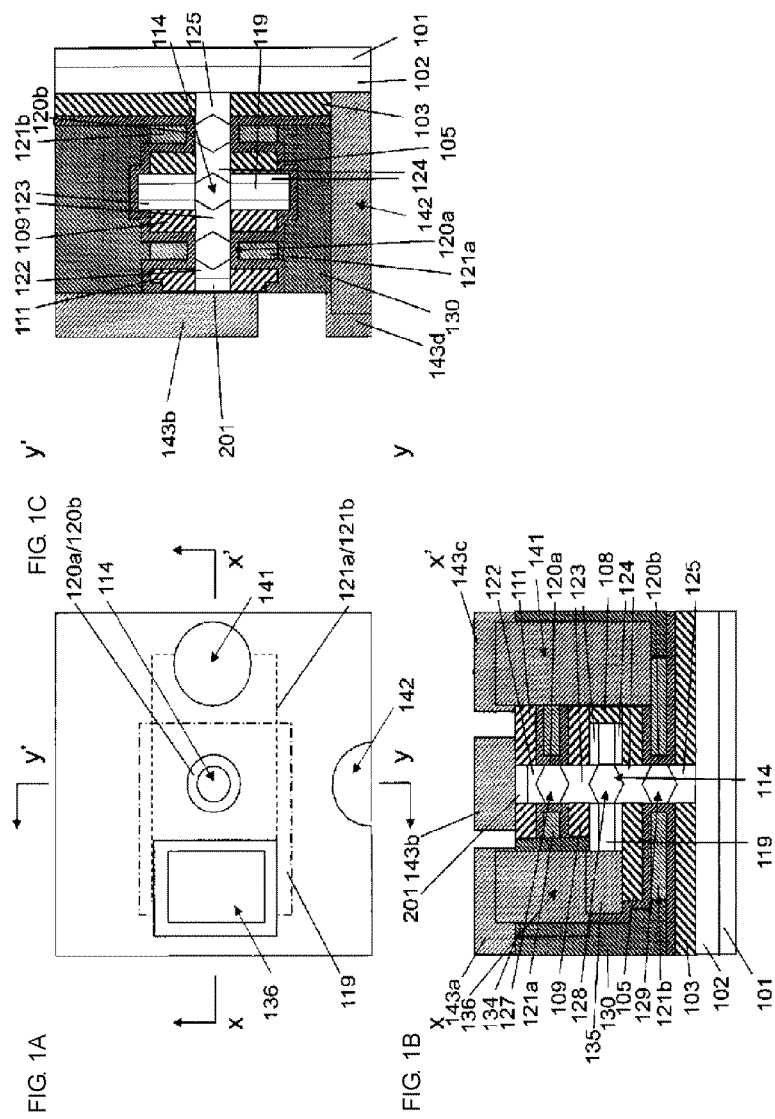

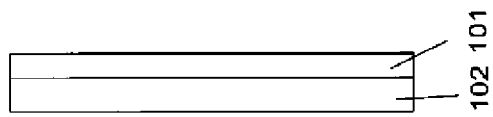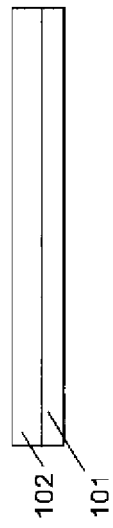

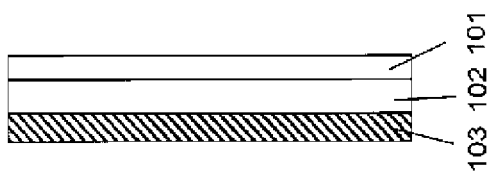
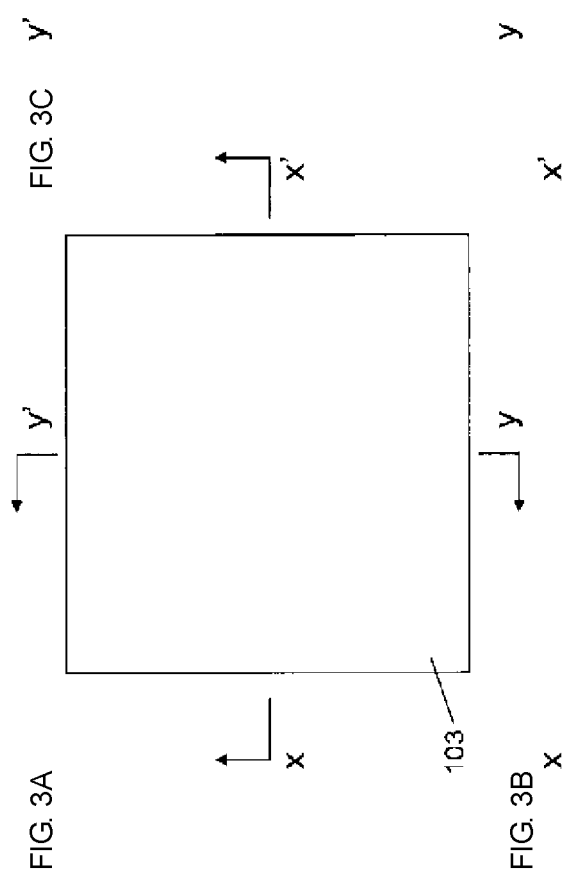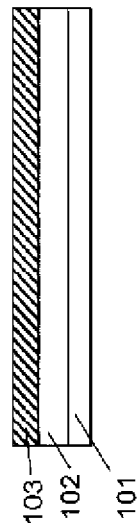

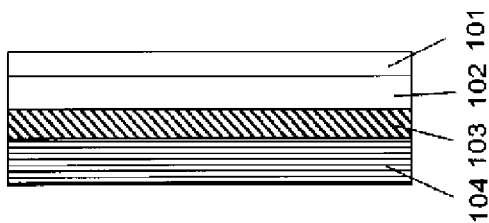
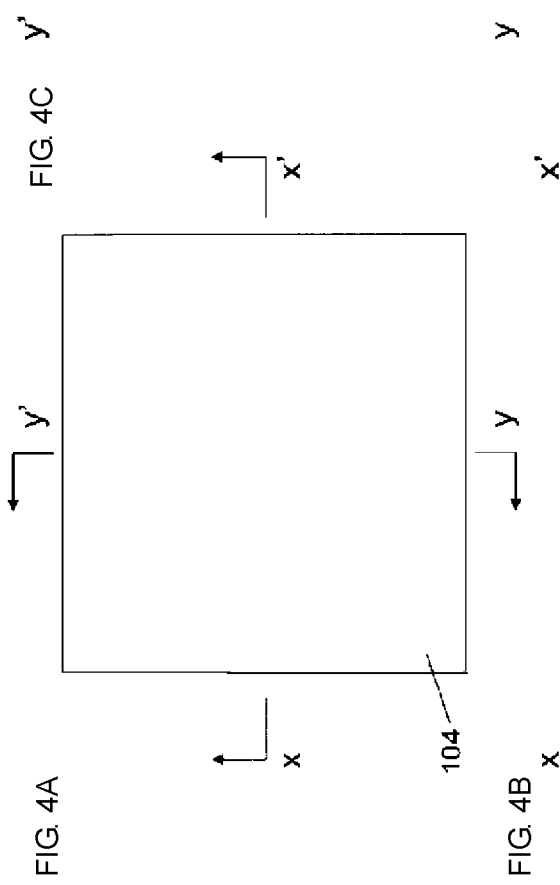
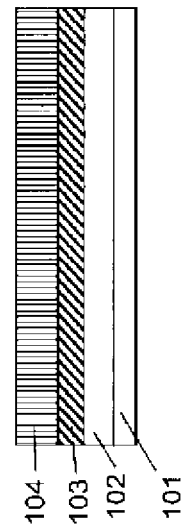

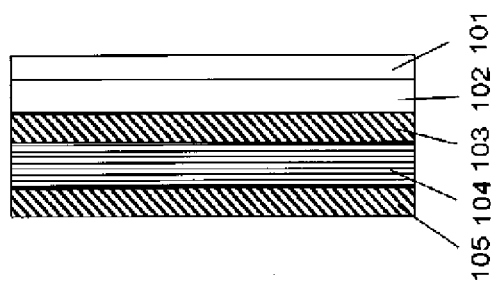
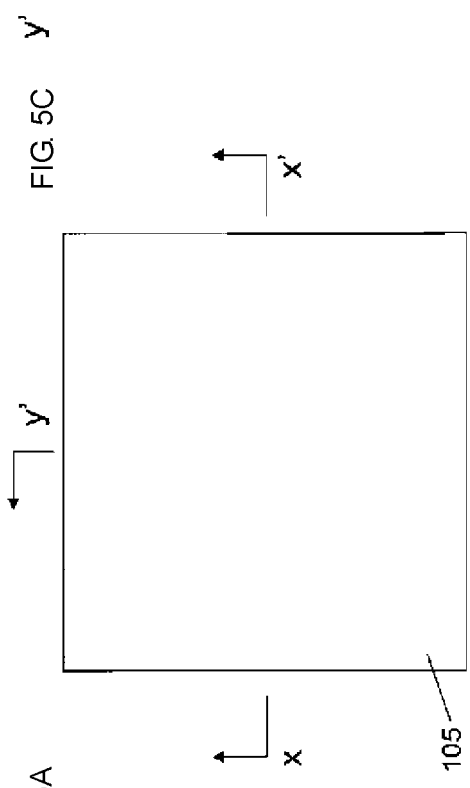
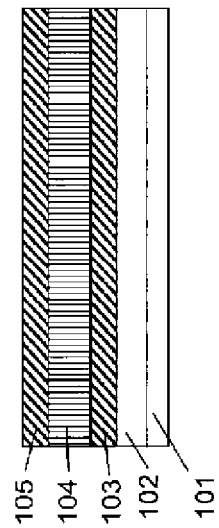
FIG. 5A
FIG. 5B
FIG. 5C

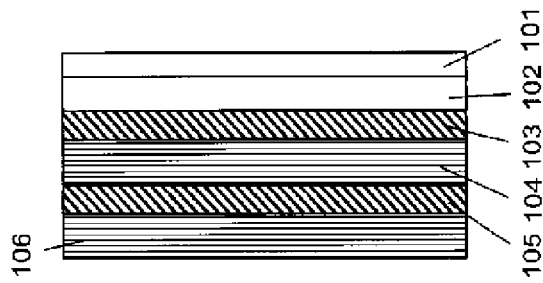
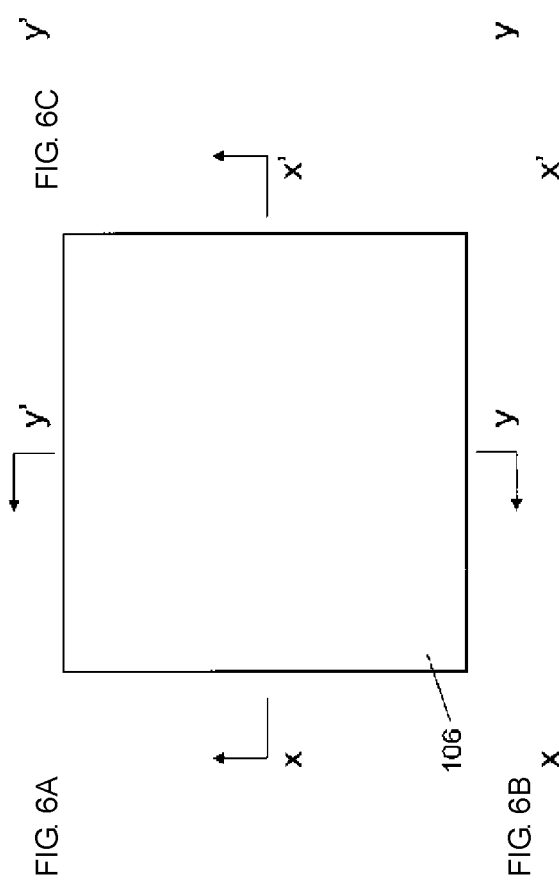
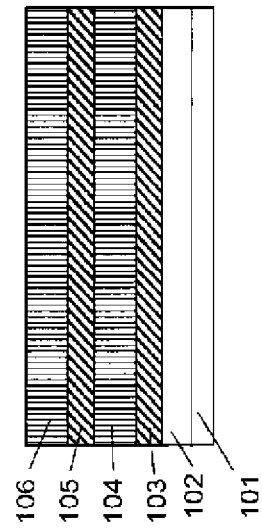
FIG. 6A
FIG. 6B
FIG. 6C

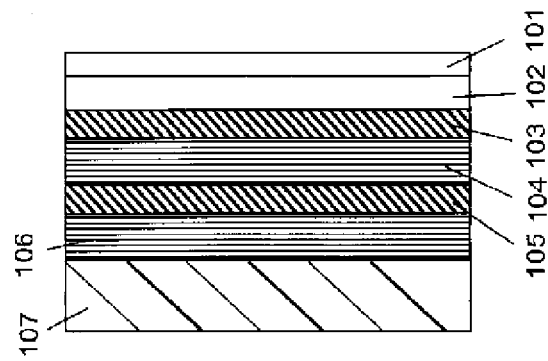
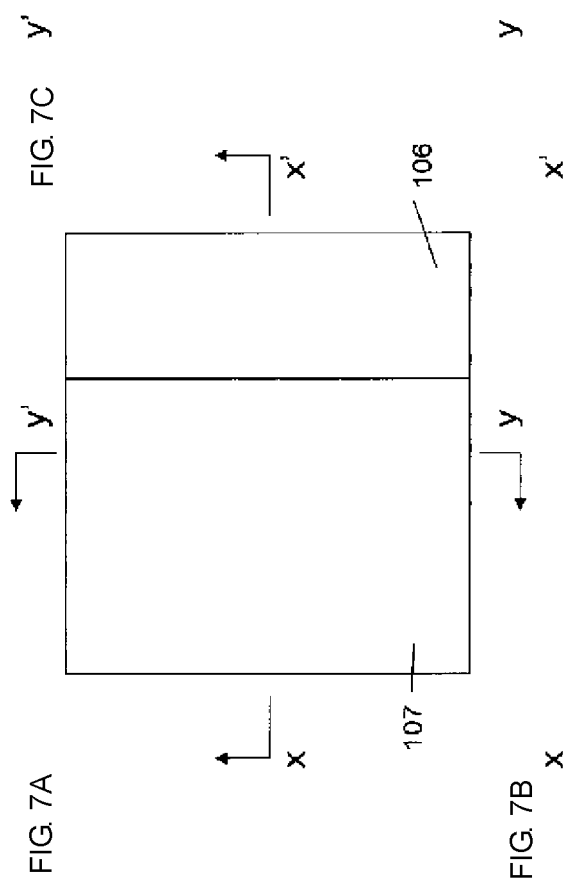

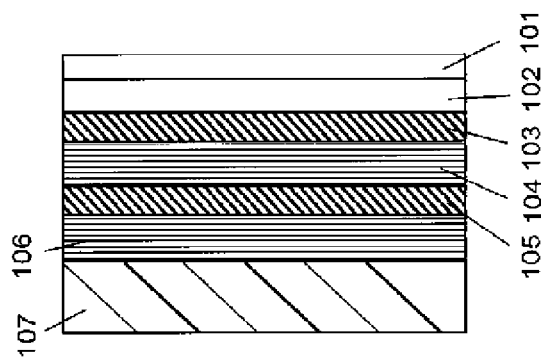
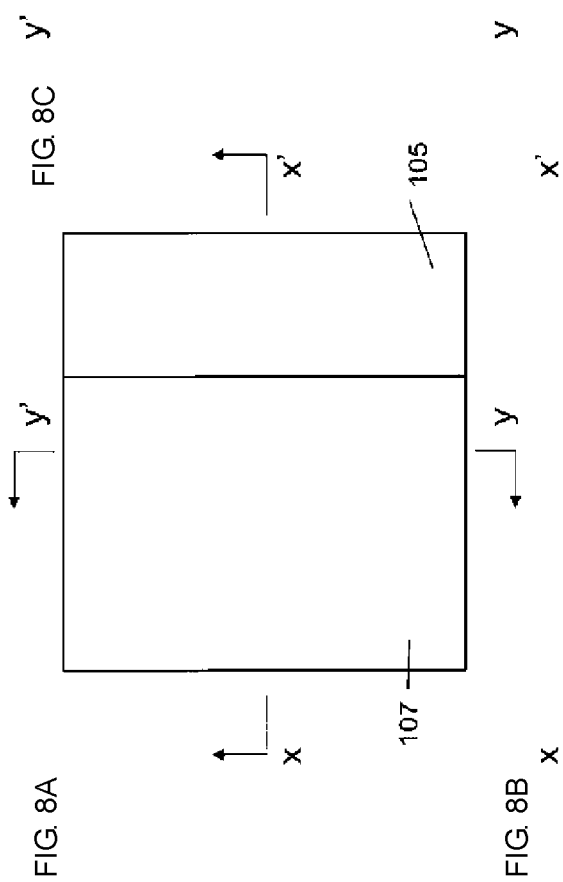
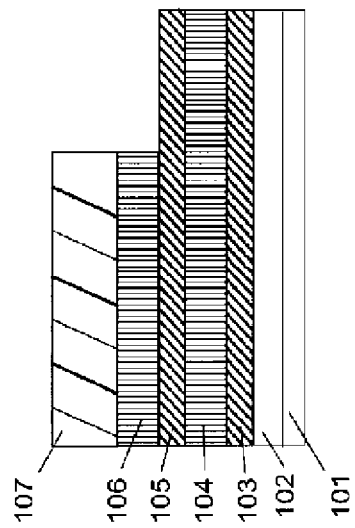
FIG. 8A
FIG. 8B
FIG. 8C

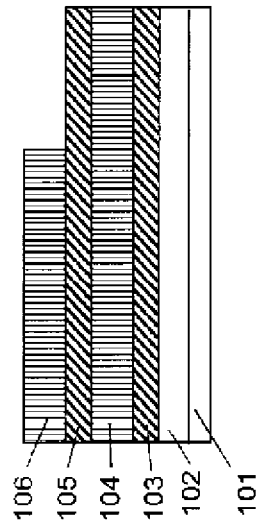
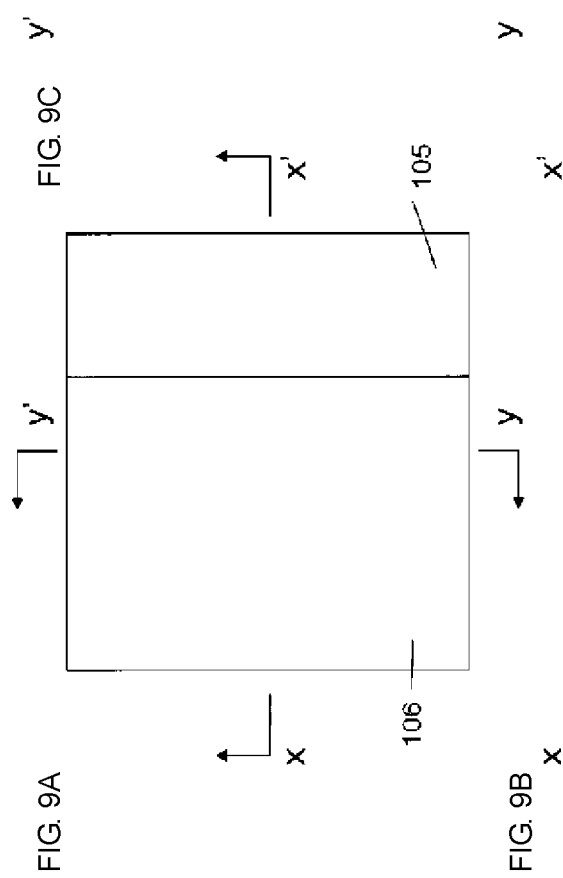
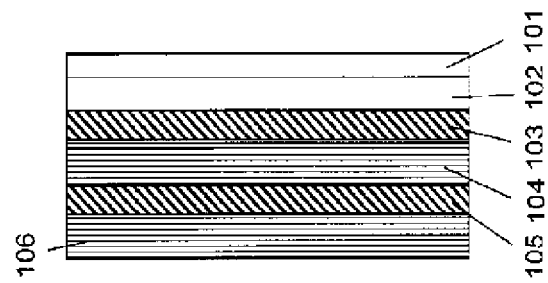
FIG. 9A
FIG. 9B
FIG. 9C

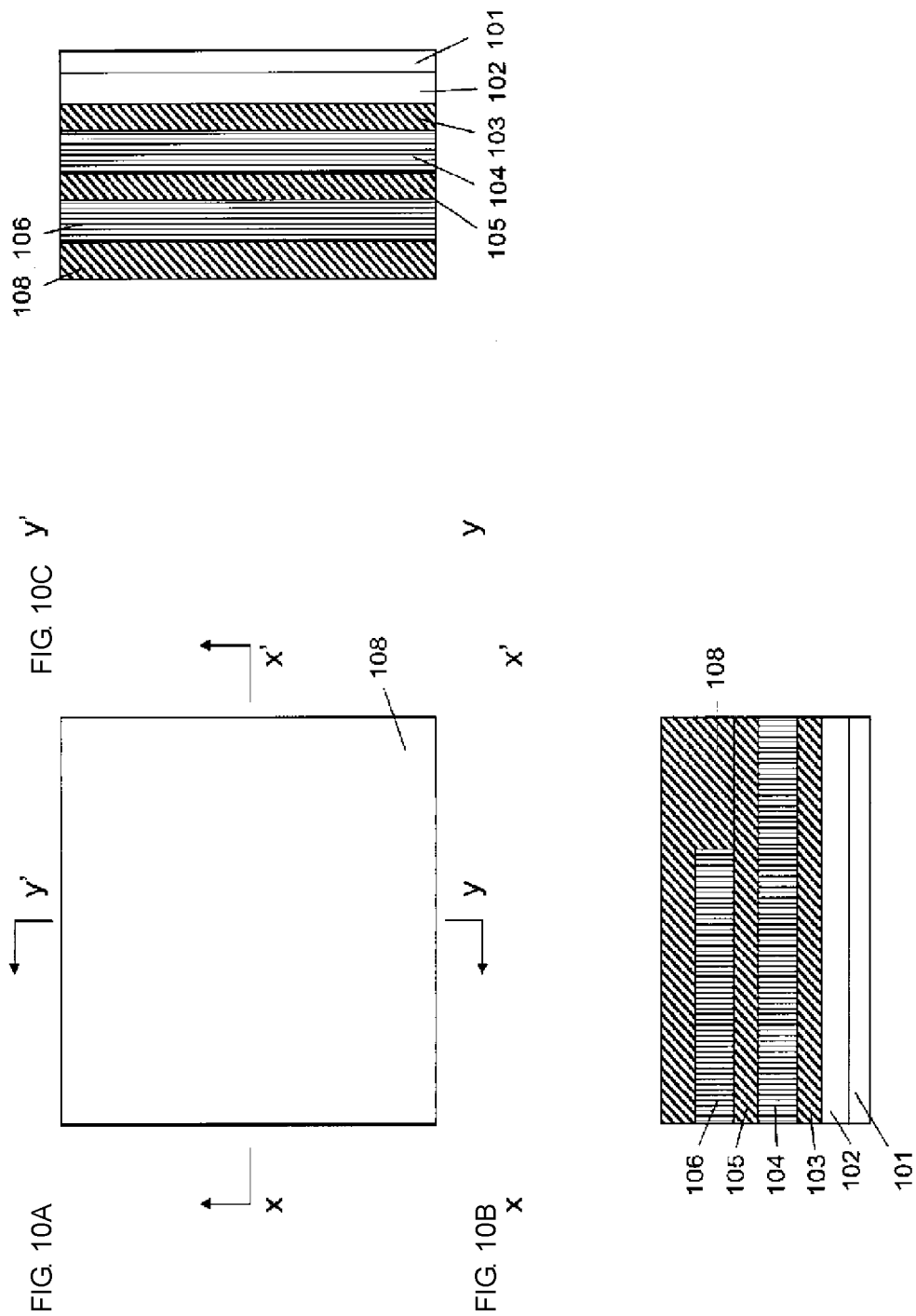

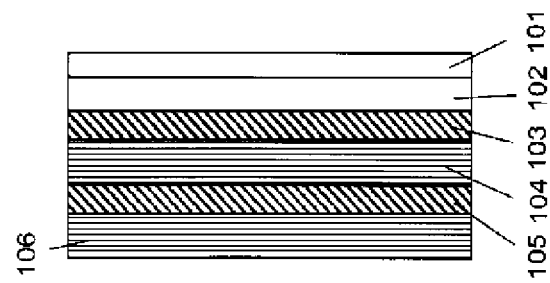
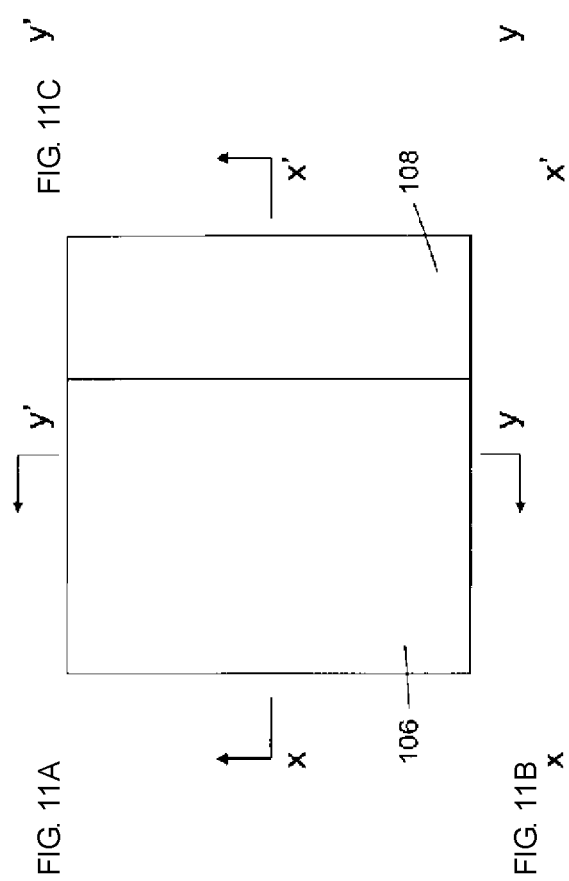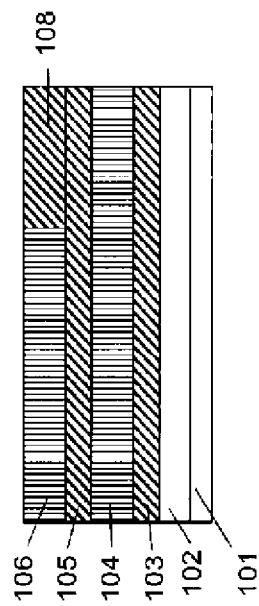
FIG. 11C
FIG. 11A
FIG. 11B

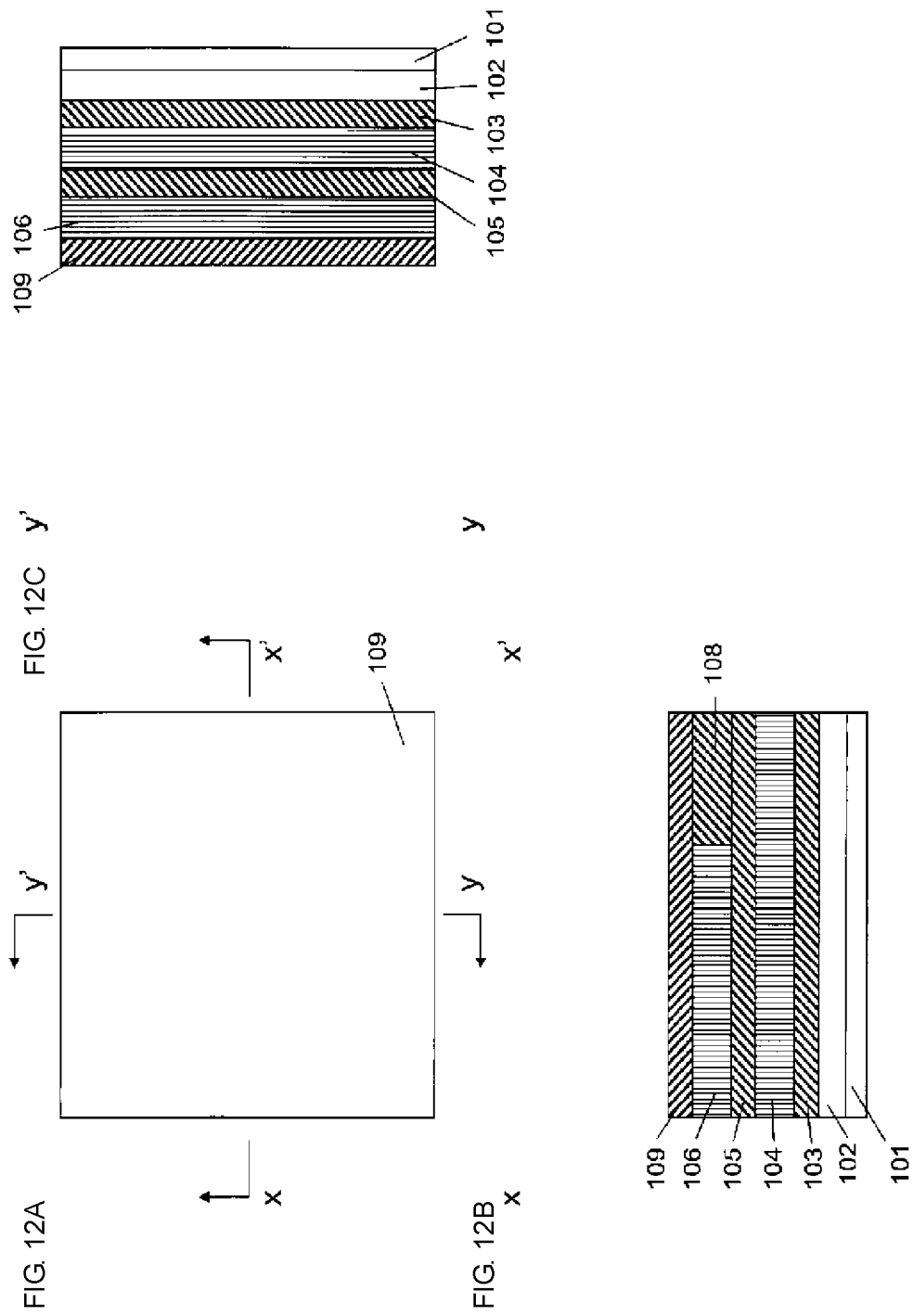

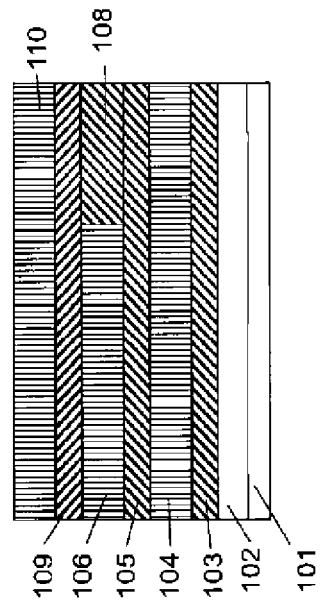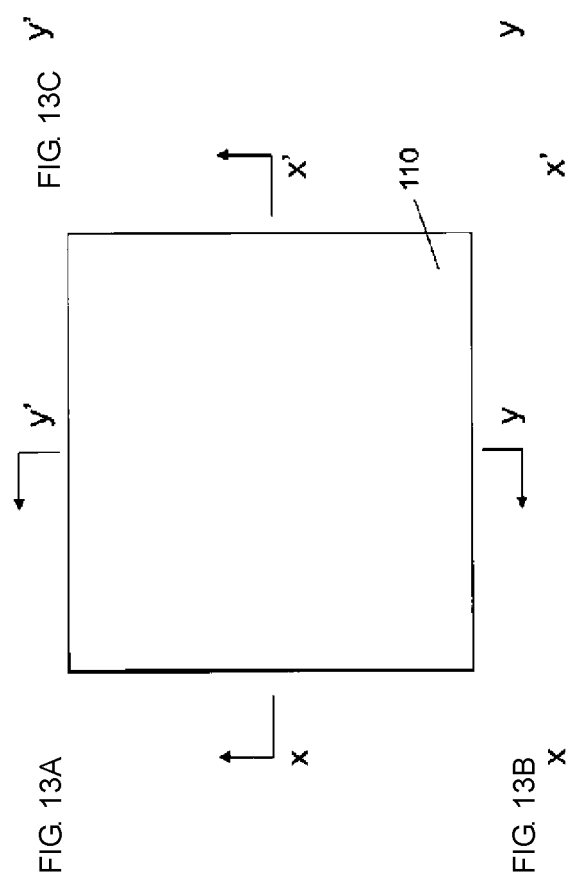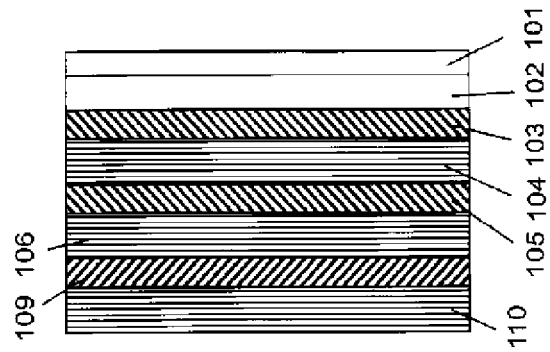

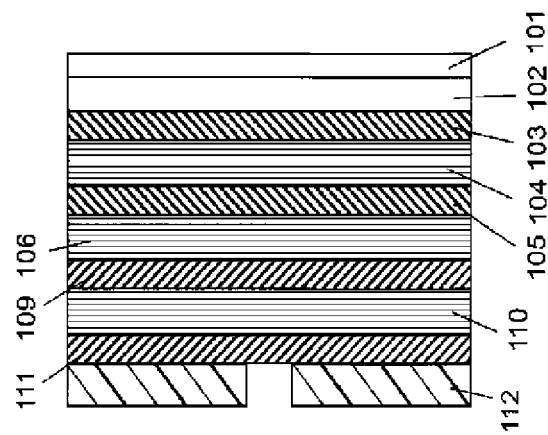
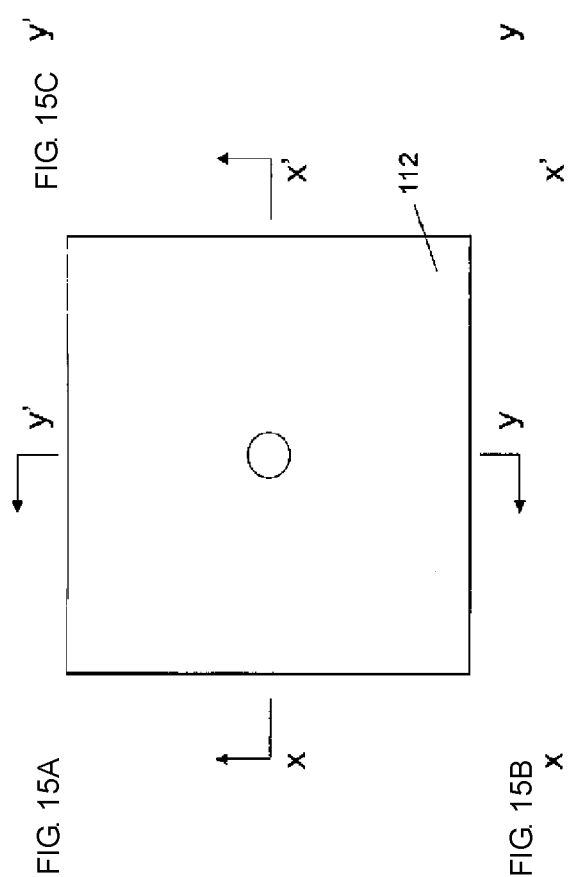
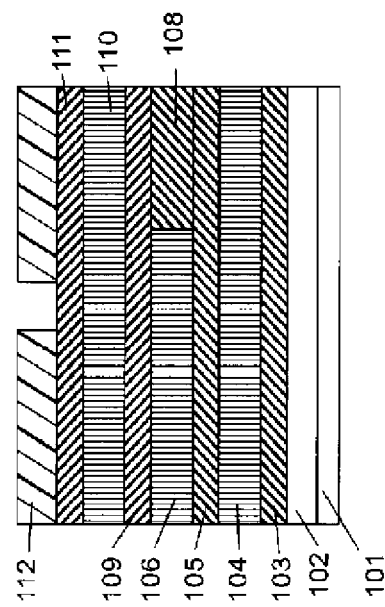

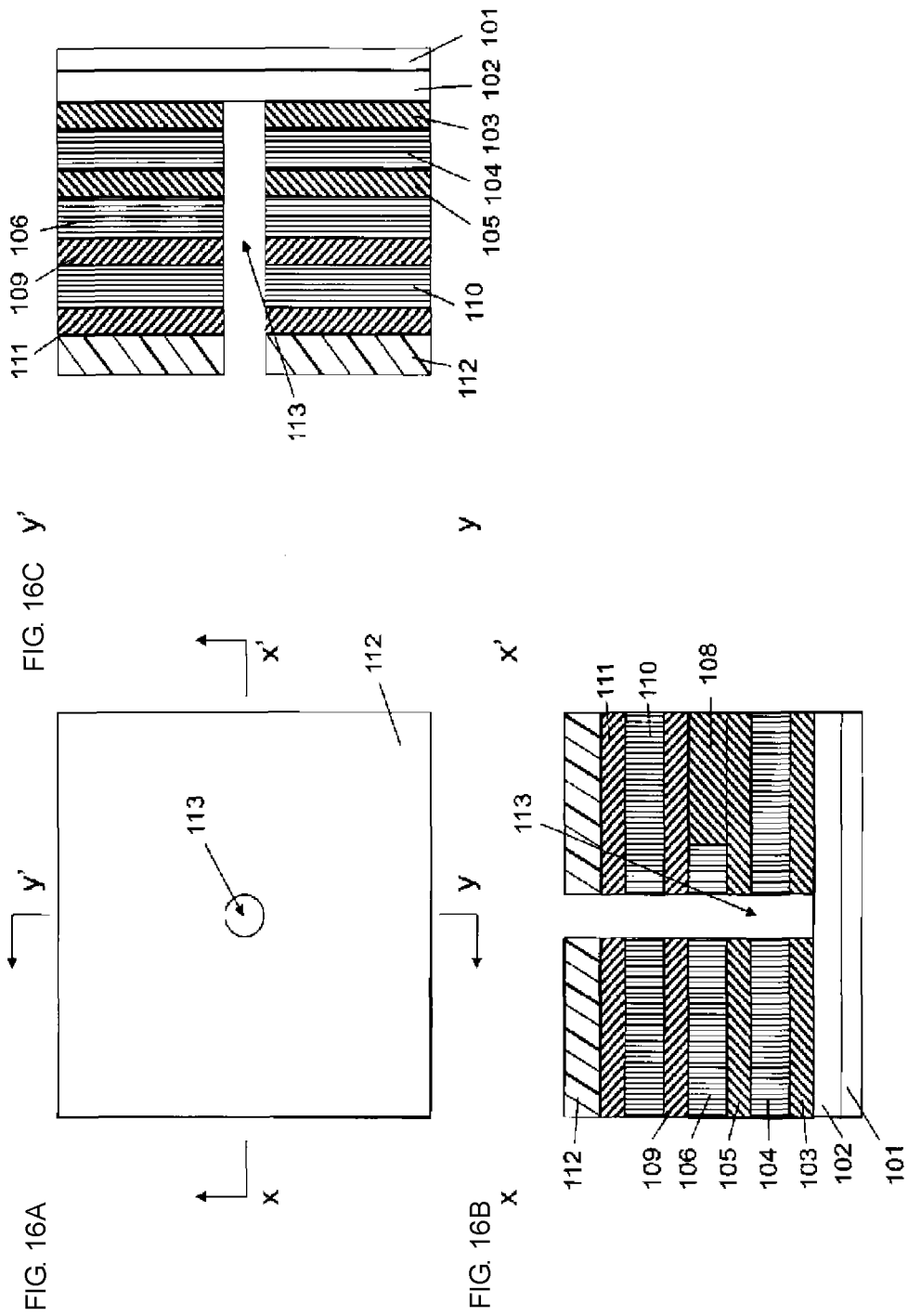

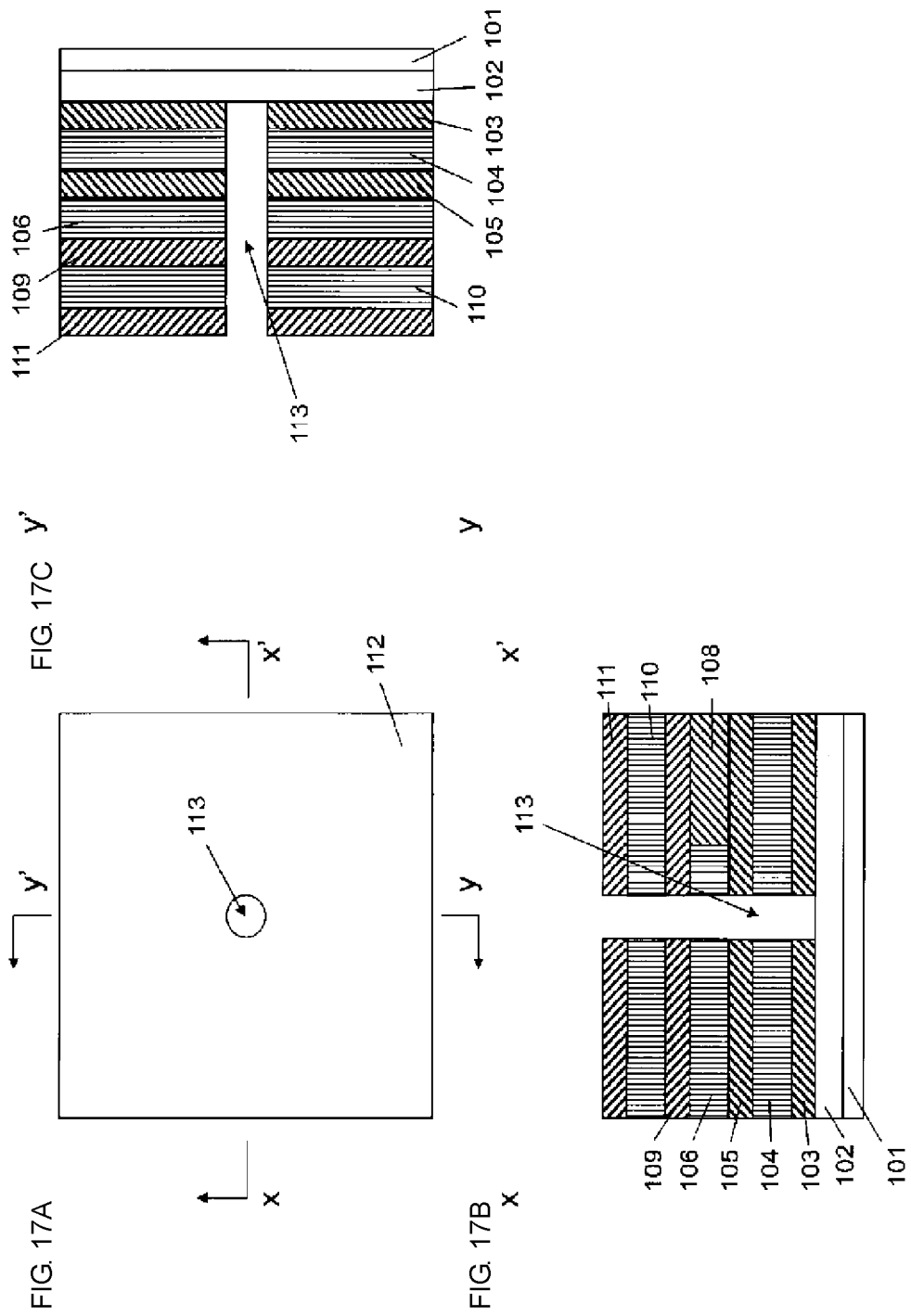

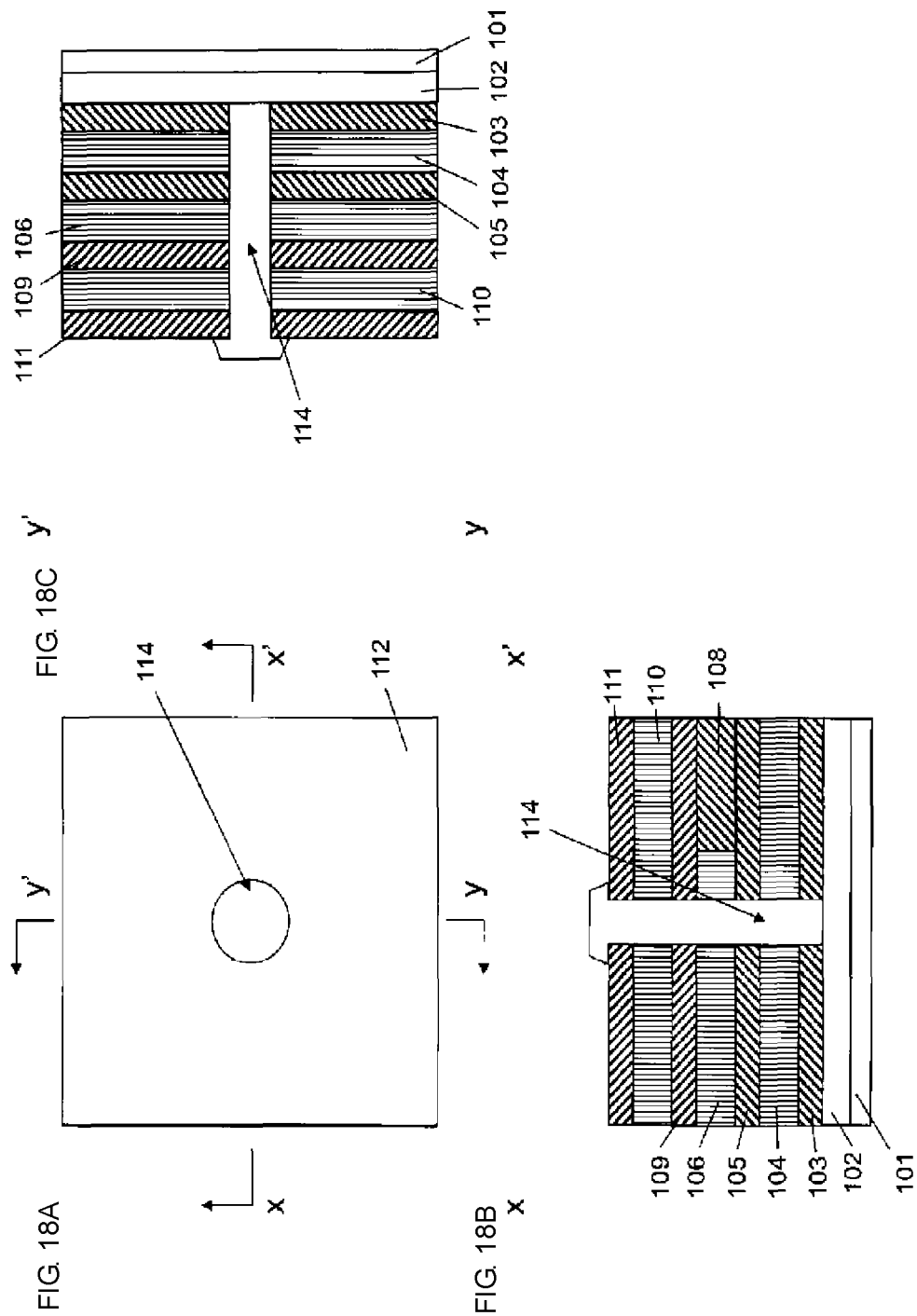

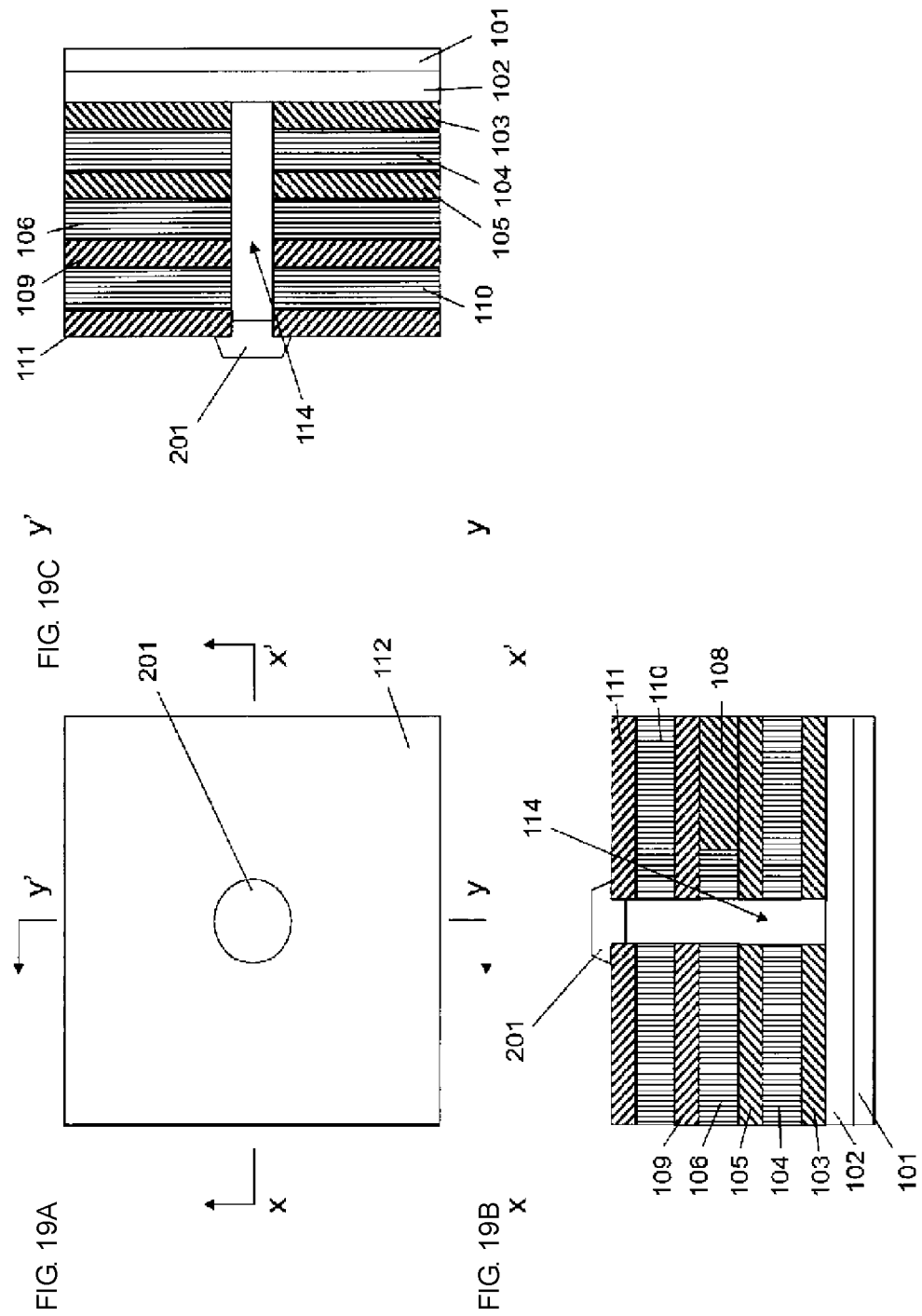

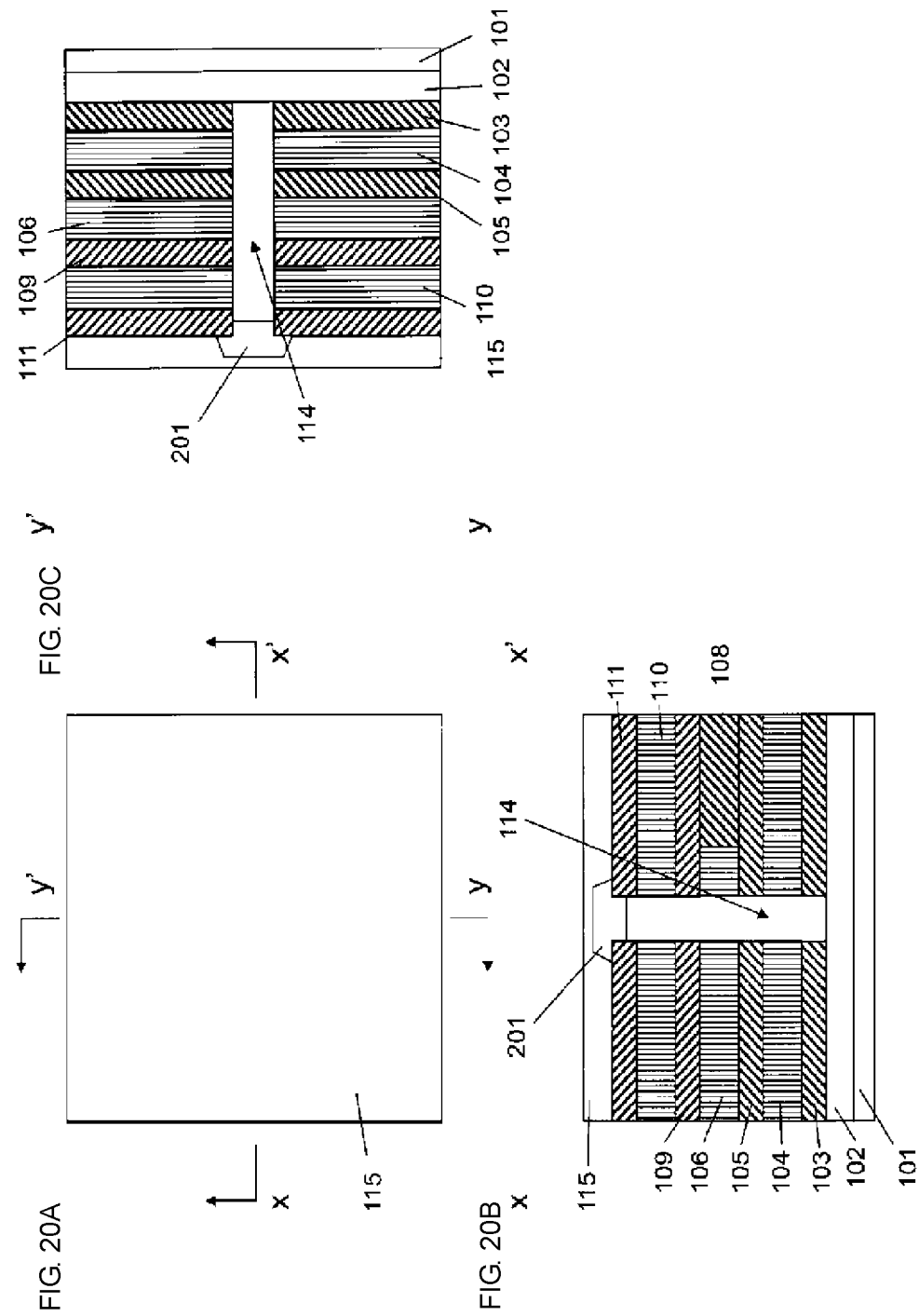

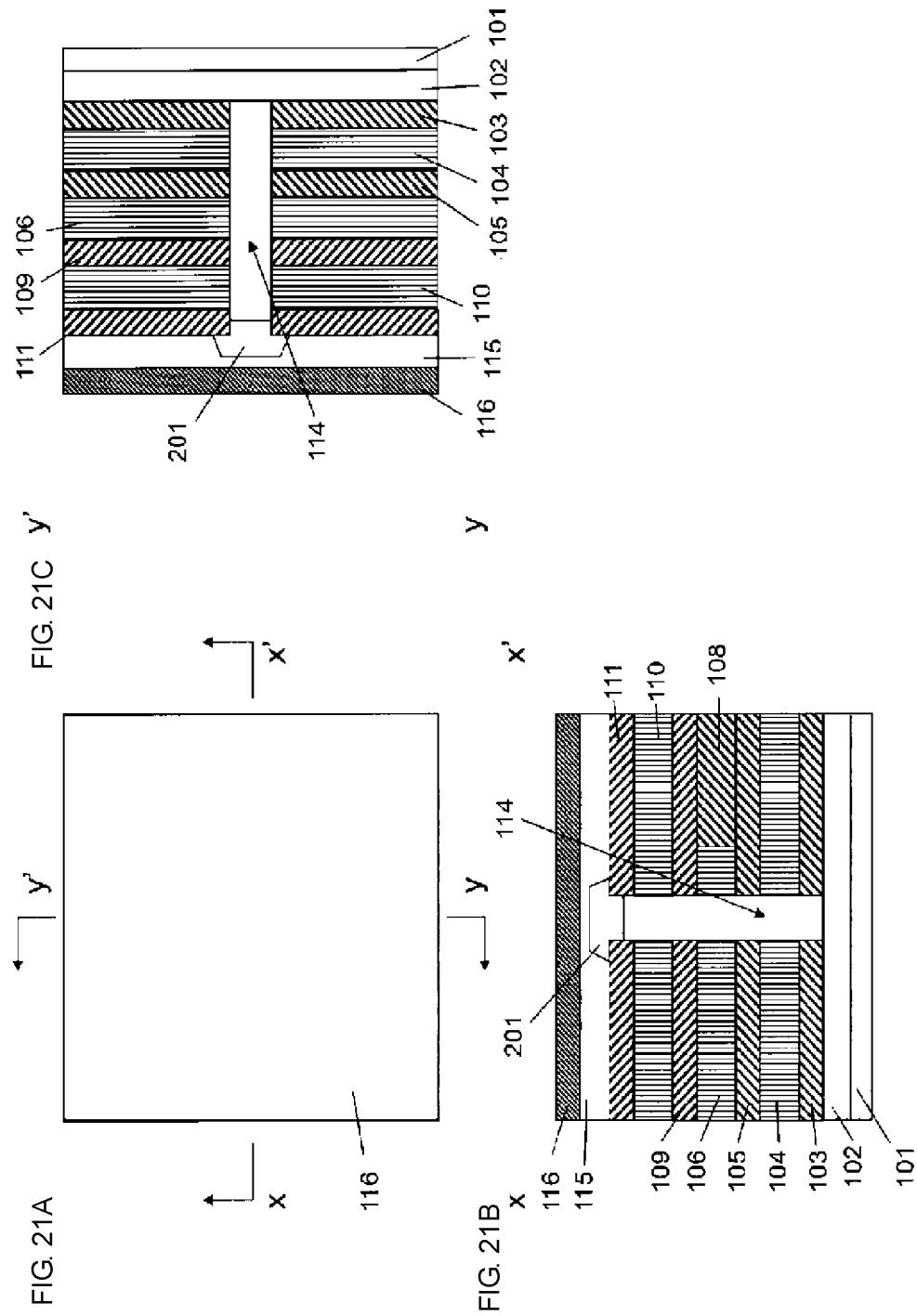

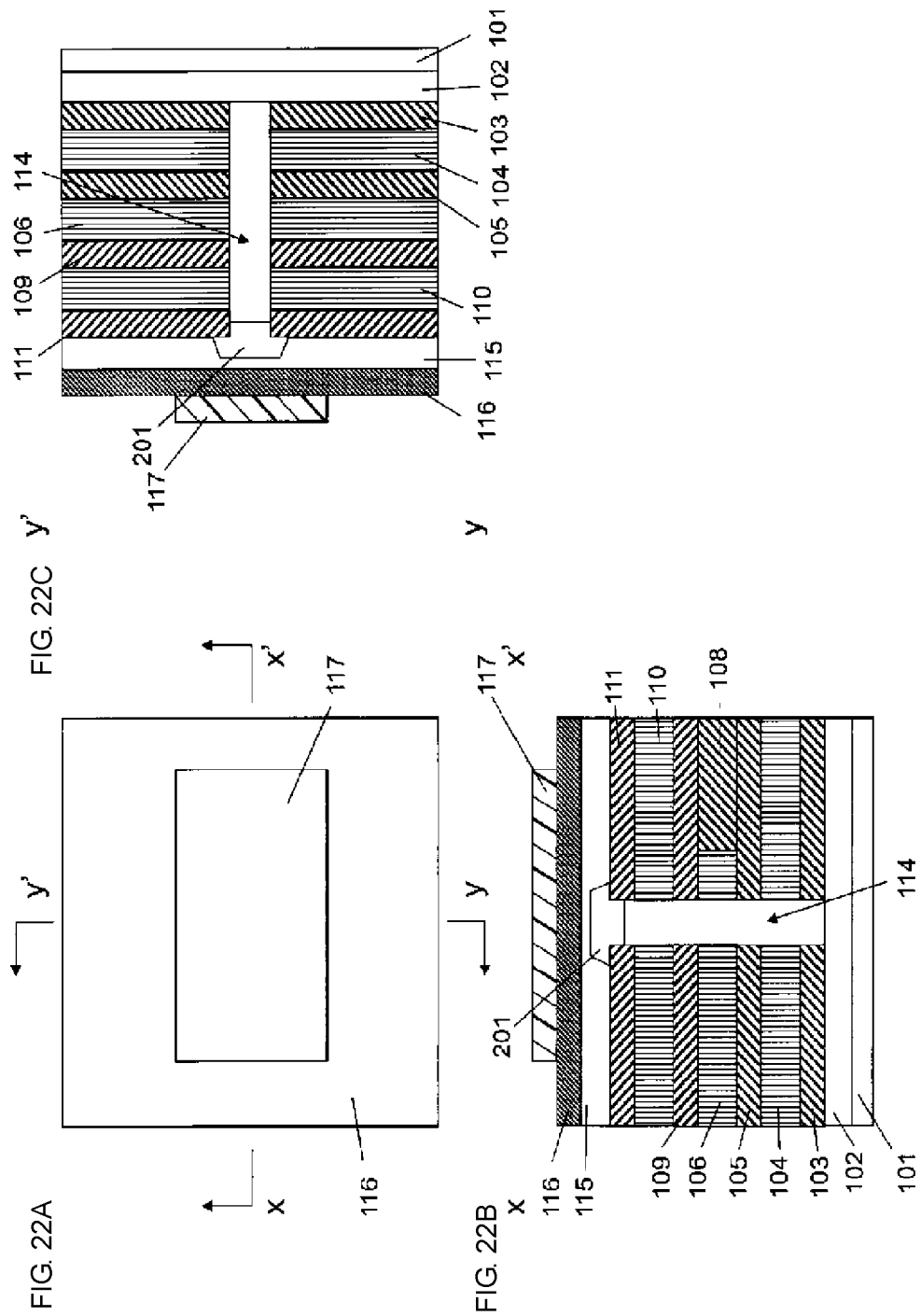

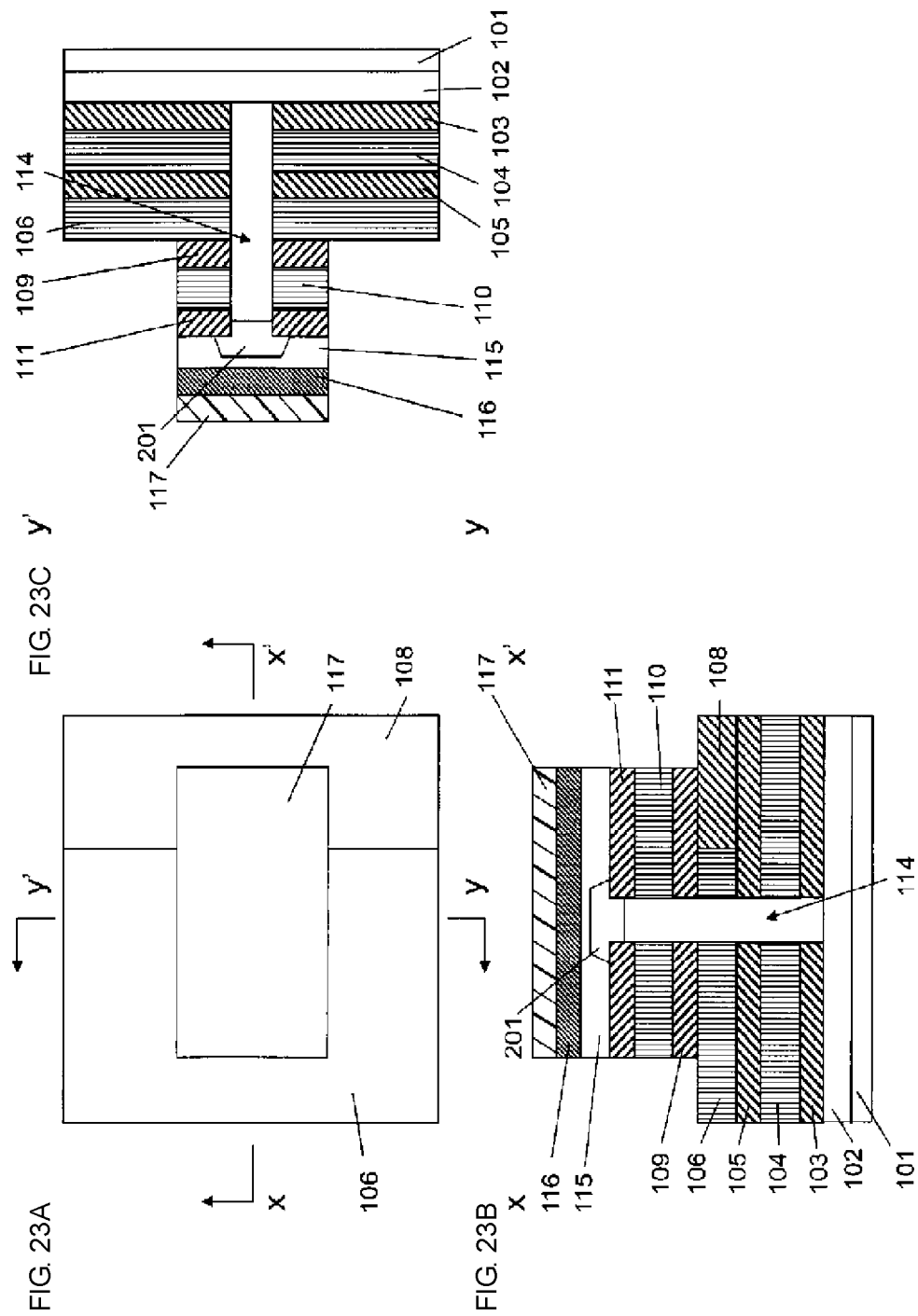

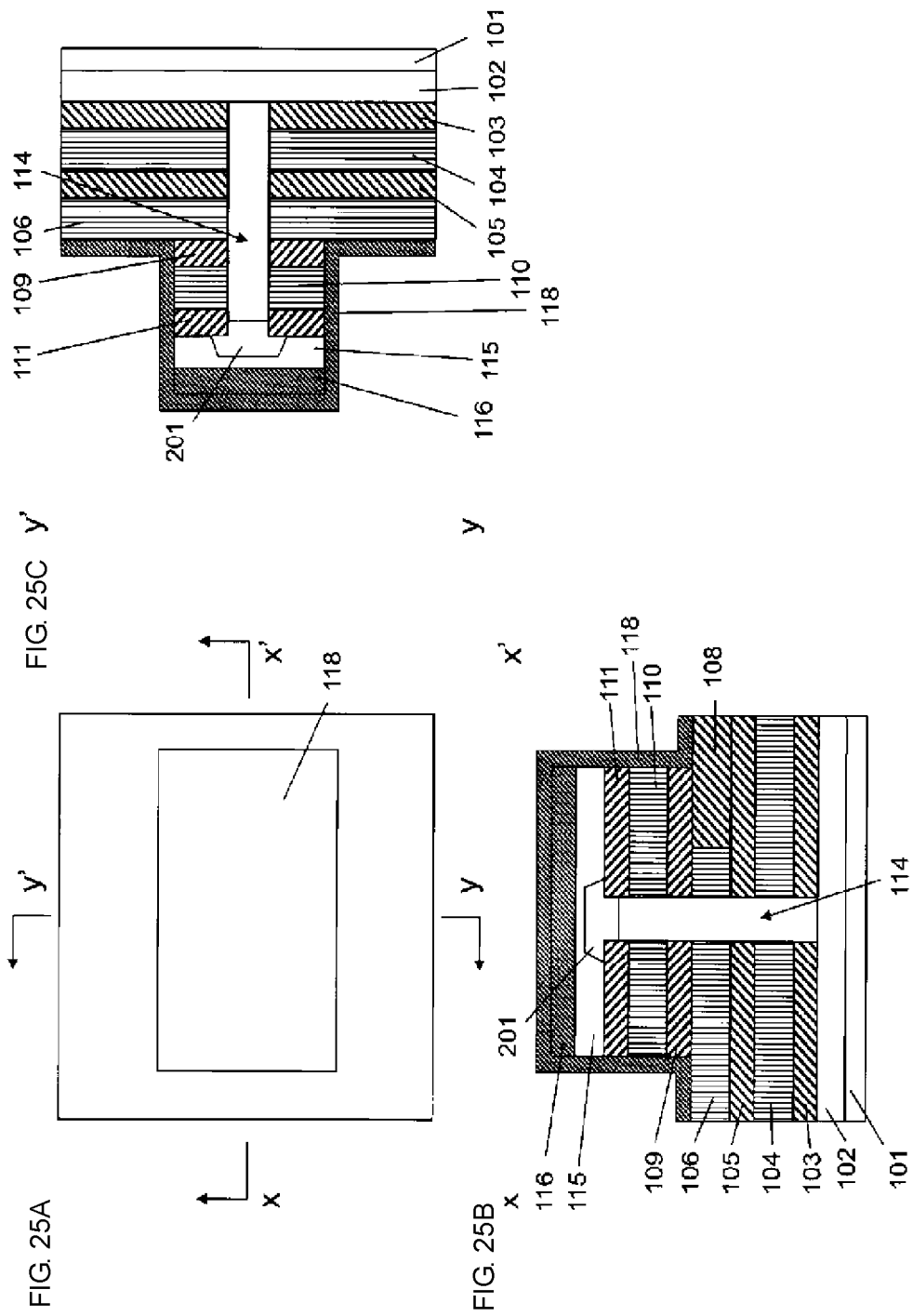

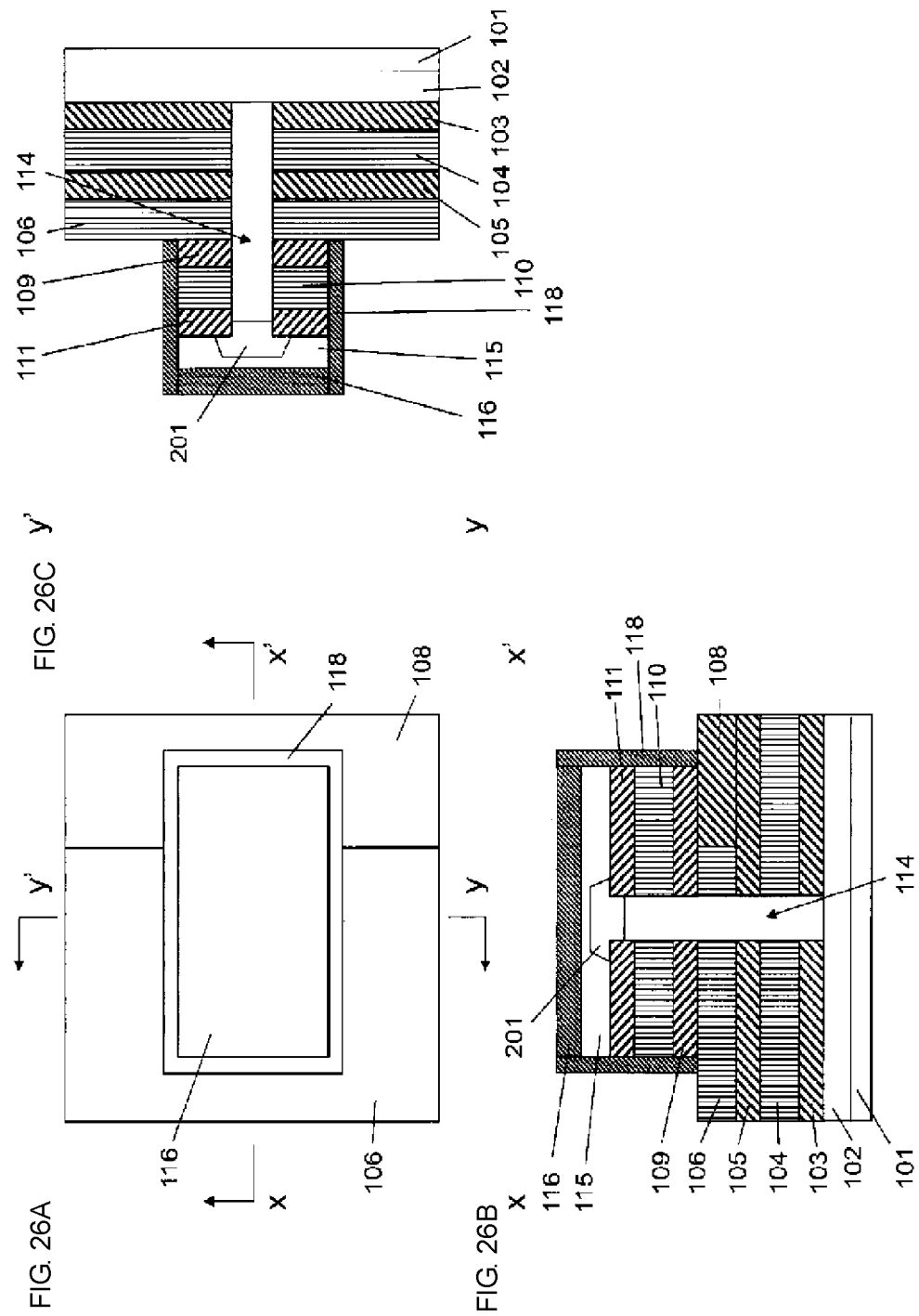

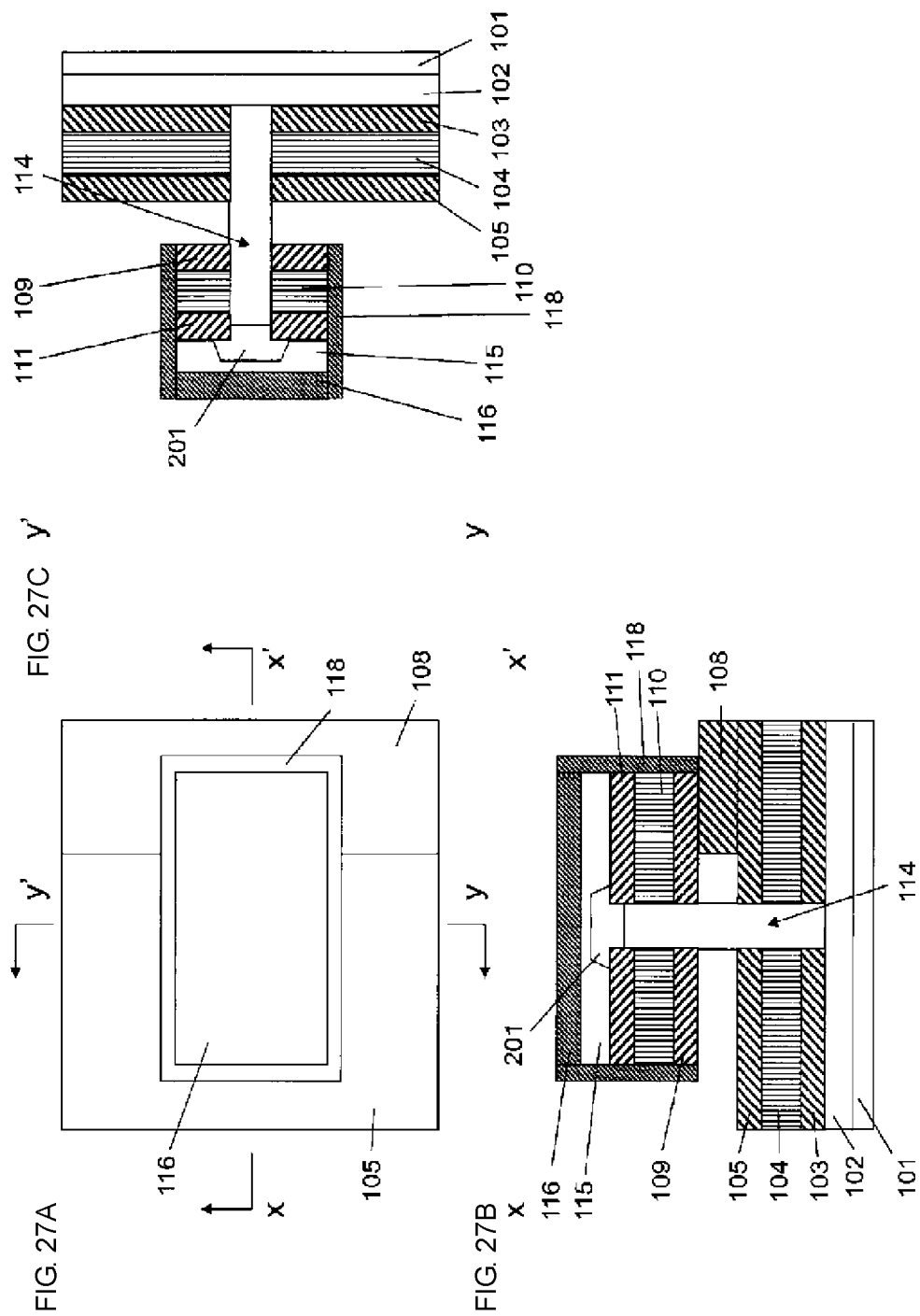

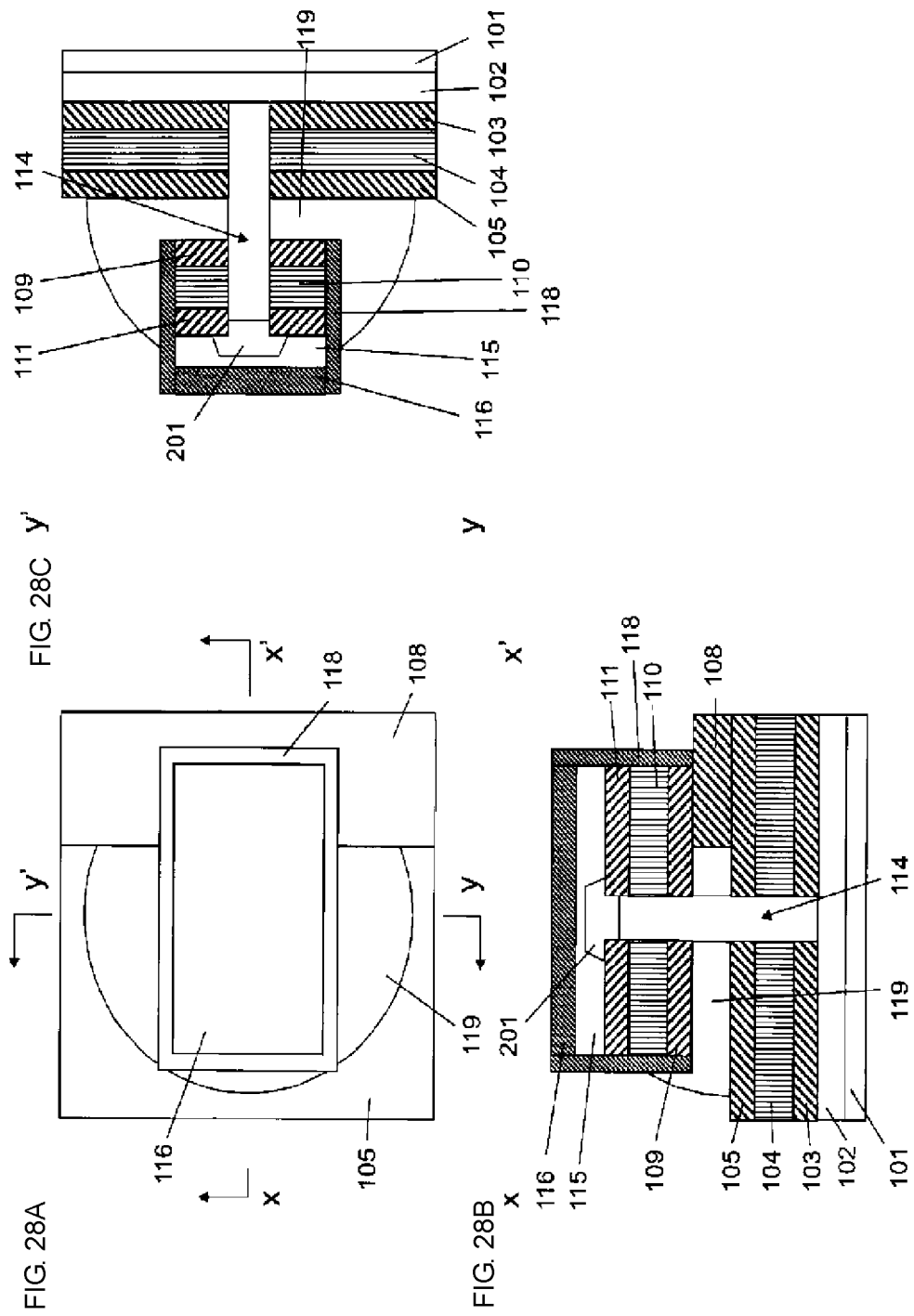

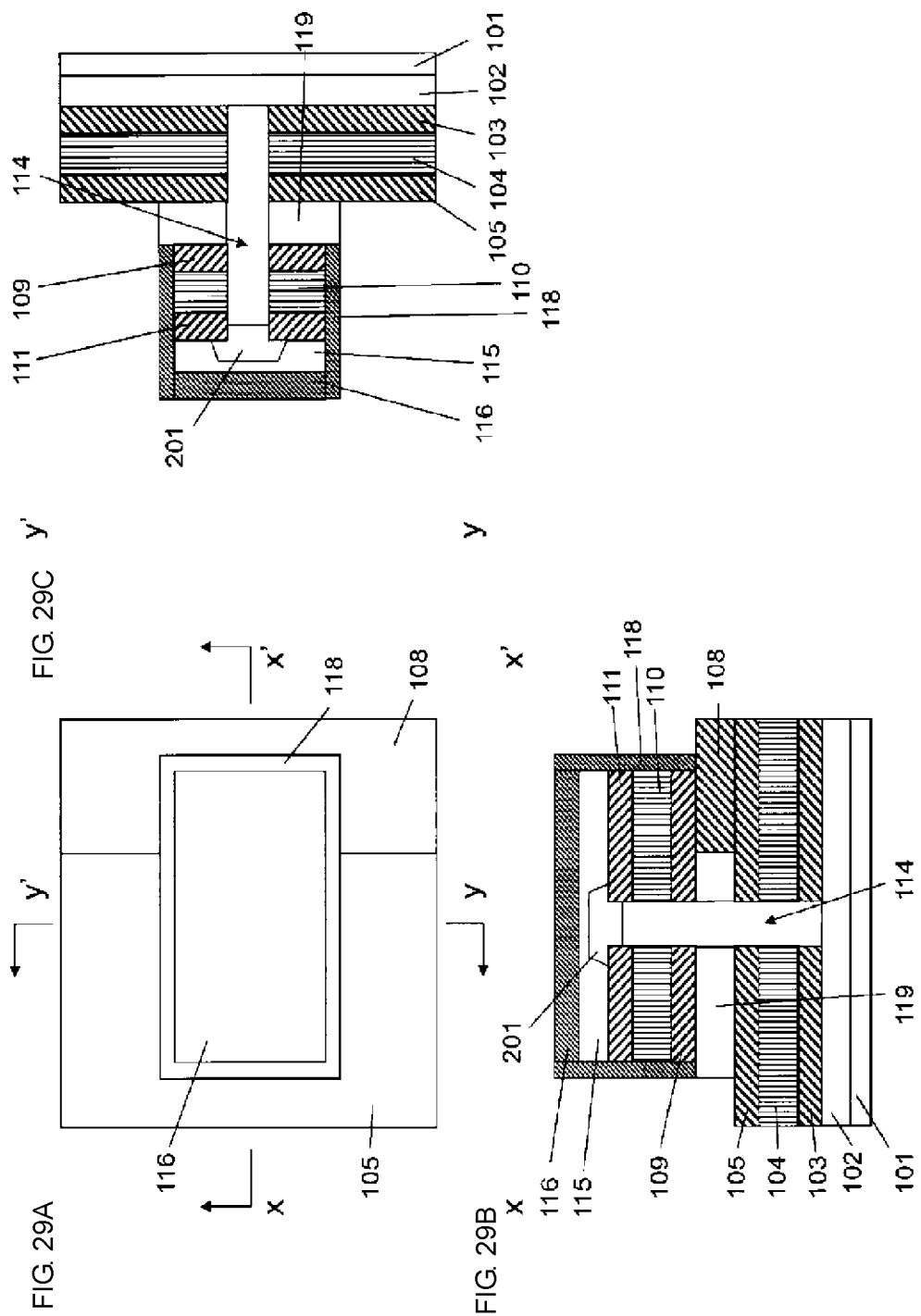

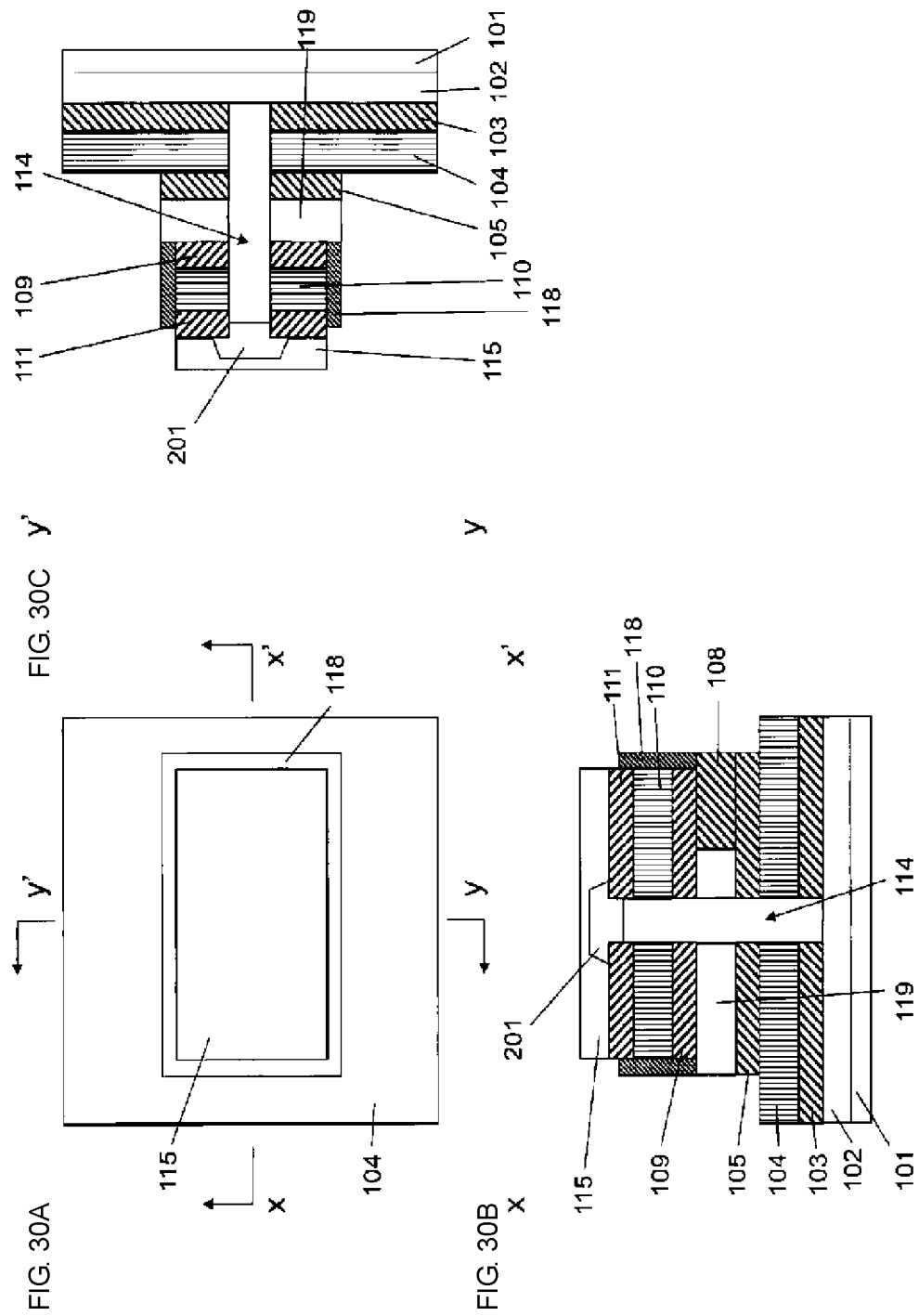

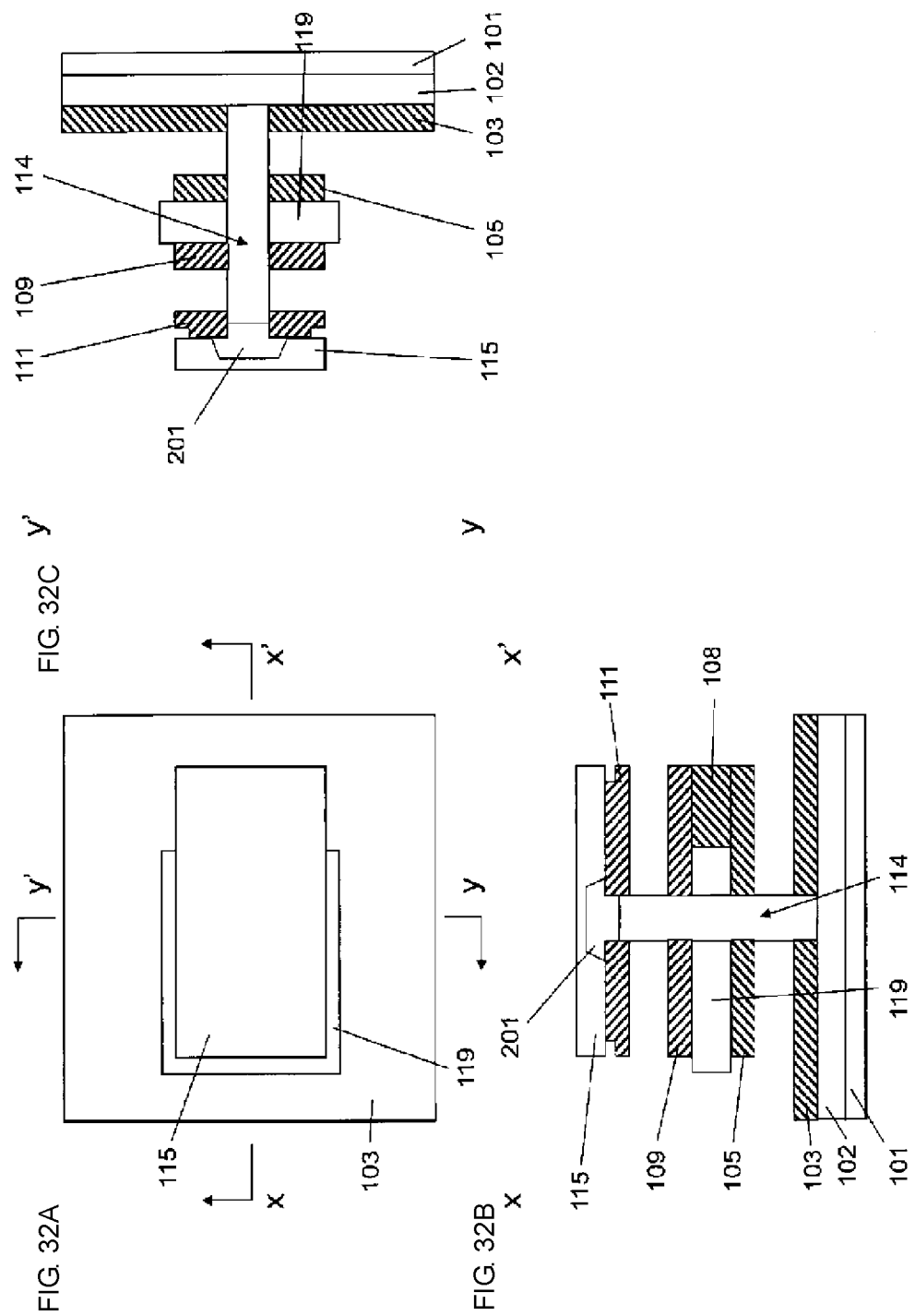

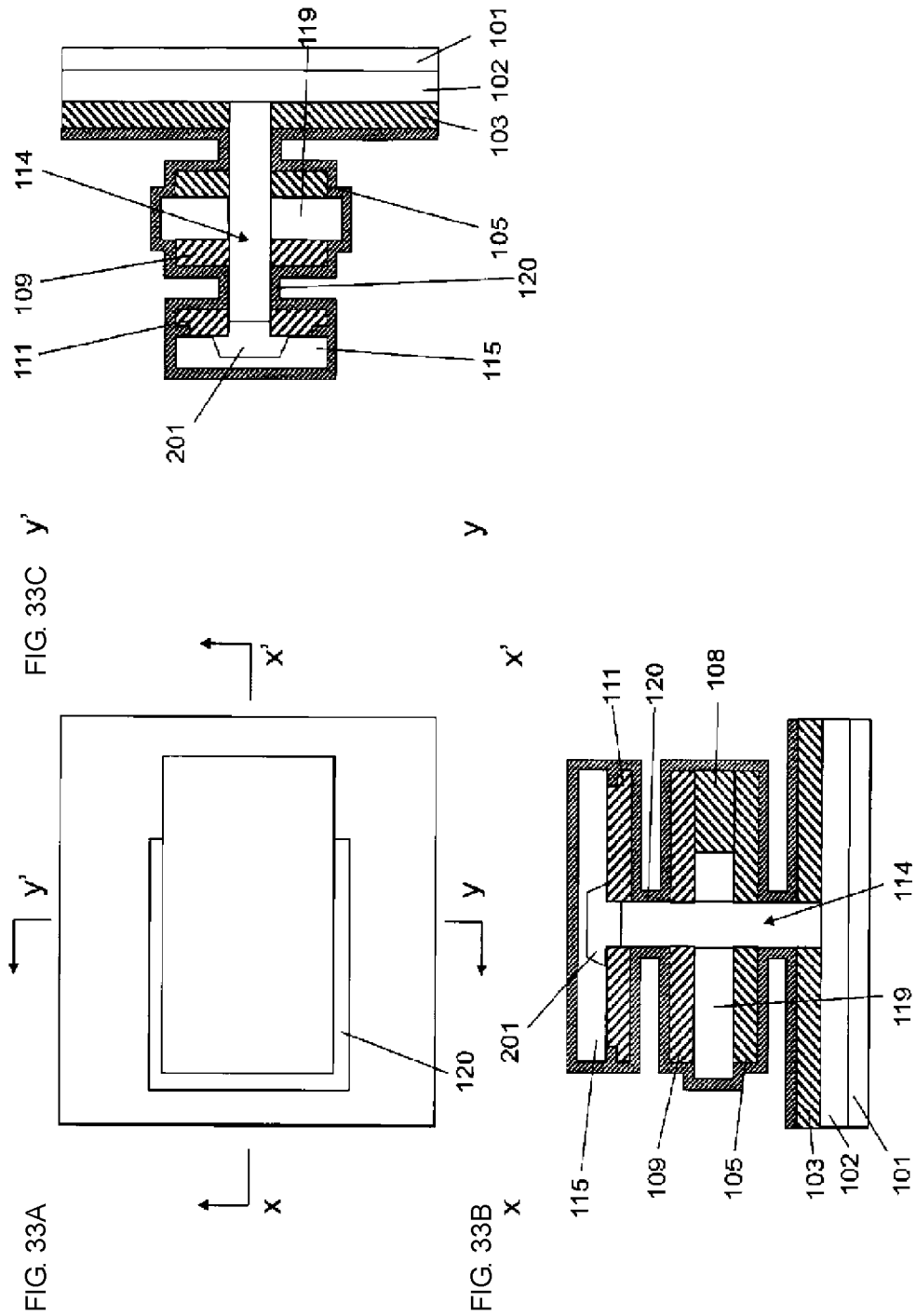

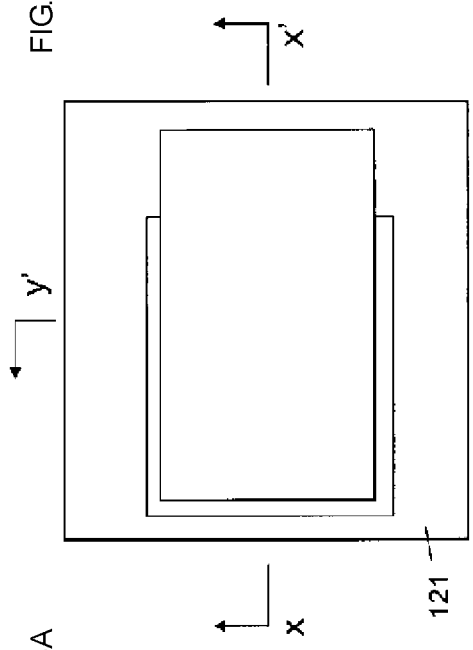
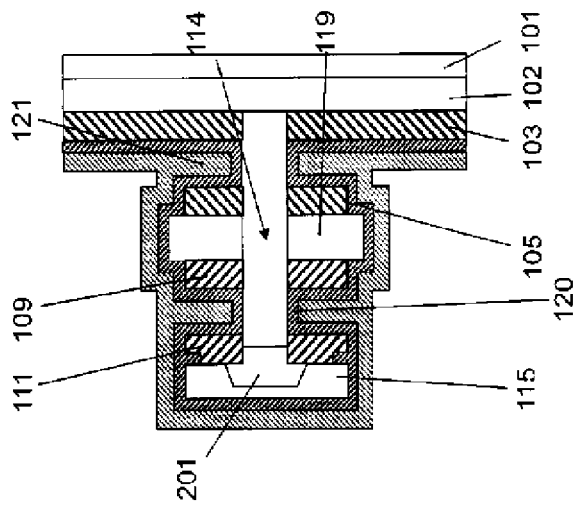
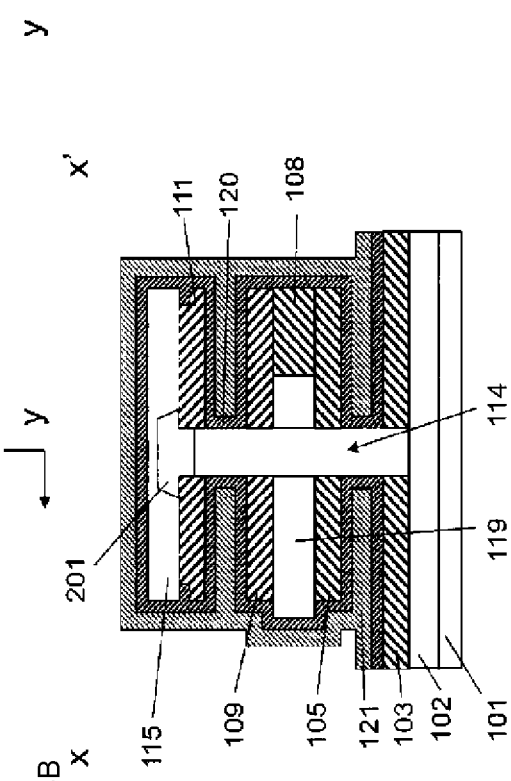

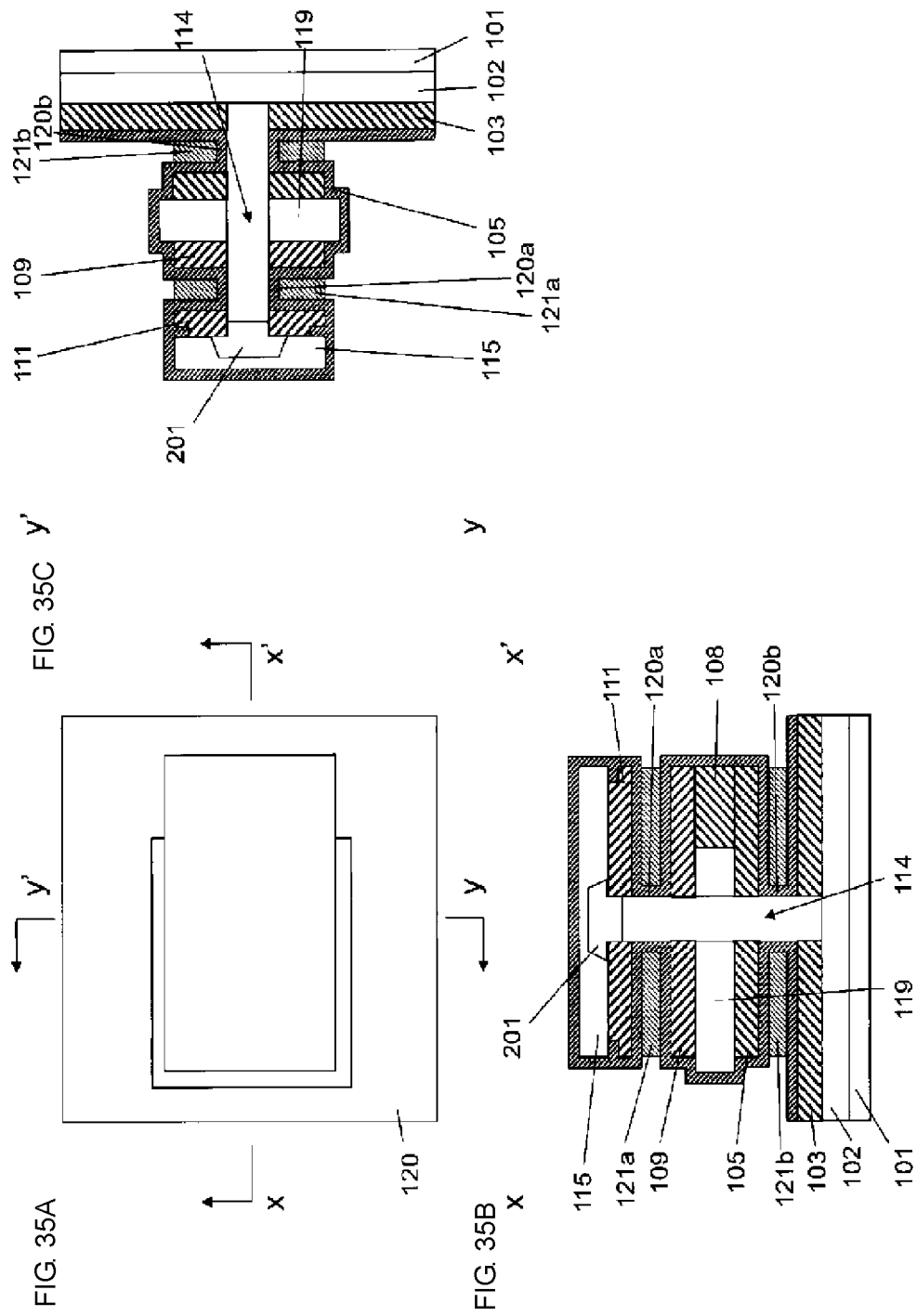

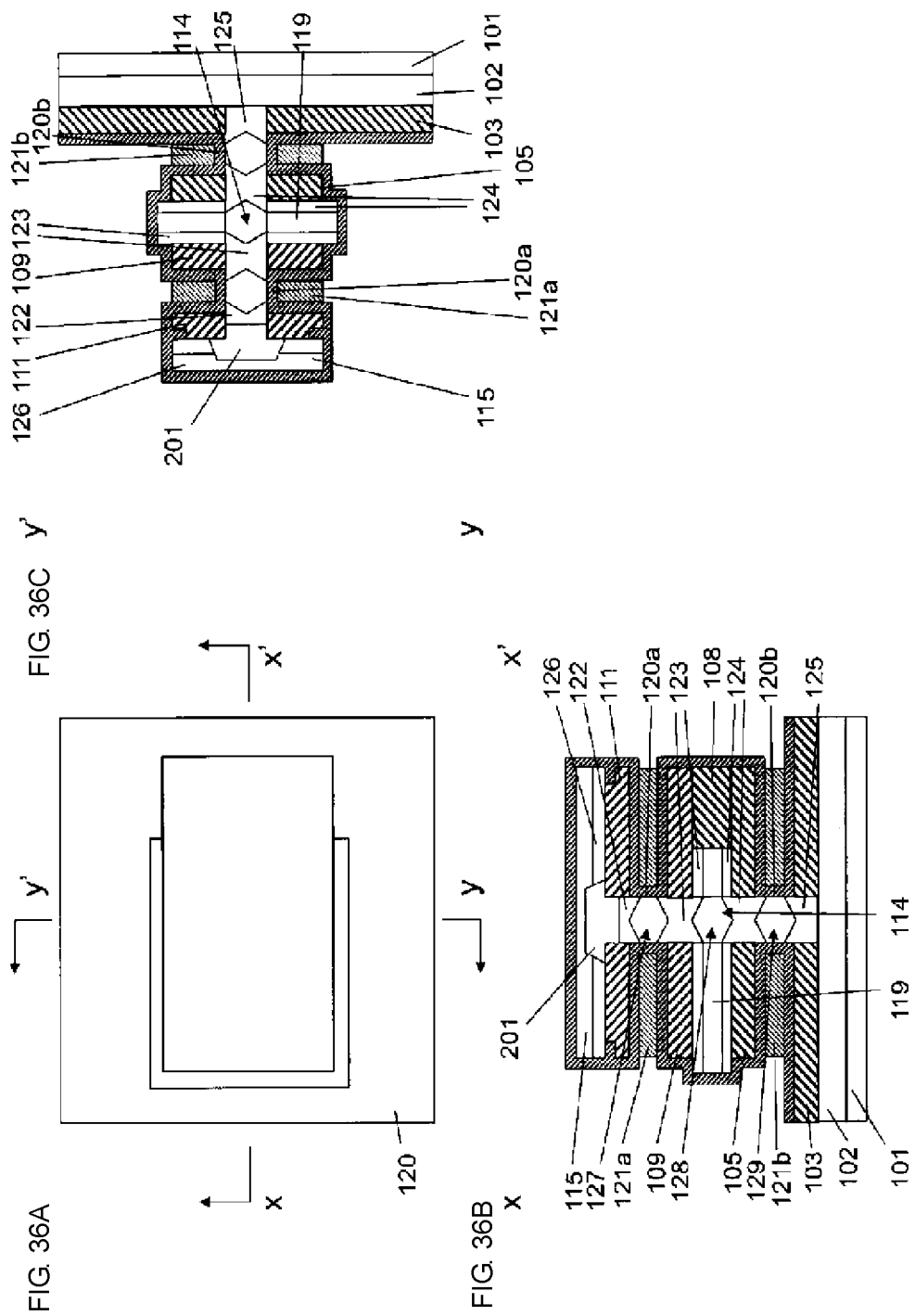

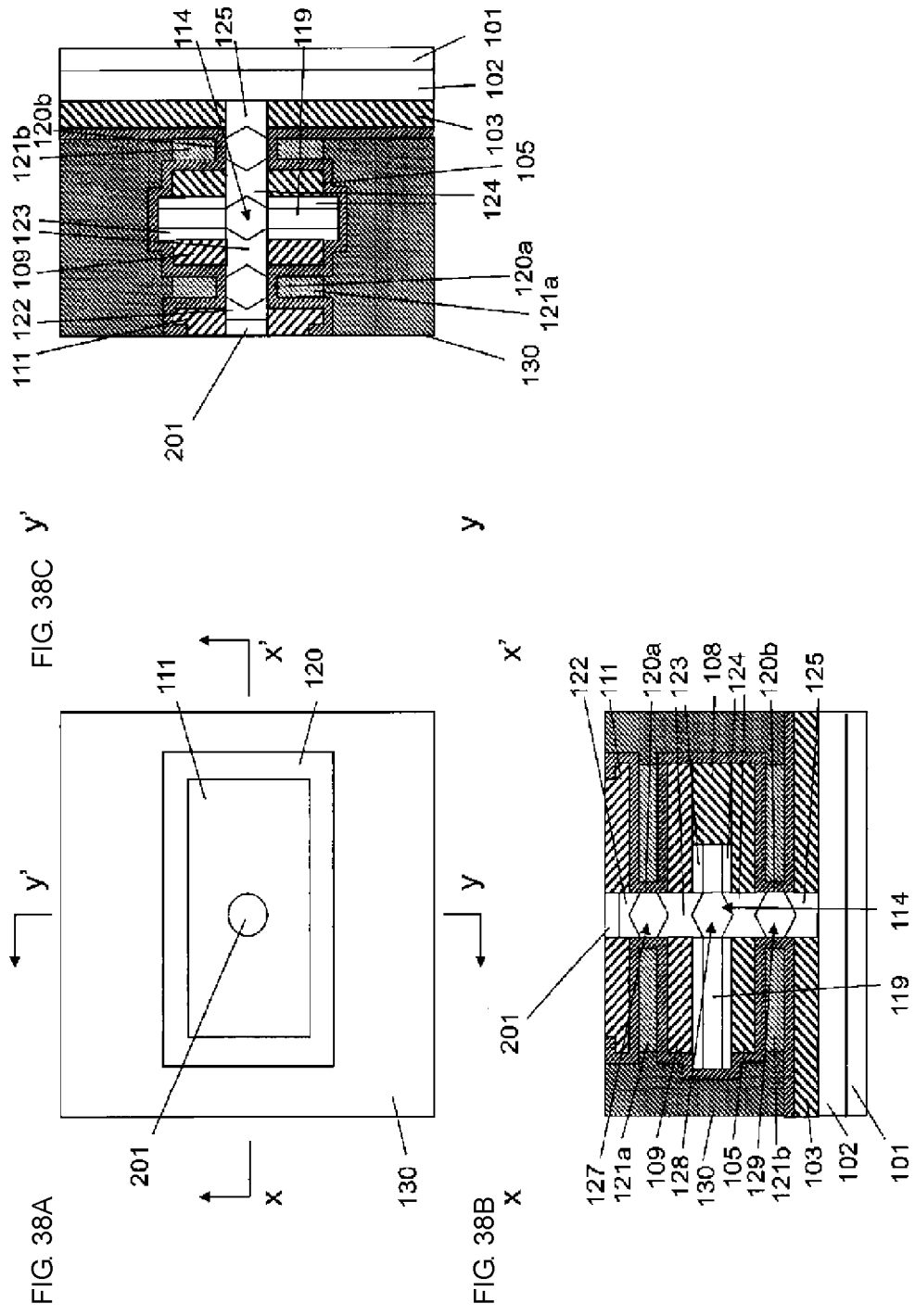

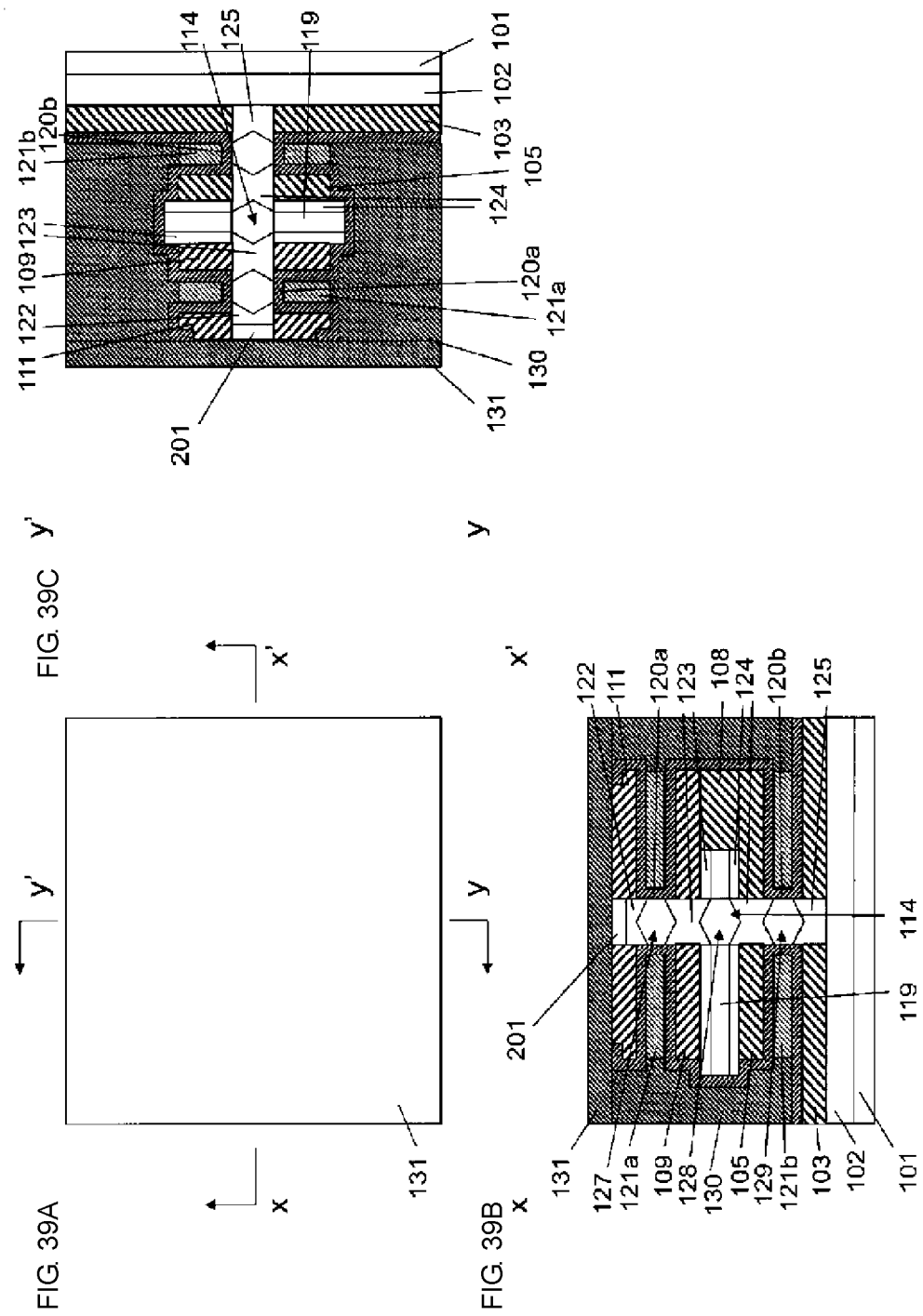

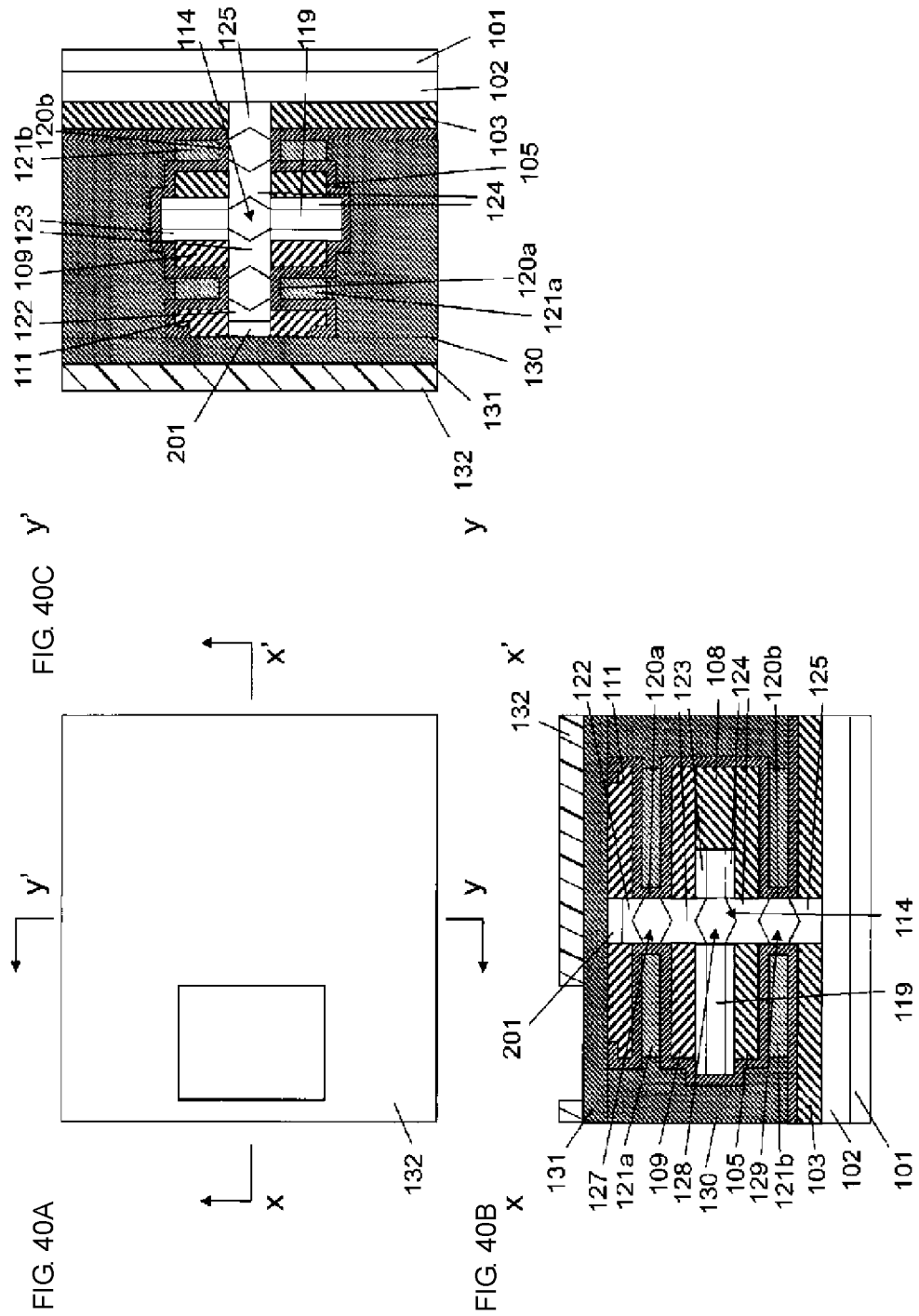

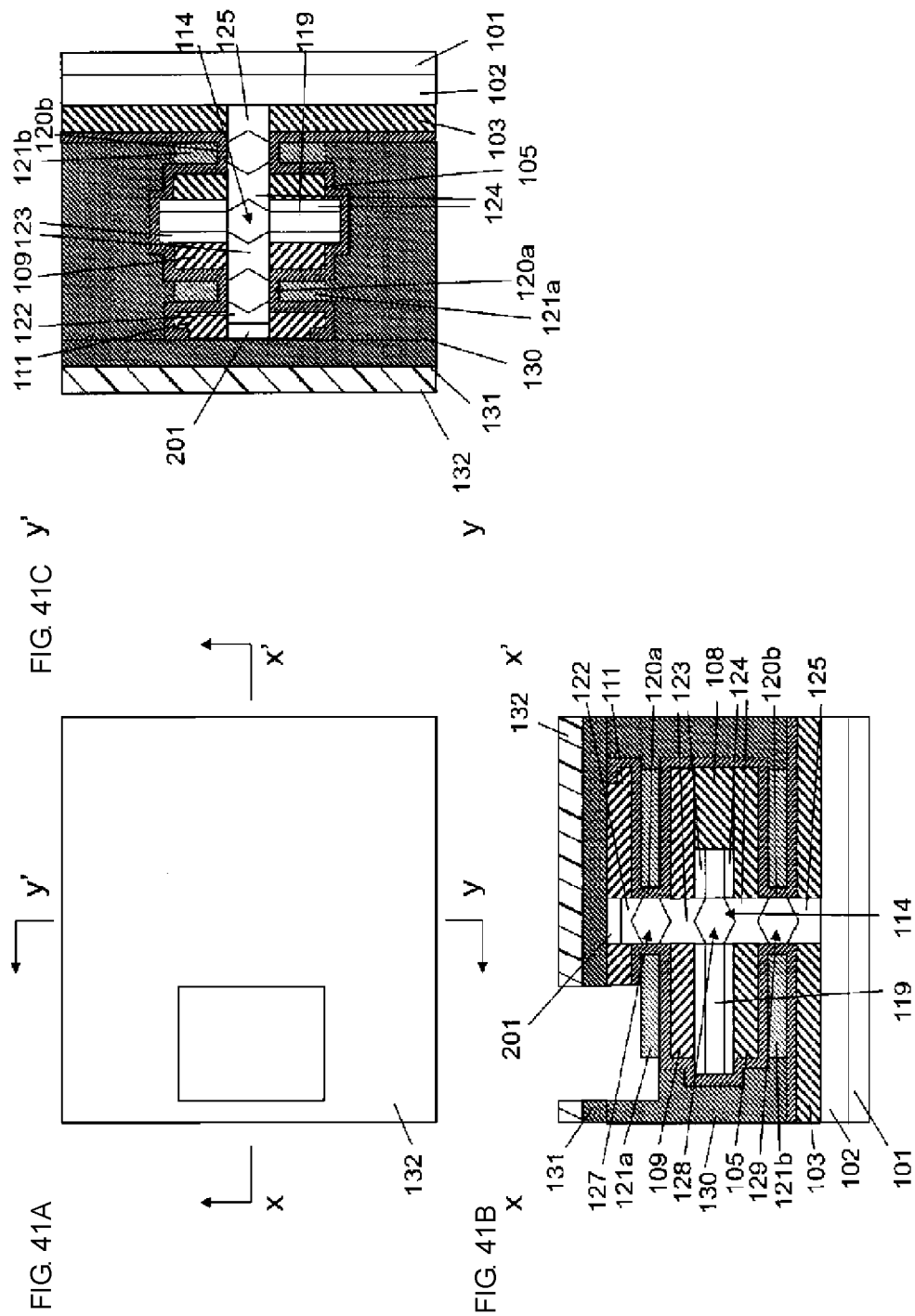

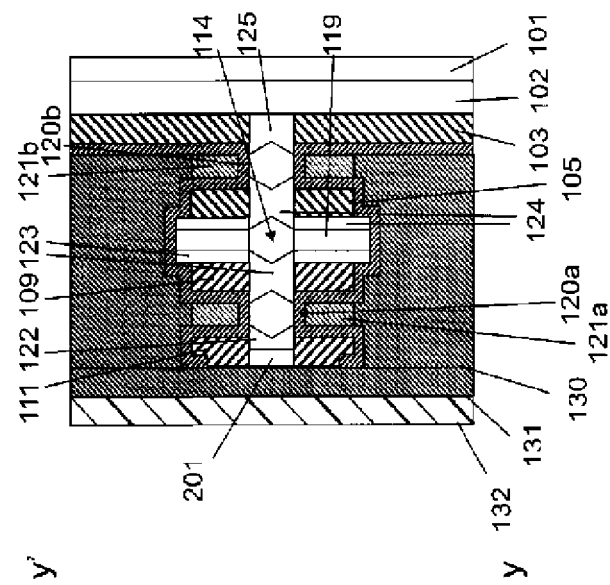
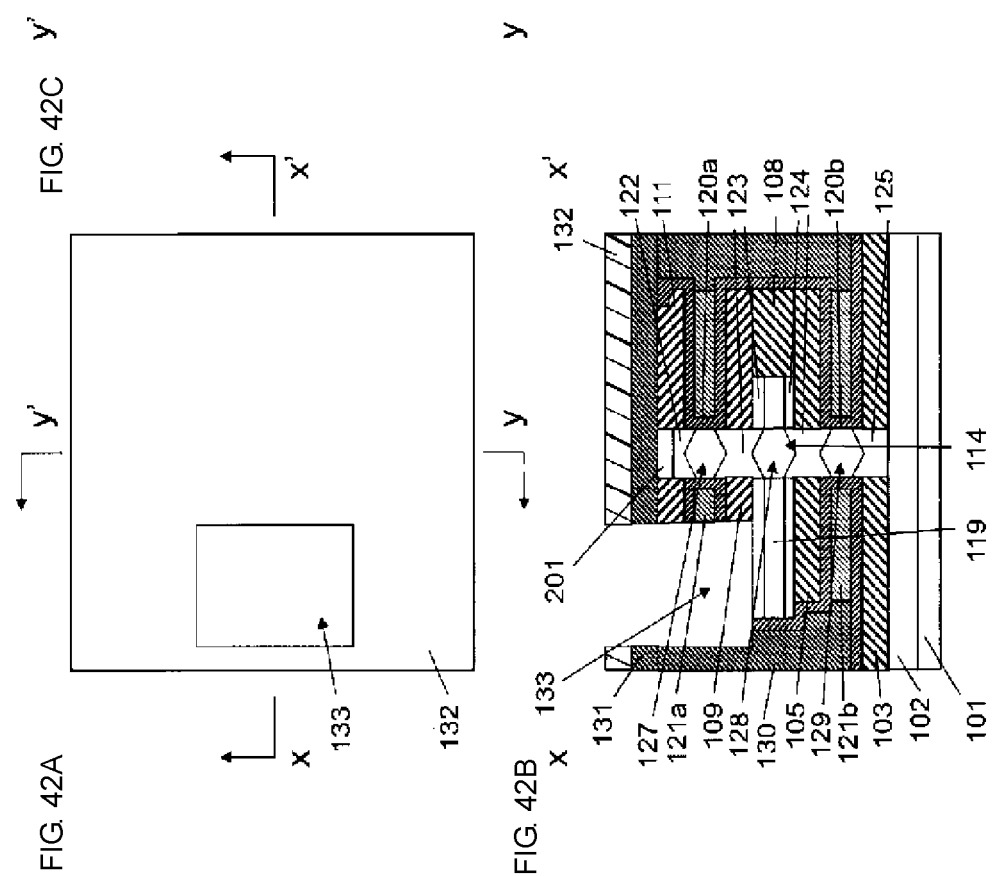
FIG. 42A FIG. 42B FIG. 42C

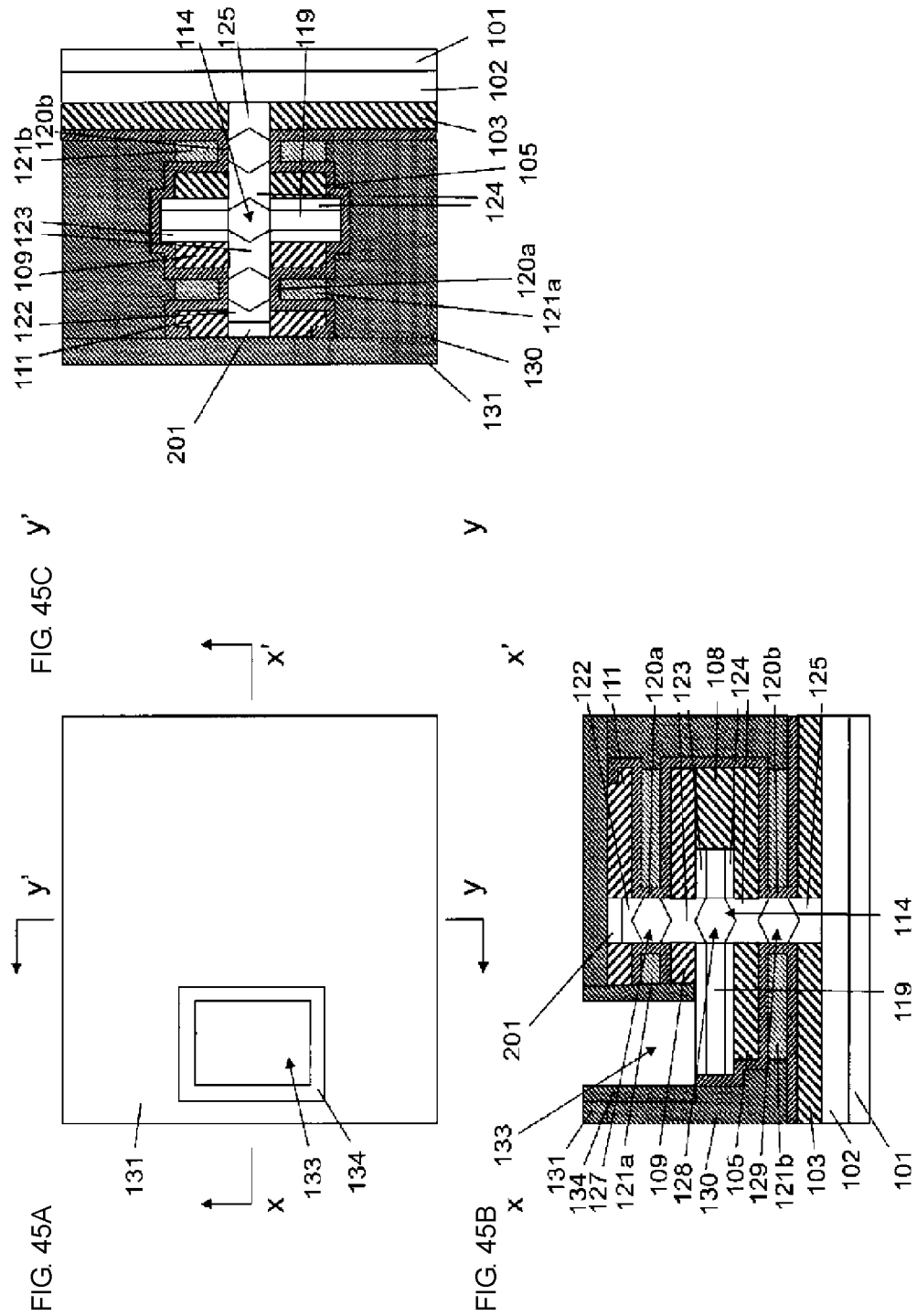

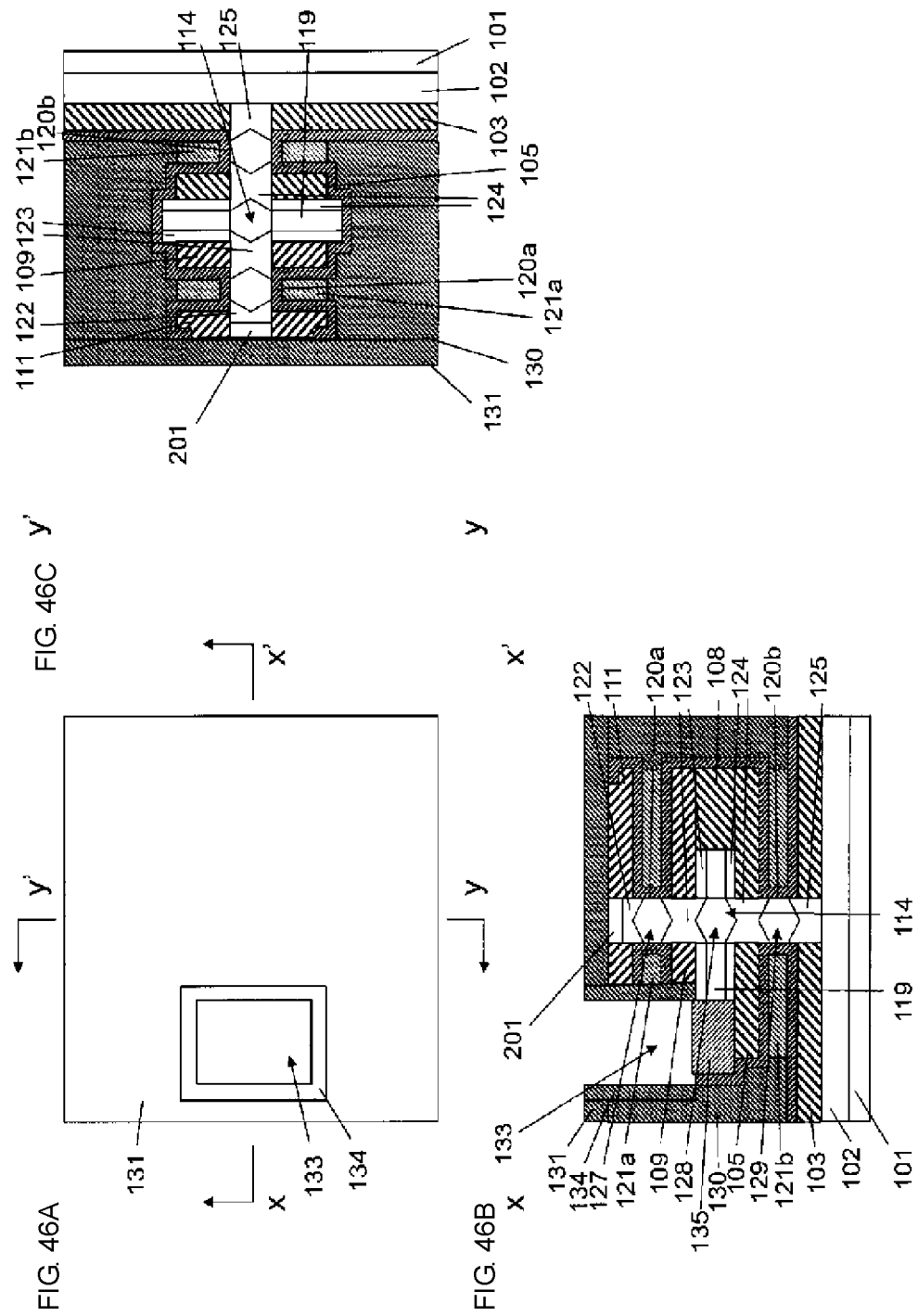

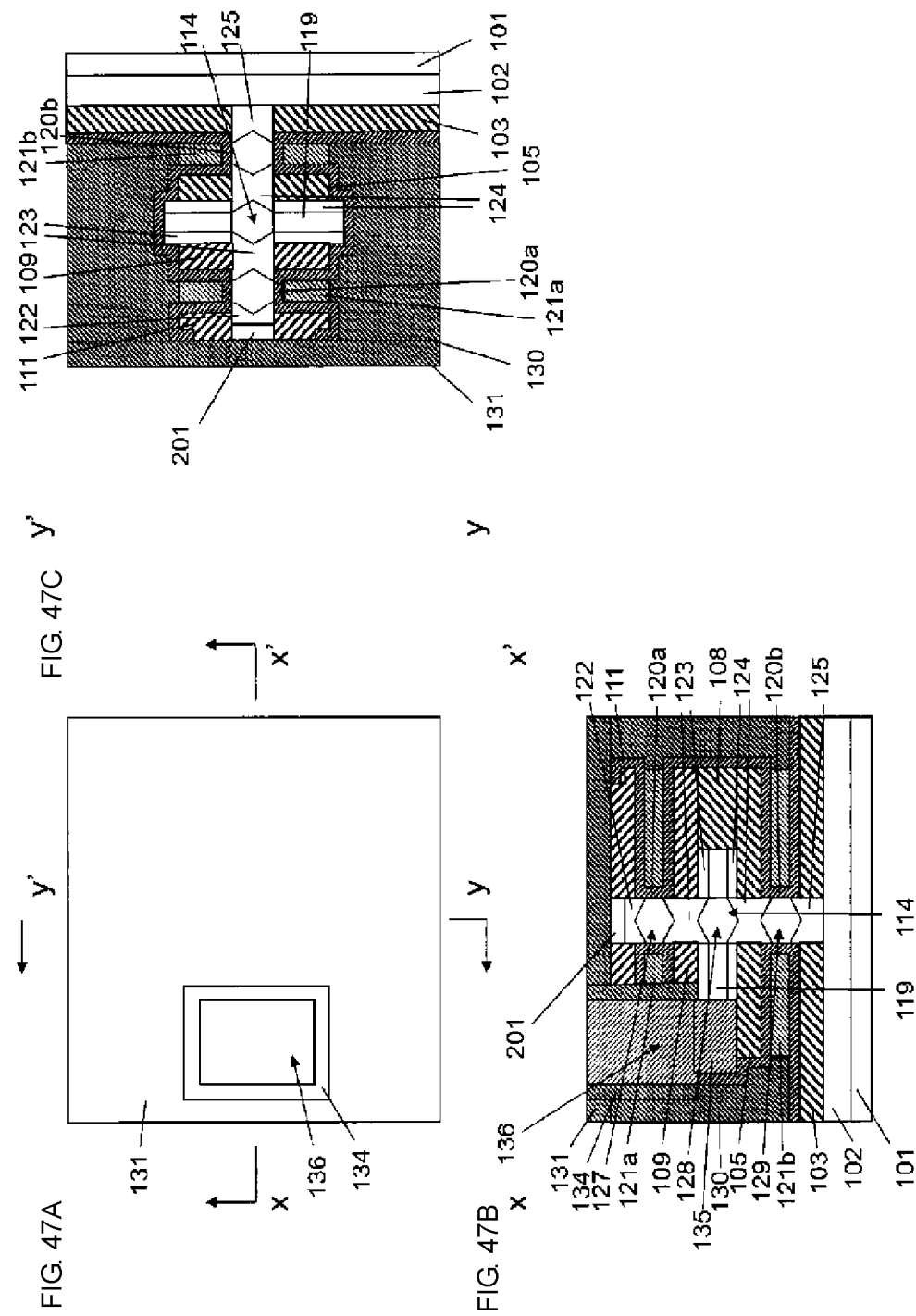

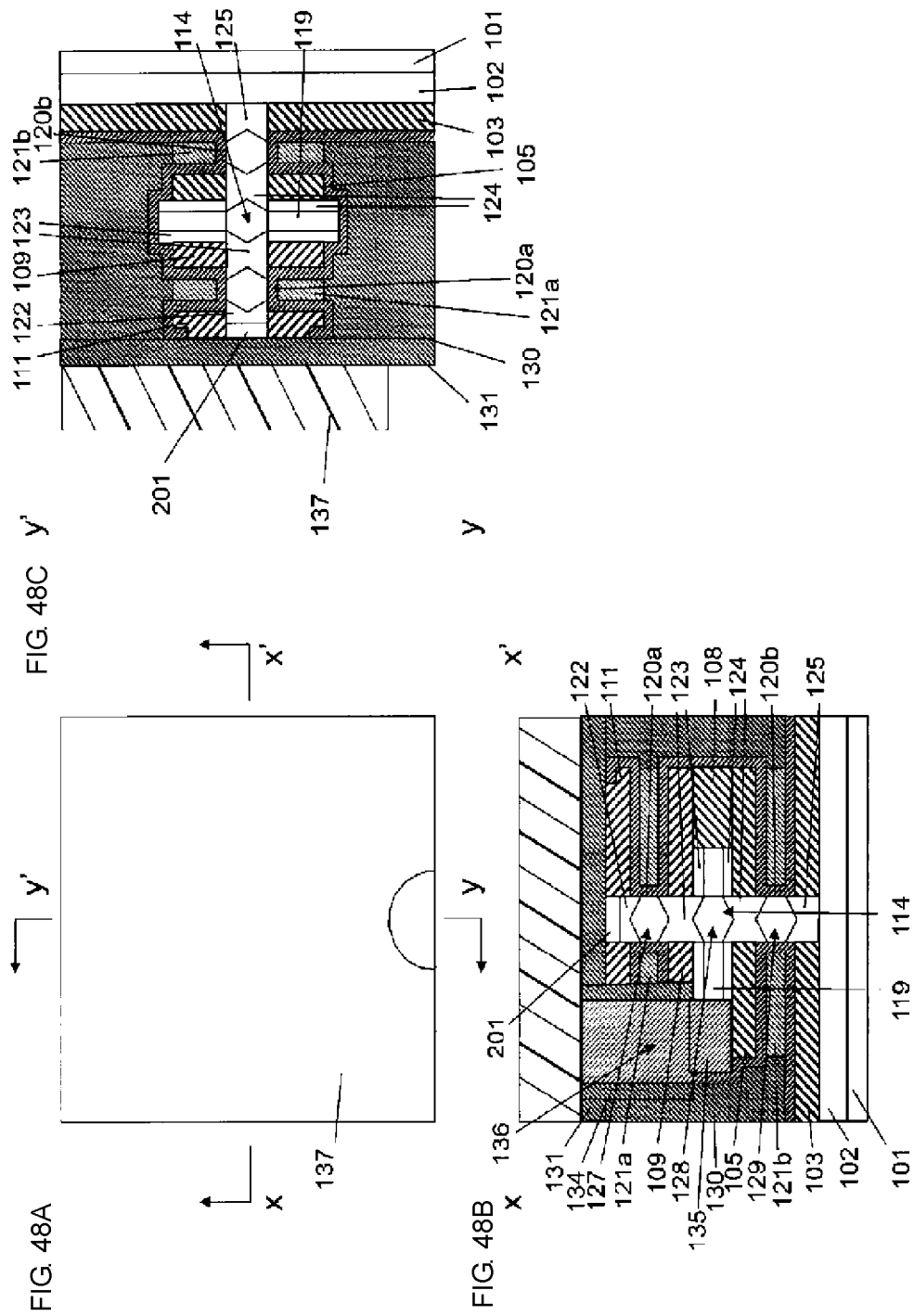

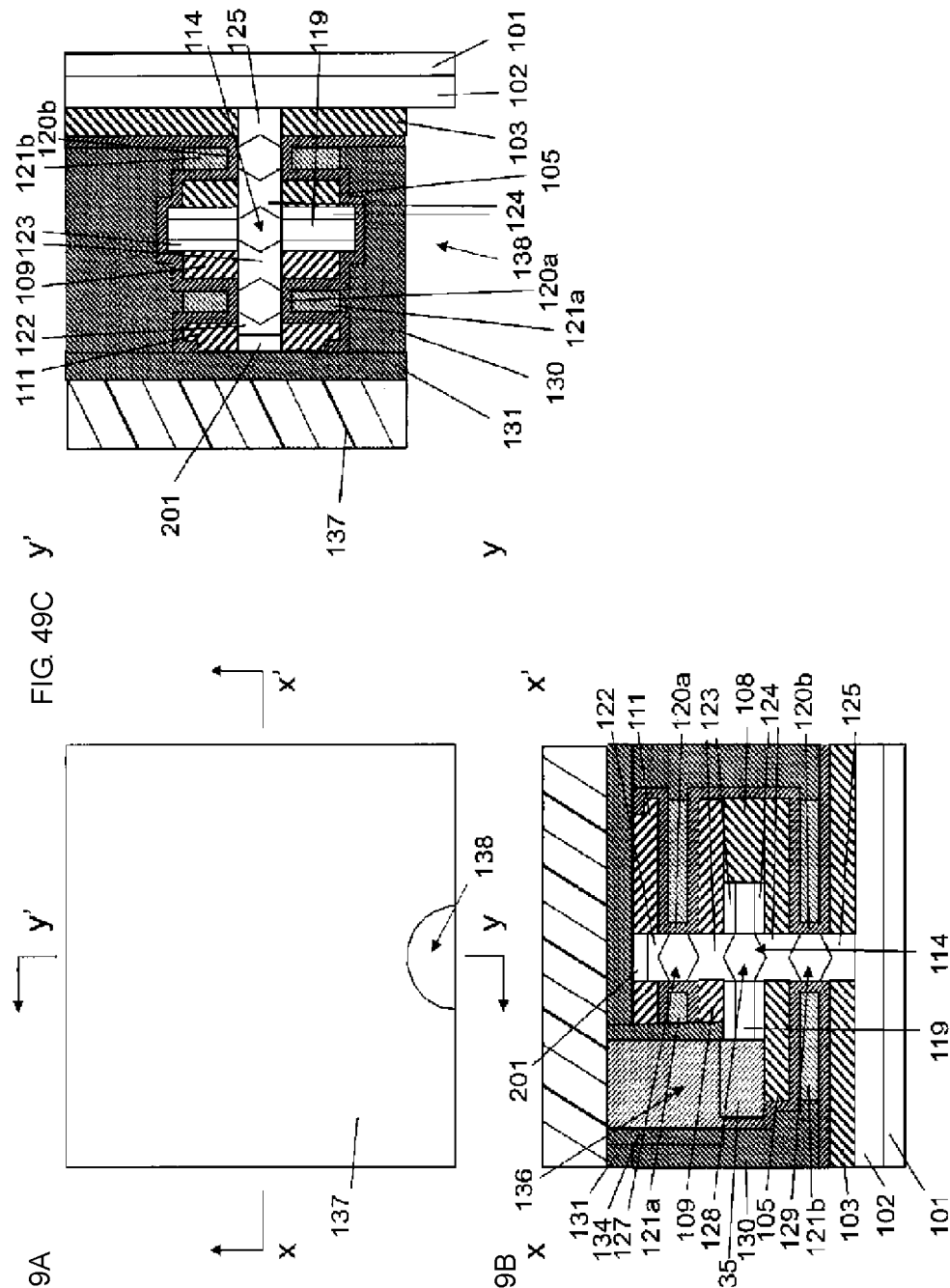

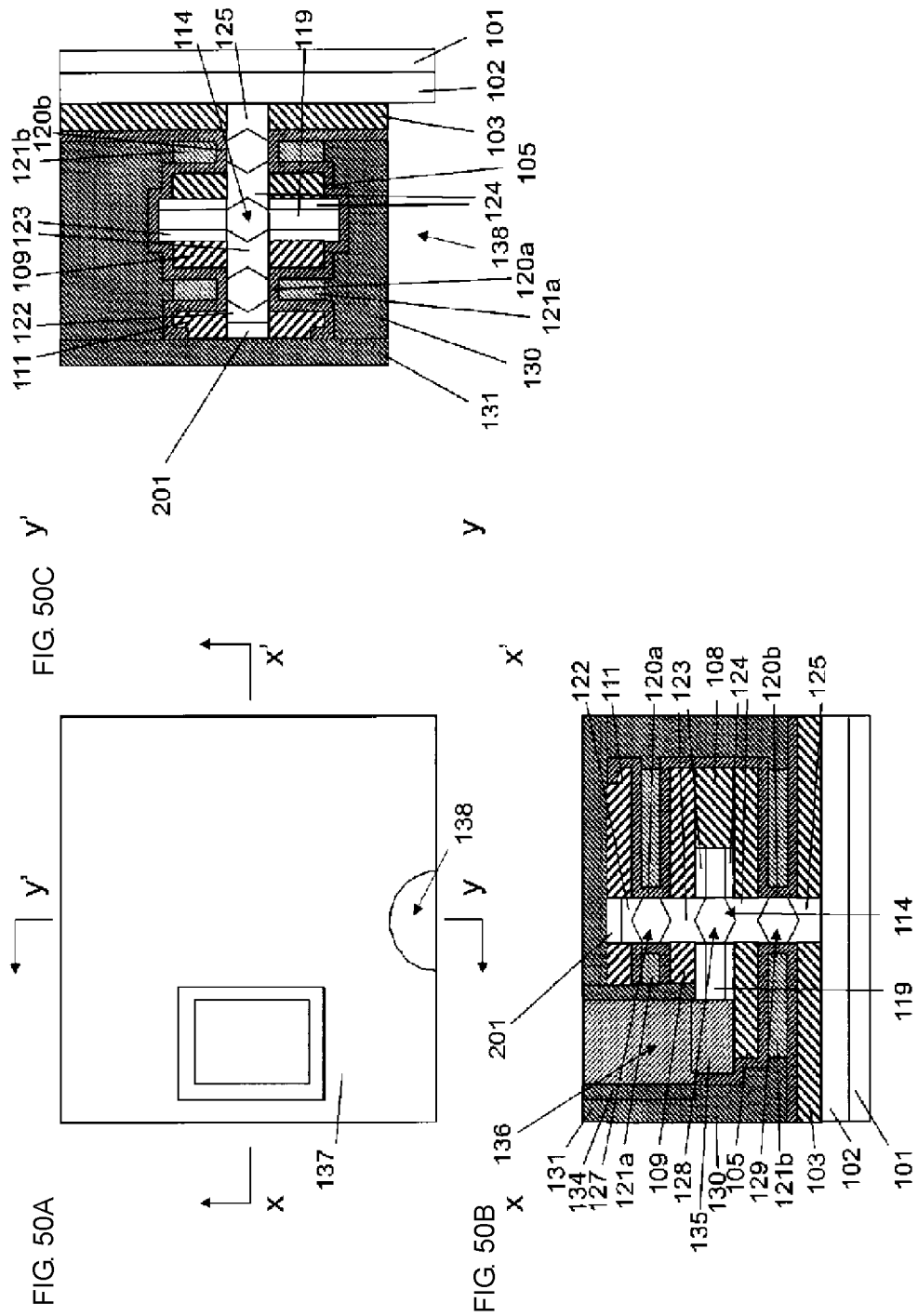

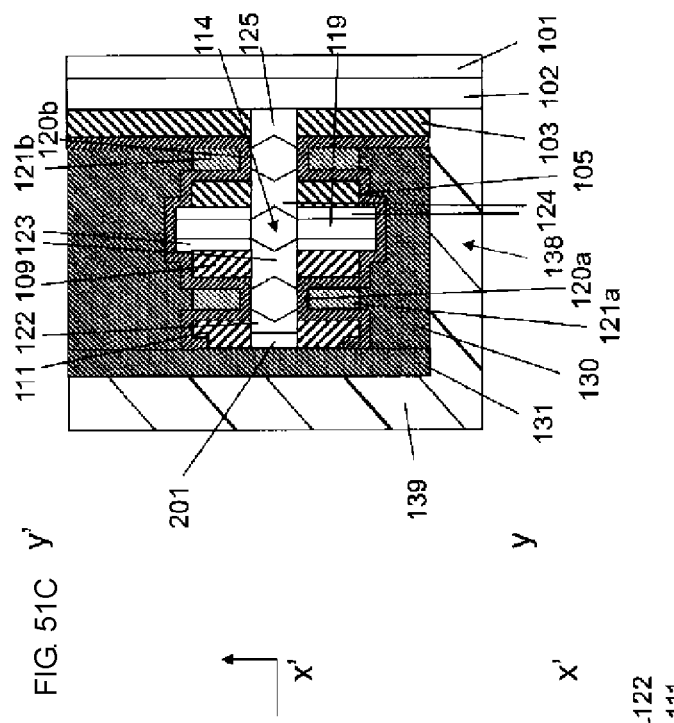
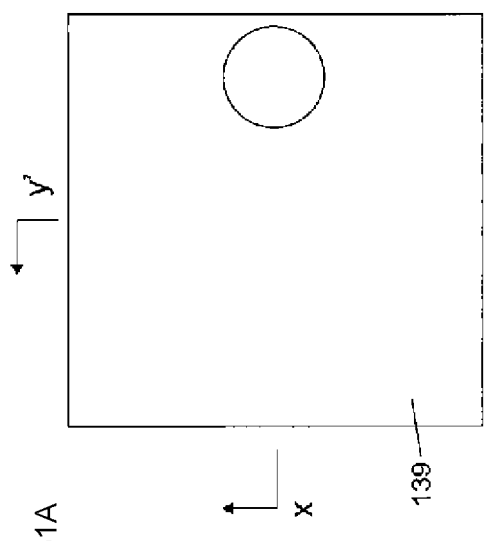
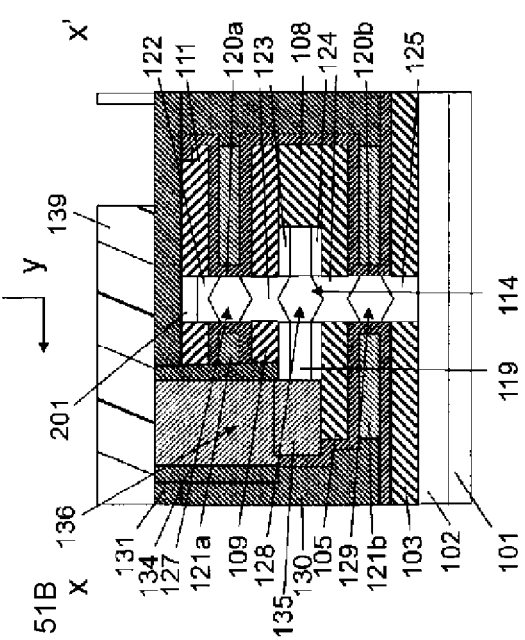
FIG. 51A
FIG. 51B
FIG. 51C

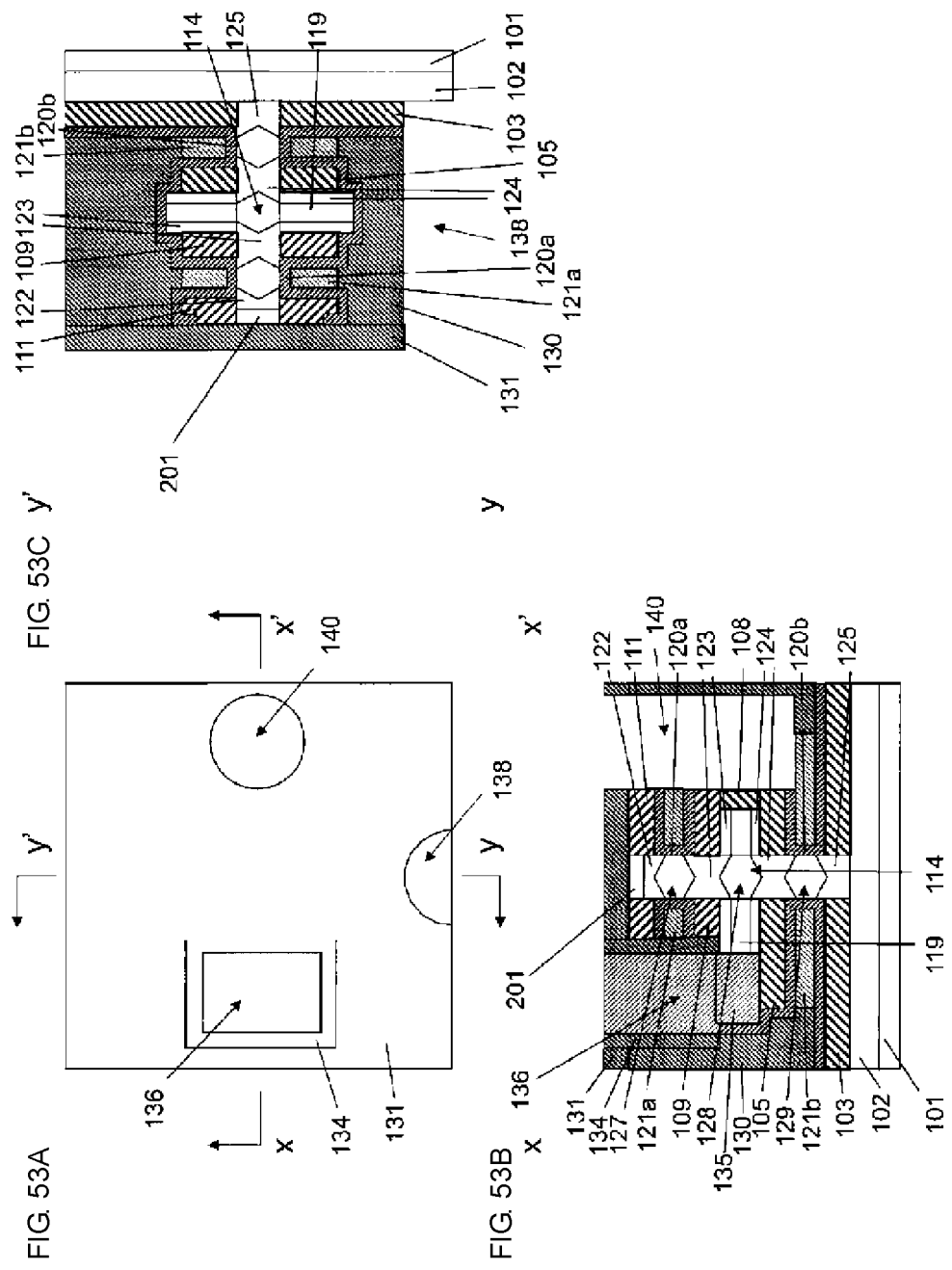

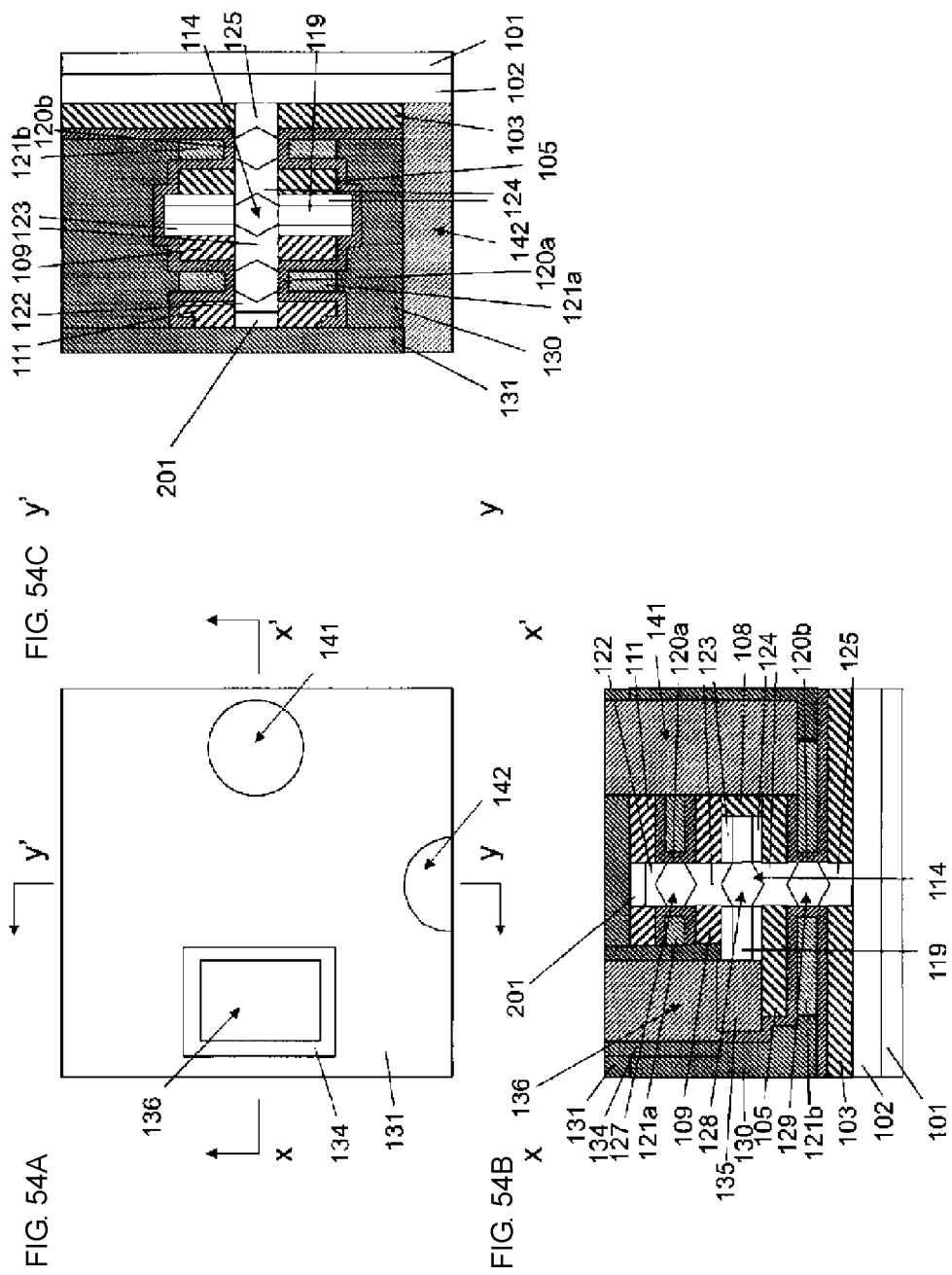

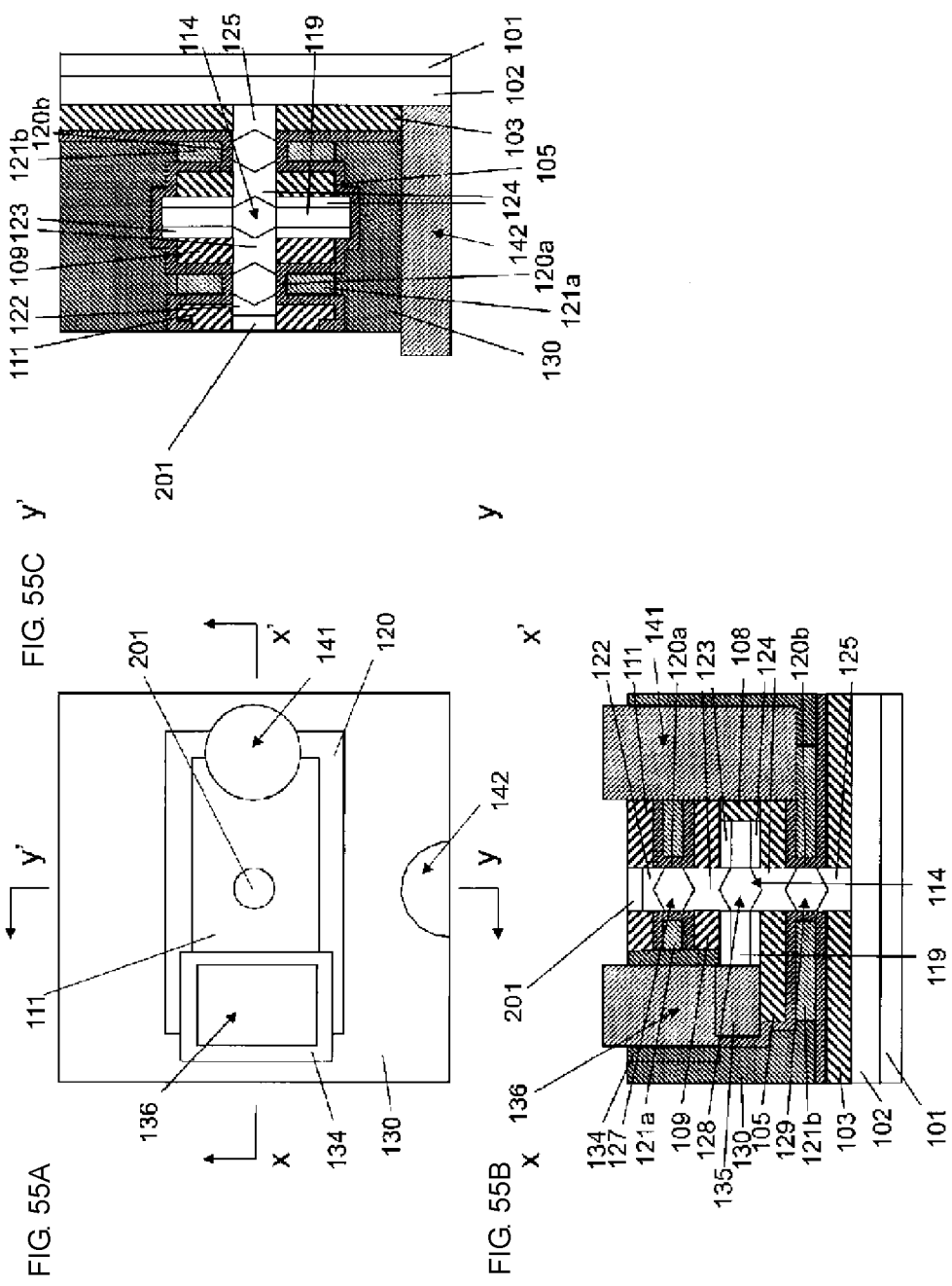

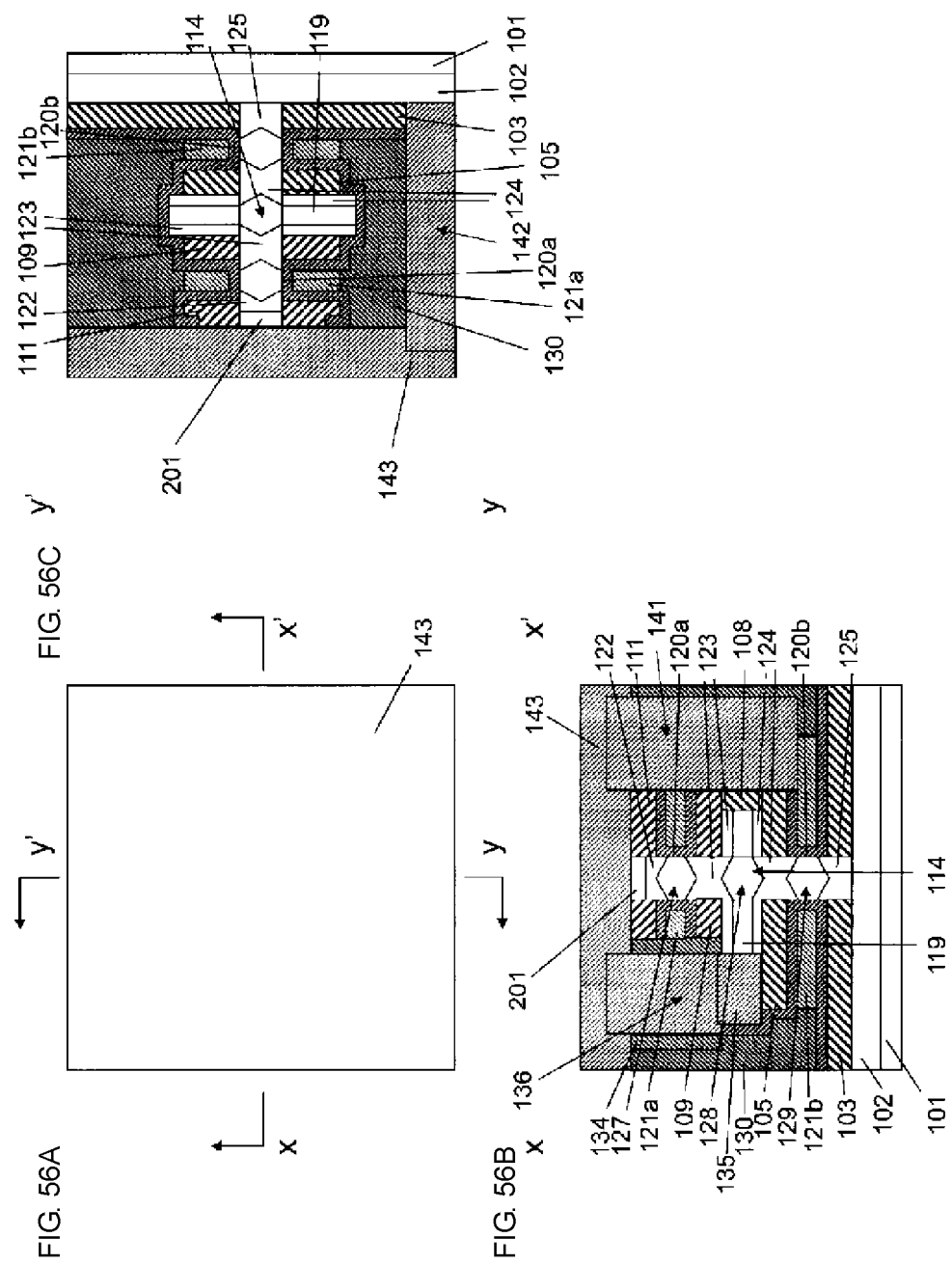

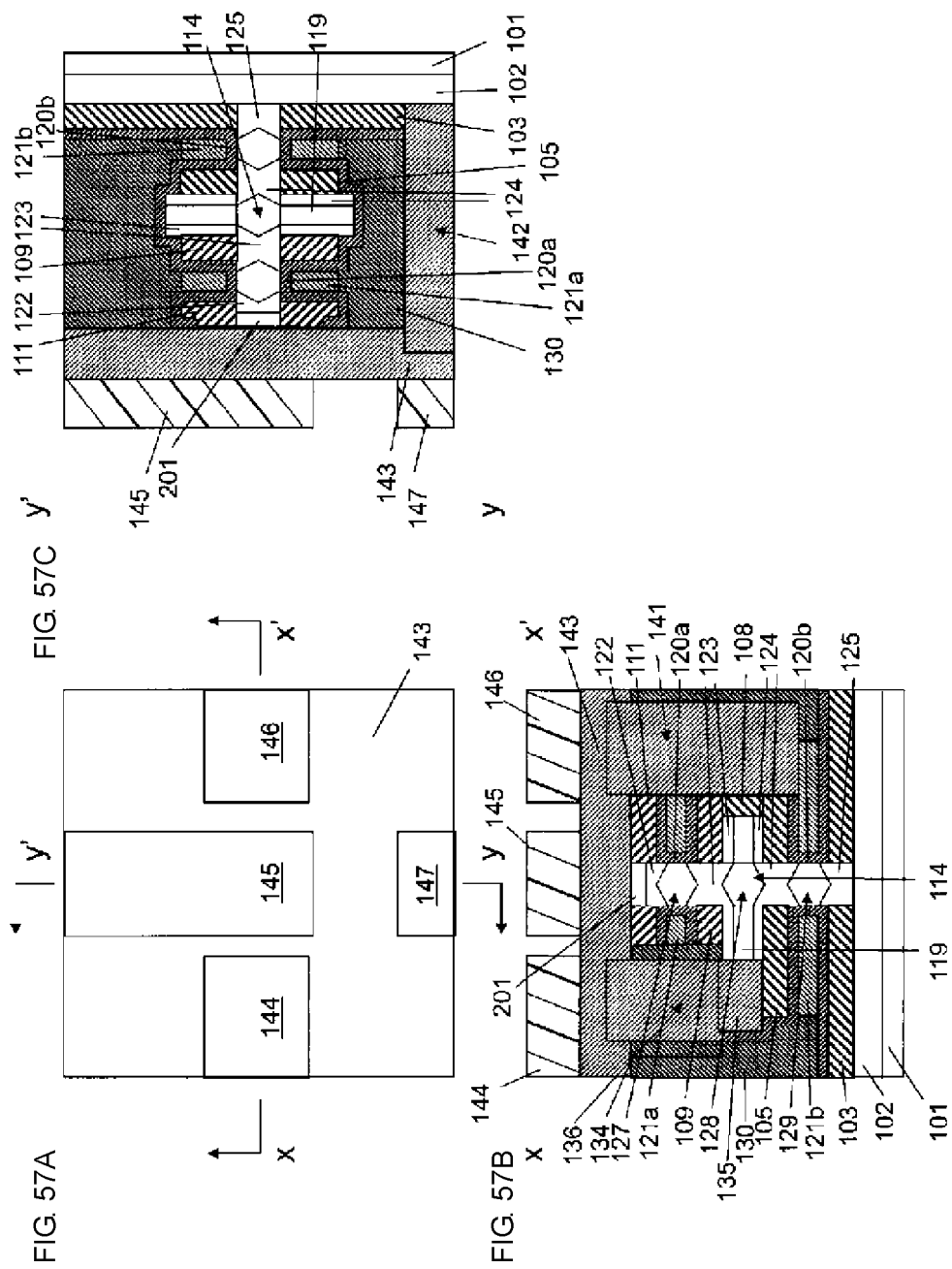

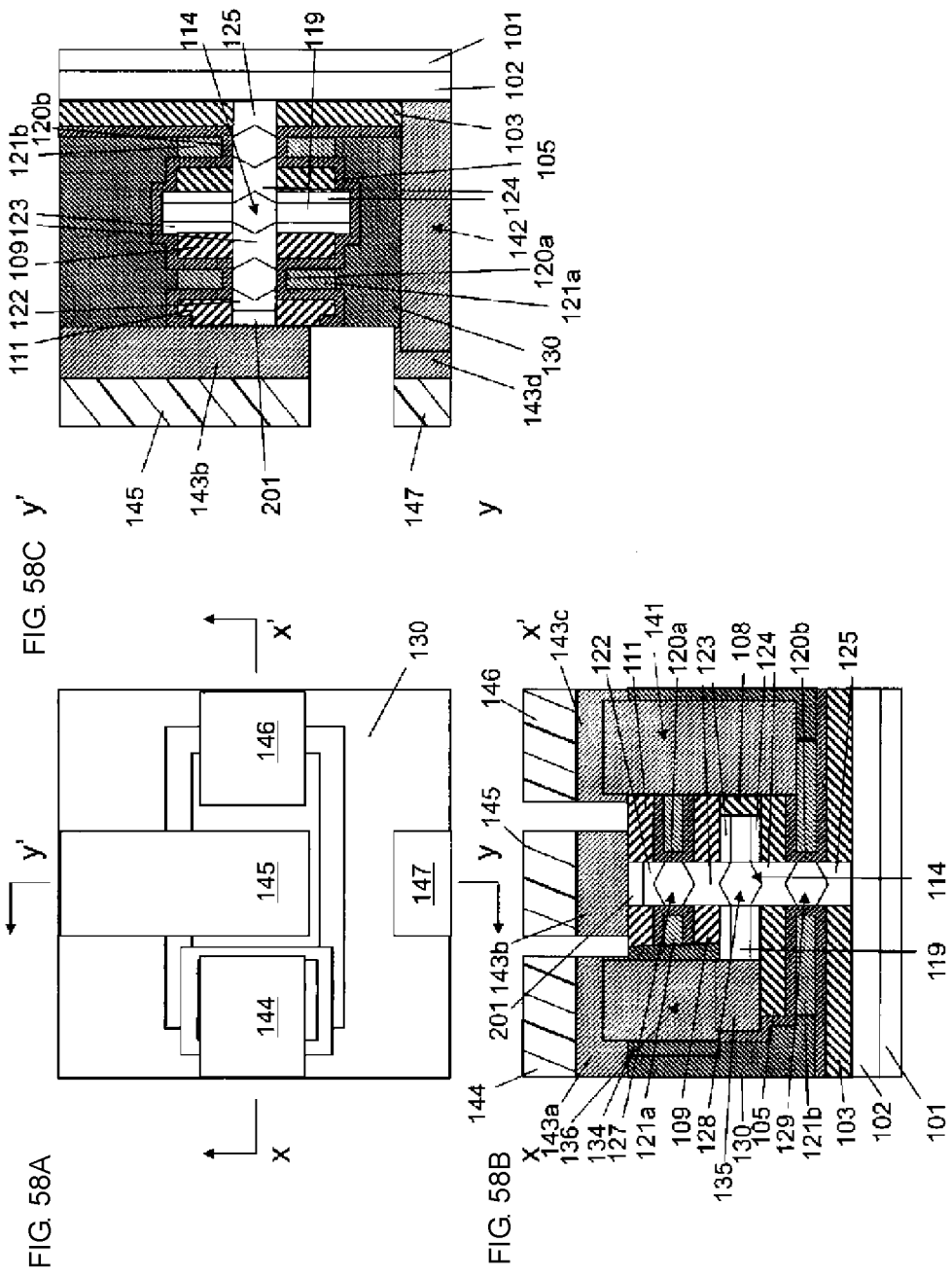

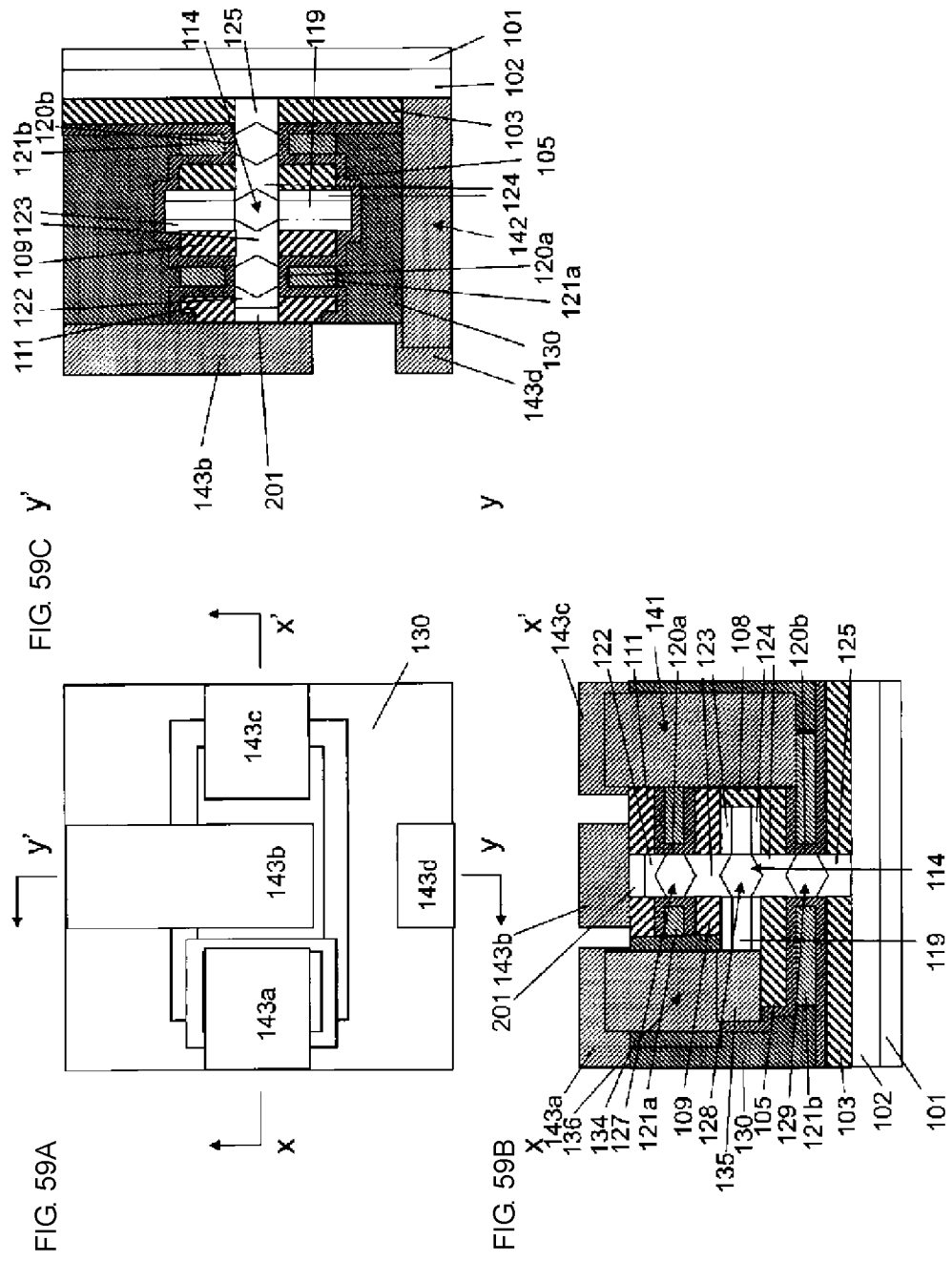

METHOD FOR PRODUCING A SEMICONDUCTOR DEVICE

RELATED APPLICATIONS

The present application is a divisional patent application of U.S. Ser. No. 14/744,588, filed Jun. 19, 2015, which claims priority to PCT/JP2014/070877, filed Aug. 7, 2014, the entire contents of which are incorporated herein by reference.

BACKGROUND

1. Field of the Invention

The present invention relates to a method for producing a semiconductor device and a semiconductor device.

2. Description of the Related Art

The degree of integration of semiconductor integrated circuits, in particular, integrated circuits using MOS transistors has been increasing. With the increasing degree of integration, the size of MOS transistors used in integrated circuits has been decreased to nano-scale dimensions. Such a decrease in the size of MOS transistors causes difficulty in suppressing leak currents, which poses a problem in that it is hard to reduce the area occupied by the circuits because of the requirements of the secure retention of necessary currents. To address the problem, a surrounding gate transistor (hereinafter referred to as an "SGT") having a structure in which a source, a gate, and a drain are arranged vertically with respect to a substrate and a gate electrode surrounds a pillar-shaped semiconductor layer has been proposed (e.g., refer to Japanese Unexamined Patent Application Publication Nos. 2-71556, 2-188966, and 3-145761).

In known inverters that use an SGT, a single transistor is formed in a single silicon pillar, and an nMOS transistor constituted by a single silicon pillar and a pMOS transistor constituted by a single silicon pillar are formed on a plane (e.g., refer to Japanese Unexamined Patent Application Publication No. 2008-300558). Since at least two silicon pillars are formed on a plane, an area corresponding to the at least two silicon pillars is required.

In known nonvolatile memories, a plurality of gates are formed in a single silicon pillar (e.g., refer to Japanese Unexamined Patent Application Publication No. 2014-57068). A gate insulating film is formed on a sidewall of the silicon pillar, and a source line and a bit line are connected to an upper end and a lower end of the silicon pillar, respectively.

SUMMARY

Accordingly, an object is to provide an inverter circuit formed of a single semiconductor pillar.

A method for producing a semiconductor device includes depositing an oxide film containing an impurity having a first conductivity type on a substrate. A nitride film is deposited and a first oxide film is deposited that contains an impurity having a second conductivity type that differs from the first conductivity type. The first oxide film, the nitride film, and the second oxide film are etched to form a contact hole. An epitaxial growth process is carried out form a first pillar-shaped silicon layer in the contact hole. The nitride film is removed and epitaxial growth process is performed to form an output terminal.

A semiconductor device according to an embodiment of the present invention includes a third first-conductivity-type semiconductor layer formed on a semiconductor substrate; a first pillar-shaped semiconductor layer formed on the semiconductor substrate, the first pillar-shaped semiconductor layer including a first first-conductivity-type semiconductor layer, a first body region, a second first-conductivity-type semiconductor layer, a first second-conductivity-type semiconductor layer, a second body region, a second second-conductivity-type semiconductor layer, and a third second-conductivity-type semiconductor layer formed from a substrate side in that order; a first gate insulating film formed around the first body region; a first gate formed around the first gate insulating film; a second gate insulating film formed around the second body region; a second gate formed around the second gate insulating film; an output terminal made of a semiconductor and connected to the second first-conductivity-type semiconductor layer and the first second-conductivity-type semiconductor layer; and a first contact that connects the first gate and the second gate. The second first-conductivity-type semiconductor layer and the first second-conductivity-type semiconductor layer are further formed in the output terminal.

The first gate insulating film may be further formed on an upper surface and a lower surface of the first gate. The second gate insulating film may be further formed on an upper surface and a lower surface of the second gate.

The semiconductor device may include a first connection region formed between the second first-conductivity-type semiconductor layer and the first second-conductivity-type semiconductor layer.

The semiconductor device may include a first insulating film that surrounds the first first-conductivity-type semiconductor layer, a second insulating film that surrounds the second first-conductivity-type semiconductor layer, a third insulating film that surrounds the first second-conductivity-type semiconductor layer, and a fourth insulating film that surrounds the second second-conductivity-type semiconductor layer. The first insulating film contains the same impurity as that of the first first-conductivity-type semiconductor layer, the second insulating film contains the same impurity as that of the second first-conductivity-type semiconductor layer, the third insulating film contains the same impurity as that of the first second-conductivity-type semiconductor layer, and the fourth insulating film contains the same impurity as that of the second second-conductivity-type semiconductor layer.

A method for producing a semiconductor device according to an embodiment of the present invention includes depositing a second insulating film that is an oxide film containing an impurity having a first conductivity type on a substrate, depositing a sixth insulating film that is a nitride film, depositing a third insulating film that is an oxide film containing an impurity having a second conductivity type which is a conductivity type different from the first conductivity type, etching the second insulating film, the sixth insulating film, and the third insulating film to form a contact hole, performing epitaxial growth in the contact hole to form a first pillar-shaped silicon layer; and removing the sixth insulating film and performing epitaxial growth to form an output terminal.

By performing a heat treatment after the step of performing epitaxial growth in the contact hole to form a first pillar-shaped silicon layer, a second first-conductivity-type semiconductor layer and a first second-conductivity-type semiconductor layer may be formed in the first pillar-shaped silicon layer and the output terminal.

According to the present invention, there can be provided an inverter circuit formed of a single semiconductor pillar.

An inverter formed of a single semiconductor pillar is constituted by a third first-conductivity-type semiconductor layer formed on a semiconductor substrate; a first pillar-shaped semiconductor layer formed on the semiconductor substrate, the first pillar-shaped semiconductor layer including a first first-conductivity-type semiconductor layer, a first body region, a second first-conductivity-type semiconductor layer, a first second-conductivity-type semiconductor layer, a second body region, a second second-conductivity-type semiconductor layer, and a third second-conductivity-type semiconductor layer formed from a substrate side in that order; a first gate insulating film formed around the first body region; a first gate formed around the first gate insulating film; a second gate insulating film formed around the second body region; a second gate formed around the second gate insulating film; an output terminal made of a semiconductor and connected to the second first-conductivity-type semiconductor layer and the first second-conductivity-type semiconductor layer; and a first contact that connects the first gate and the second gate, wherein the second first-conductivity-type semiconductor layer and the first second-conductivity-type semiconductor layer are further formed in the output terminal. Therefore, an inverter can be achieved in an area corresponding to a single semiconductor pillar.

Furthermore, when the output terminal is formed of a semiconductor such as silicon, the first gate and the second gate can be simultaneously formed because silicon is not etched with hot phosphoric acid used when a nitride film is removed. The output terminal can also be silicified.

The first gate insulating film is further formed on an upper surface and a lower surface of the first gate, and the second gate insulating film is further formed on an upper surface and a lower surface of the second gate. Therefore, insulation of the first gate in a vertical direction and insulation of the second gate in a vertical direction can be achieved with certainty.

The semiconductor device includes a first connection region formed between the second first-conductivity-type semiconductor layer and the first second-conductivity-type semiconductor layer. Therefore, the second first-conductivity-type semiconductor layer and the first second-conductivity-type semiconductor layer can be separated from each other, and the second first-conductivity-type semiconductor layer that extends to the connection region and the first second-conductivity-type semiconductor layer that extends to the connection region can be connected to the output terminal.

The semiconductor device includes a first insulating film that surrounds the first first-conductivity-type semiconductor layer, a second insulating film that surrounds the second first-conductivity-type semiconductor layer, a third insulating film that surrounds the first second-conductivity-type semiconductor layer, and a fourth insulating film that surrounds the second second-conductivity-type semiconductor layer. The first insulating film contains the same impurity as that of the first first-conductivity-type semiconductor layer, the second insulating film contains the same impurity as that of the second first-conductivity-type semiconductor layer, the third insulating film contains the same impurity as that of the first second-conductivity-type semiconductor layer, and the fourth insulating film contains the same impurity as that of the second second-conductivity-type semiconductor layer. Therefore, semiconductor layers having different conductivity types can be formed in a single pillar-shaped semiconductor layer through solid-state diffusion.

BRIEF DESCRIPTION OF THE DRAWING

FIG. 1A is a plan view illustrating a semiconductor device according to an embodiment of the present invention, FIG. 1B is a sectional view taken along line of FIG. 1A, and FIG. 1C is a sectional view taken along line y-y' of FIG. 1A;

FIG. 2A is a plan view illustrating a method for producing a semiconductor device according to an embodiment of the present invention, FIG. 2B is a sectional view taken along line x-x' of FIG. 2A, and FIG. 2C is a sectional view taken along line y-y' of FIG. 2A;

FIG. 3A is a plan view illustrating a method for producing a semiconductor device according to an embodiment of the present invention, FIG. 3B is a sectional view taken along line x-x' of FIG. 3A, and FIG. 3C is a sectional view taken along line y-y' of FIG. 3A;

FIG. 4A is a plan view illustrating a method for producing a semiconductor device according to an embodiment of the present invention, FIG. 4B is a sectional view taken along line x-x' of FIG. 4A, and FIG. 4C is a sectional view taken along line y-y' of FIG. 4A;

FIG. 5A is a plan view illustrating a method for producing a semiconductor device according to an embodiment of the present invention, FIG. 5B is a sectional view taken along line x-x' of FIG. 5A, and FIG. 5C is a sectional view taken along line y-y' of FIG. 5A;

FIG. 6A is a plan view illustrating a method for producing a semiconductor device according to an embodiment of the present invention, FIG. 6B is a sectional view taken along line x-x' of FIG. 6A, and FIG. 6C is a sectional view taken along line y-y' of FIG. 6A;

FIG. 7A is a plan view illustrating a method for producing a semiconductor device according to an embodiment of the present invention, FIG. 7B is a sectional view taken along line x-x' of FIG. 7A, and FIG. 7C is a sectional view taken along line y-y' of FIG. 7A;

FIG. 8A is a plan view illustrating a method for producing a semiconductor device according to an embodiment of the present invention, FIG. 8B is a sectional view taken along line x-x' of FIG. 8A, and FIG. 8C is a sectional view taken along line y-y' of FIG. 8A;

FIG. 9A is a plan view illustrating a method for producing a semiconductor device according to an embodiment of the present invention, FIG. 9B is a sectional view taken along line x-x' of FIG. 9A, and FIG. 9C is a sectional view taken along line y-y' of FIG. 9A;

FIG. 10A is a plan view illustrating a method for producing a semiconductor device according to an embodiment of the present invention, FIG. 10B is a sectional view taken along line x-x' of FIG. 10A, and FIG. 10C is a sectional view taken along line y-y' of FIG. 10A;

FIG. 11A is a plan view illustrating a method for producing a semiconductor device according to an embodiment of the present invention, FIG. 11B is a sectional view taken along line x-x' of FIG. 11A, and FIG. 11C is a sectional view taken along line y-y' of FIG. 11A;

FIG. 12A is a plan view illustrating a method for producing a semiconductor device according to an embodiment of the present invention, FIG. 12B is a sectional view taken along line x-x' of FIG. 12A, and FIG. 12C is a sectional view taken along line y-y' of FIG. 12A;

FIG. 13A is a plan view illustrating a method for producing a semiconductor device according to an embodiment of the present invention, FIG. 13B is a sectional view taken along line x-x' of FIG. 13A, and FIG. 13C is a sectional view taken along line y-y' of FIG. 13A;

FIG. 15A is a plan view illustrating a method for producing a semiconductor device according to an embodiment of the present invention, FIG. 15B is a sectional view taken along line x-x' of FIG. 15A, and FIG. 15C is a sectional view taken along line y-y' of FIG. 15A;

FIG. 16A is a plan view illustrating a method for producing a semiconductor device according to an embodiment of the present invention, FIG. 16B is a sectional view taken along line x-x' of FIG. 16A, and FIG. 16C is a sectional view taken along line y-y' of FIG. 16A;

FIG. 17A is a plan view illustrating a method for producing a semiconductor device according to an embodiment of the present invention, FIG. 17B is a sectional view taken along line x-x' of FIG. 17A, and FIG. 17C is a sectional view taken along line y-y' of FIG. 17A;

FIG. 18A is a plan view illustrating a method for producing a semiconductor device according to an embodiment of the present invention, FIG. 18B is a sectional view taken along line x-x' of FIG. 18A, and FIG. 18C is a sectional view taken along line y-y' of FIG. 18A;

FIG. 19A is a plan view illustrating a method for producing a semiconductor device according to an embodiment of the present invention, FIG. 19B is a sectional view taken along line x-x' of FIG. 19A, and FIG. 19C is a sectional view taken along line y-y' of FIG. 19A;

FIG. 20A is a plan view illustrating a method for producing a semiconductor device according to an embodiment of the present invention, FIG. 20B is a sectional view taken along line x-x' of FIG. 20A, and FIG. 20C is a sectional view taken along line y-y' of FIG. 20A;

FIG. 21A is a plan view illustrating a method for producing a semiconductor device according to an embodiment of the present invention, FIG. 21B is a sectional view taken along line x-x' of FIG. 21A, and FIG. 21C is a sectional view taken along line y-y' of FIG. 21A;

FIG. 22A is a plan view illustrating a method for producing a semiconductor device according to an embodiment of the present invention, FIG. 22B is a sectional view taken along line x-x' of FIG. 22A, and FIG. 22C is a sectional view taken along line y-y' of FIG. 22A;

FIG. 23A is a plan view illustrating a method for producing a semiconductor device according to an embodiment of the present invention, FIG. 23B is a sectional view taken along line x-x' of FIG. 23A, and FIG. 23C is a sectional view taken along line y-y' of FIG. 23A;

FIG. 25A is a plan view illustrating a method for producing a semiconductor device according to an embodiment of the present invention, FIG. 25B is a sectional view taken along line x-x' of FIG. 25A, and FIG. 25C is a sectional view taken along line y-y' of FIG. 25A;

FIG. 26A is a plan view illustrating a method for producing a semiconductor device according to an embodiment of the present invention, FIG. 26B is a sectional view taken along line x-x' of FIG. 26A, and FIG. 26C is a sectional view taken along line y-y' of FIG. 26A;

FIG. 27A is a plan view illustrating a method for producing a semiconductor device according to an embodiment of the present invention, FIG. 27B is a sectional view taken along line x-x' of FIG. 27A, and FIG. 27C is a sectional view taken along line y-y' of FIG. 27A;

FIG. 28A is a plan view illustrating a method for producing a semiconductor device according to an embodiment of the present invention, FIG. 28B is a sectional view taken along line x-x' of FIG. 28A, and FIG. 28C is a sectional view taken along line y-y' of FIG. 28A;

FIG. 29A is a plan view illustrating a method for producing a semiconductor device according to an embodiment of the present invention, FIG. 29B is a sectional view taken along line x-x' of FIG. 29A, and FIG. 29C is a sectional view taken along line y-y' of FIG. 29A;

FIG. 30A is a plan view illustrating a method for producing a semiconductor device according to an embodiment of the present invention, FIG. 30B is a sectional view taken along line x-x' of FIG. 30A, and FIG. 30C is a sectional view taken along line y-y' of FIG. 30A;

FIG. 32A is a plan view illustrating a method for producing a semiconductor device according to an embodiment of the present invention, FIG. 32B is a sectional view taken along line x-x' of FIG. 32A, and FIG. 32C is a sectional view taken along line y-y' of FIG. 32A;

FIG. 33A is a plan view illustrating a method for producing a semiconductor device according to an embodiment of the present invention, FIG. 33B is a sectional view taken along line x-x' of FIG. 33A, and FIG. 33C is a sectional view taken along line y-y' of FIG. 33A;

FIG. 34A is a plan view illustrating a method for producing a semiconductor device according to an embodiment of the present invention, FIG. 34B is a sectional view taken along line x-x' of FIG. 34A, and FIG. 34C is a sectional view taken along line y-y' of FIG. 34A;

FIG. 35A is a plan view illustrating a method for producing a semiconductor device according to an embodiment of the present invention, FIG. 35B is a sectional view taken along line x-x' of FIG. 35A, and FIG. 35C is a sectional view taken along line y-y' of FIG. 35A;

FIG. 36A is a plan view illustrating a method for producing a semiconductor device according to an embodiment of the present invention, FIG. 36B is a sectional view taken along line x-x' of FIG. 36A, and FIG. 36C is a sectional view taken along line y-y' of FIG. 36A;

FIG. 38A is a plan view illustrating a method for producing a semiconductor device according to an embodiment of the present invention, FIG. 38B is a sectional view taken along line x-x' of FIG. 38A, and FIG. 38C is a sectional view taken along line y-y' of FIG. 38A;

FIG. 39A is a plan view illustrating a method for producing a semiconductor device according to an embodiment of the present invention, FIG. 39B is a sectional view taken along line x-x' of FIG. 39A, and FIG. 39C is a sectional view taken along line y-y' of FIG. 39A;

FIG. 40A is a plan view illustrating a method for producing a semiconductor device according to an embodiment of the present invention, FIG. 40B is a sectional view taken along line x-x' of FIG. 40A, and FIG. 40C is a sectional view taken along line y-y' of FIG. 40A;

FIG. 41A is a plan view illustrating a method for producing a semiconductor device according to an embodiment of the present invention, FIG. 41B is a sectional view taken along line x-x' of FIG. 41A, and FIG. 41C is a sectional view taken along line y-y' of FIG. 41A;

FIG. 42A is a plan view illustrating a method for producing a semiconductor device according to an embodiment of the present invention, FIG. 42B is a sectional view taken along line x-x' of FIG. 42A, and FIG. 42C is a sectional view taken along line y-y' of FIG. 42A;

FIG. 45A is a plan view illustrating a method for producing a semiconductor device according to an embodiment of the present invention, FIG. 45B is a sectional view taken along line x-x' of FIG. 45A, and FIG. 45C is a sectional view taken along line y-y' of FIG. 45A;

FIG. 46A is a plan view illustrating a method for producing a semiconductor device according to an embodiment of the present invention, FIG. 46B is a sectional view taken along line x-x' of FIG. 46A, and FIG. 46C is a sectional view taken along line y-y' of FIG. 46A;

FIG. 47A is a plan view illustrating a method for producing a semiconductor device according to an embodiment of the present invention, FIG. 47B is a sectional view taken along line x-x' of FIG. 47A, and FIG. 47C is a sectional view taken along line y-y' of FIG. 47A;

FIG. 48A is a plan view illustrating a method for producing a semiconductor device according to an embodiment of the present invention, FIG. 48B is a sectional view taken along line x-x' of FIG. 48A, and FIG. 48C is a sectional view taken along line y-y' of FIG. 48A;

FIG. 49A is a plan view illustrating a method for producing a semiconductor device according to an embodiment of the present invention, FIG. 49B is a sectional view taken along line x-x' of FIG. 49A, and FIG. 49C is a sectional view taken along line y-y' of FIG. 49A;

FIG. 50A is a plan view illustrating a method for producing a semiconductor device according to an embodiment of the present invention, FIG. 50B is a sectional view taken along line x-x' of FIG. 50A, and FIG. 50C is a sectional view taken along line y-y' of FIG. 50A;

FIG. 51A is a plan view illustrating a method for producing a semiconductor device according to an embodiment of the present invention, FIG. 51B is a sectional view taken along line x-x' of FIG. 51A, and FIG. 51C is a sectional view taken along line y-y' of FIG. 51A;

FIG. 53A is a plan view illustrating a method for producing a semiconductor device according to an embodiment of the present invention, FIG. 53B is a sectional view taken along line x-x' of FIG. 53A, and FIG. 53C is a sectional view taken along line y-y' of FIG. 53A;

FIG. 54A is a plan view illustrating a method for producing a semiconductor device according to an embodiment of the present invention, FIG. 54B is a sectional view taken along line x-x' of FIG. 54A, and FIG. 54C is a sectional view taken along line y-y' of FIG. 54A;

FIG. 55A is a plan view illustrating a method for producing a semiconductor device according to an embodiment of the present invention, FIG. 55B is a sectional view taken along line x-x' of FIG. 55A, and FIG. 55C is a sectional view taken along line y-y' of FIG. 55A;

FIG. 56A is a plan view illustrating a method for producing a semiconductor device according to an embodiment of the present invention, FIG. 56B is a sectional view taken along line x-x' of FIG. 56A, and FIG. 56C is a sectional view taken along line y-y' of FIG. 56A;

FIG. 57A is a plan view illustrating a method for producing a semiconductor device according to an embodiment of the present invention, FIG. 57B is a sectional view taken along line x-x' of FIG. 57A, and FIG. 57C is a sectional view taken along line y-y' of FIG. 57A;

FIG. 58A is a plan view illustrating a method for producing a semiconductor device according to an embodiment of the present invention, FIG. 58B is a sectional view taken along line x-x' of FIG. 58A, and FIG. 58C is a sectional view taken along line y-y' of FIG. 58A; and FIG. 59A is a plan view illustrating a method for producing a semiconductor device according to an embodiment of the present invention, FIG. 59B is a sectional view taken along line x-x' of FIG. 59A, and FIG. 59C is a sectional view taken along line y-y' of FIG. 59A.

DETAILED DESCRIPTION OF THE PREFERRED EMBODIMENTS

Figure 14C:
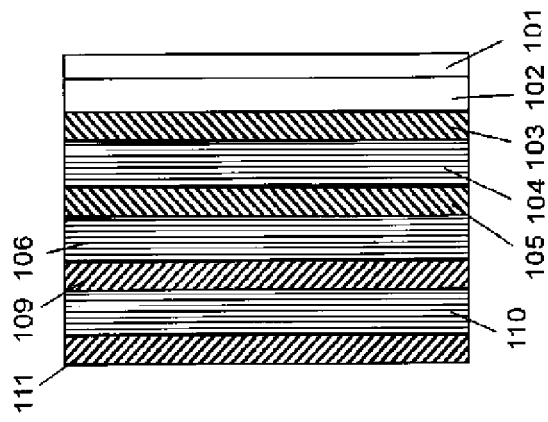
FIG. 14C is a sectional view taken along line y-y' of FIG. 14A.

Hereafter, embodiments of the present invention will be described. FIGS. 1A to 1C illustrate a structure of a semiconductor device according to an embodiment of the present invention. In this embodiment, silicon is used as a semiconductor, but a material other than silicon may be used as a semiconductor.

The semiconductor device includes a third first-conductivity-type silicon layer 102 formed on a silicon substrate 101 and a first pillar-shaped silicon layer 114 formed on the silicon substrate 101. The first pillar-shaped silicon layer 114 includes a first first-conductivity-type silicon layer 125, a first body region 129, a second first-conductivity-type silicon layer 124, a first second-conductivity-type silicon layer 123, a second body region 127, a second second-conductivity-type silicon layer 122, and a third second-conductivity-type silicon layer 201 formed from the substrate side in that order. The semiconductor device also includes a first gate insulating film 120b formed around the first body region 129, a first gate 121b formed around the first gate insulating film 120b, a second gate insulating film 120a formed around the second body region 127, a second gate 121a formed around the second gate insulating film 120a, an output terminal 119 made of a semiconductor and connected to the second first-conductivity-type silicon layer 124 and the first second-conductivity-type silicon layer 123, and a first contact 141 that connects the first gate 121b and the second gate 121a. The second first-conductivity-type silicon layer 124 and the first second-conductivity-type silicon layer 123 are further formed in the output terminal 119.

A silicide 135 is formed in the output terminal 119 so as to connect the second first-conductivity-type silicon layer 124 and the first second-conductivity-type silicon layer 123.

The first gate 121b and the second gate 121a are preferably made of a metal to adjust the threshold of transistors. The metal is preferably titanium nitride or titanium aluminum nitride. The first gate insulating film 120b and the second gate insulating film 120a are each preferably an oxide film, an oxynitride film, or a high-K dielectric film.

The first gate insulating film 120b is also formed on the upper surface and lower surface of the first gate 121b. The second gate insulating film 120a is also formed on the upper surface and lower surface of the second gate 121a.

The semiconductor device includes a first connection region 128 formed between the second first-conductivity-type silicon layer 124 and the first second-conductivity-type silicon layer 123.

The semiconductor device also includes a first insulating film 103 that surrounds the first first-conductivity-type silicon layer 125 and a second insulating film 105 that surrounds the second first-conductivity-type silicon layer 124. The first insulating film 103 contains the same impurity as that of the first first-conductivity-type silicon layer 125, and the second insulating film 105 contains the same impurity as that of the second first-conductivity-type silicon layer 124. The semiconductor device also includes a third insulating film 109 that surrounds the first second-conductivity-type silicon layer 123 and a fourth insulating film 111 that surrounds the second second-conductivity-type silicon layer 122. The third insulating film 109 contains the same impurity as that of the first second-conductivity-type silicon layer 123, and the fourth insulating film 111 contains the same impurity as that of the second second-conductivity-type silicon layer 122.

When the transistor in a lower portion is an nMOS transistor, the first insulating film 103 and the second insulating film 105 are each preferably an oxide film containing phosphorus or arsenic in a high concentration. When the transistor in an upper portion is a pMOS transistor, the third insulating film 109 and the fourth insulating film 111 are each preferably an oxide film containing boron in a high concentration. When the transistor in a lower portion is a pMOS transistor, the first insulating film 103 and the second insulating film 105 are each preferably an oxide film containing boron in a high concentration. When the transistor in an upper portion is an nMOS transistor, the third insulating film 109 and the fourth insulating film 111 are each preferably an oxide film containing phosphorus or arsenic in a high concentration.

A production process for forming a structure of an SGT according to an embodiment of the present invention will be described with reference to FIG. 2A to FIG. 59C. In this embodiment, the substrate is made of silicon, but may be made of another semiconductor. In the process of this embodiment, nMOS is formed in a lower portion of a pillar-shaped semiconductor layer and pMOS is formed in an upper portion of the pillar-shaped semiconductor layer. However, pMOS may be formed in the lower portion and nMOS may be formed in the upper portion.

As illustrated in FIGS. 2A to 2C, an impurity is introduced into a silicon substrate 101 to form a third first-conductivity-type silicon layer 102.

As illustrated in FIGS. 3A to 3C, a first insulating film 103 is formed. The first insulating film 103 is preferably an oxide film and more preferably an oxide film containing phosphorus or arsenic in a high concentration. Alternatively, after the formation of the first insulating film 103, an impurity may be implanted to form an oxide film containing phosphorus or arsenic in a high concentration.

As illustrated in FIGS. 4A to 4C, a fifth insulating film 104 is formed. The fifth insulating film 104 is preferably a nitride film.

As illustrated in FIGS. 5A to 5C, a second insulating film 105 is formed. The second insulating film 105 is preferably an oxide film and more preferably an oxide film containing phosphorus or arsenic in a high concentration. Alternatively, after the formation of the second insulating film 105, an impurity may be implanted to form an oxide film containing phosphorus or arsenic in a high concentration.

As illustrated in FIGS. 6A to 6C, a sixth insulating film 106 is formed. The sixth insulating film 106 is preferably a nitride film.

As illustrated in FIGS. 7A to 7C, a first resist 107 is formed.

As illustrated in FIGS. 8A to 8C, the sixth insulating film 106 is etched.

As illustrated in FIGS. 9A to 9C, the first resist 107 is removed.

As illustrated in FIGS. 10A to 10C, a seventh insulating film 108 is formed to perform planarization. The seventh insulating film 108 is preferably an oxide film.

As illustrated in FIGS. 11A to 11C, the seventh insulating film 108 is etched back to expose the sixth insulating film 106.

As illustrated in FIGS. 12A to 12C, a third insulating film 109 is formed. The third insulating film 109 is preferably an oxide film and more preferably an oxide film containing boron in a high concentration. Alternatively, after the formation of the third insulating film 109, an impurity may be implanted to form an oxide film containing boron in a high concentration.

As illustrated in FIGS. 13A to 13C, an eighth insulating film 110 is formed. The eighth insulating film 110 is preferably a nitride film.

Figure 14A:
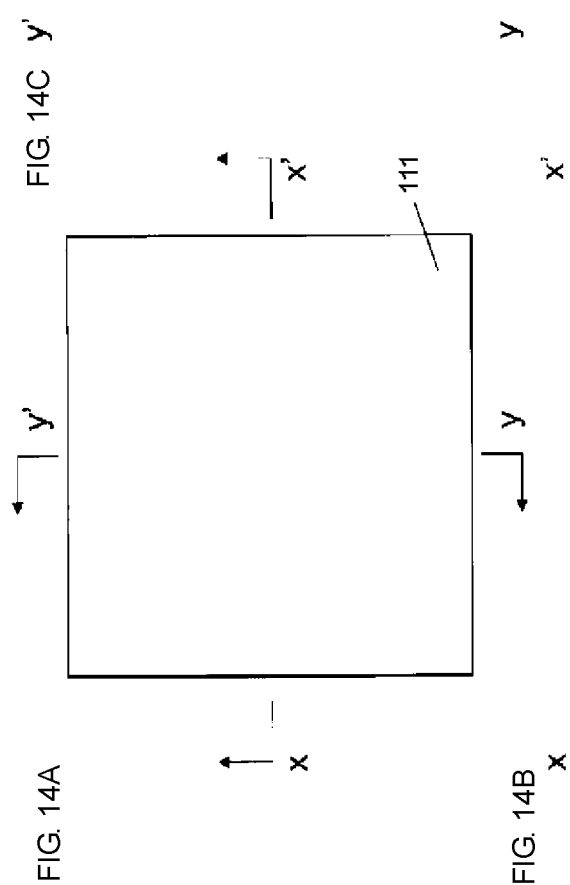
FIG. 14A is a plan view illustrating a method for producing a semiconductor device according to an embodiment of the present invention.
Figure 14B:
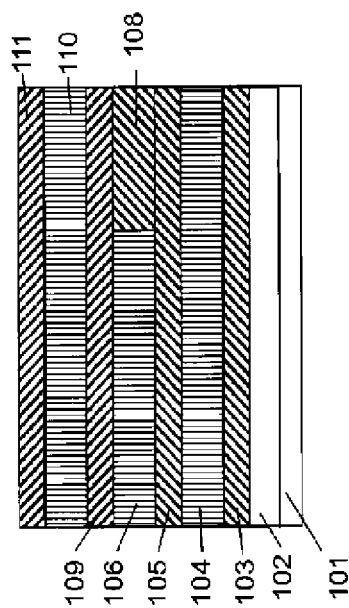
FIG. 14B is a sectional view taken along line x-x' of FIG. 14A.

As illustrated in FIGS. 14A to 14C, a fourth insulating film 111 is formed. The fourth insulating film 111 is preferably an oxide film and more preferably an oxide film containing boron in a high concentration. Alternatively, after the formation of the fourth insulating film 111, an impurity may be implanted to form an oxide film containing boron in a high concentration.

As illustrated in FIGS. 15A to 15C, a second resist 112 is formed.

As illustrated in FIGS. 16A to 16C, the fourth insulating film 111, the eighth insulating film 110, the third insulating film 109, the sixth insulating film 106, the second insulating film 105, the fifth insulating film 104, and the first insulating film 103 are etched to form a contact hole 113.

As illustrated in FIGS. 17A to 17C, the second resist 112 is removed.

As illustrated in FIGS. 18A to 18C, a first pillar-shaped silicon layer 114 is formed by performing epitaxial growth. A polysilicon may be deposited.

As illustrated in FIGS. 19A to 19C, boron is introduced as an impurity to form a third second-conductivity-type silicon layer 201.

As illustrated in FIGS. 20A to 20C, a polysilicon 115 is deposited. A polysilicon is used herein, but any material that serves as a hard mask may be used.

As illustrated in FIGS. 21A to 21C, a ninth insulating film 116 is deposited. The ninth insulating film 116 is preferably an oxide film.

As illustrated in FIGS. 22A to 22C, a third resist 117 is formed.

As illustrated in FIGS. 23A to 23C, the ninth insulating film 116, the polysilicon 115, the fourth insulating film 111, the eighth insulating film 110, and the third insulating film 109 are etched.

Figure 24C:
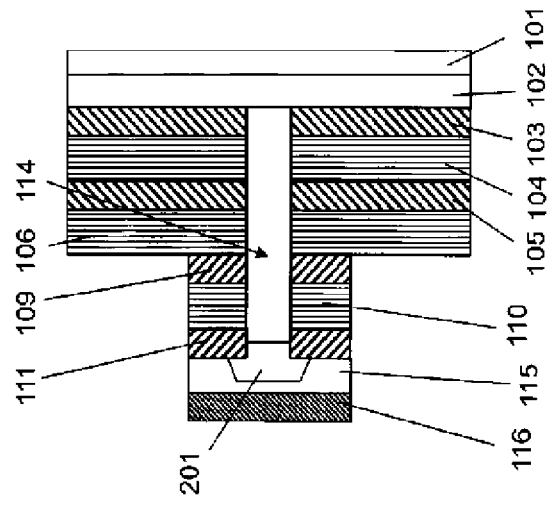
FIG. 24C is a sectional view taken along line y-y' of FIG. 24A.
Figure 24A:
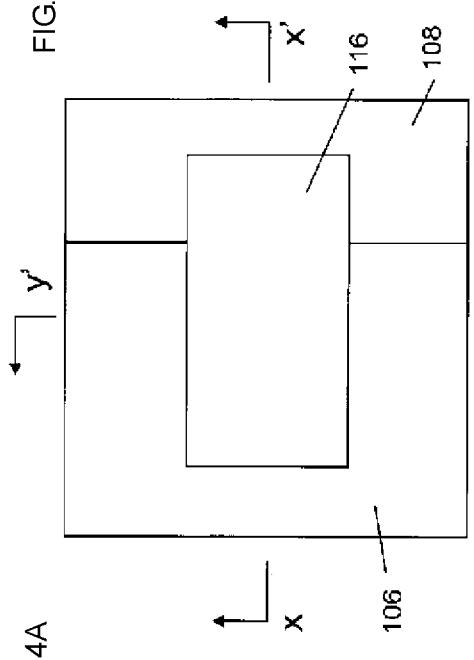
FIG. 24A is a plan view illustrating a method for producing a semiconductor device according to an embodiment of the present invention.
Figure 24B:
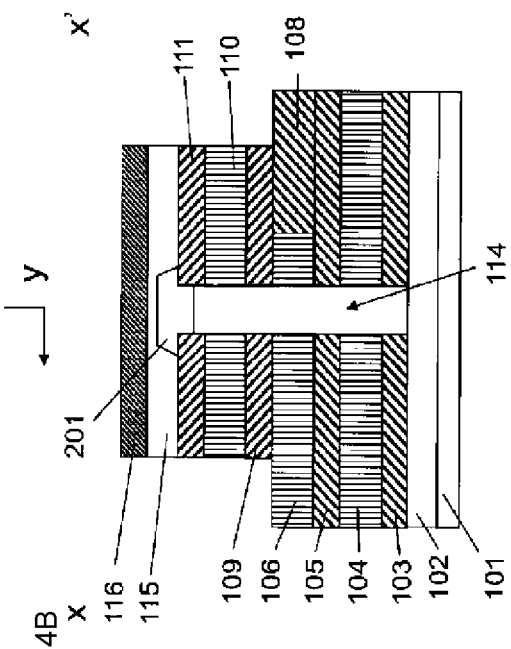
FIG. 24B is a sectional view taken along line x-x' of FIG. 24A.

As illustrated in FIGS. 24A to 24C, the third resist 117 is removed.

As illustrated in FIGS. 25A to 25C, a tenth insulating film 118 is deposited. The tenth insulating film 118 is preferably an oxide film.

As illustrated in FIGS. 26A to 26C, the tenth insulating film 118 is etched so as to be left as a sidewall.

As illustrated in FIGS. 27A to 27C, the sixth insulating film 106 is removed. Wet etching that uses hot phosphoric acid is preferably employed. Dry etching may also be used.

As illustrated in FIGS. 28A to 28C, an output terminal 119 is formed by performing epitaxial growth of silicon. A polysilicon may also be used.

As illustrated in FIGS. 29A to 29C, silicon etching is performed to remove a redundant portion of the output terminal 119. The silicon etching is preferably performed by dry etching.

As illustrated in FIGS. 30A to 30C, the seventh insulating film 108 and the second insulating film 105 are etched. Dry etching is preferably employed. At the same time, the ninth insulating film 116 and the tenth insulating film 118 are etched.

Figure 31A:
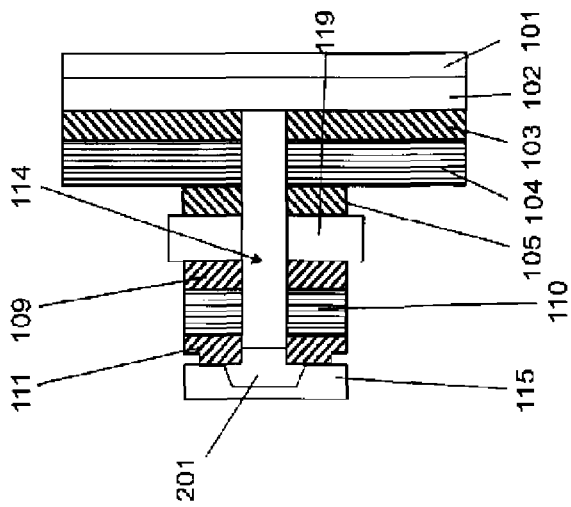
FIG. 31A is a plan view illustrating a method for producing a semiconductor device according to an embodiment of the present invention.
Figure 31C:
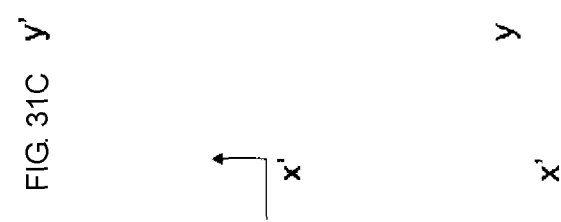
FIG. 31C is a sectional view taken along line y-y' of FIG. 31A.
Figure 31B:
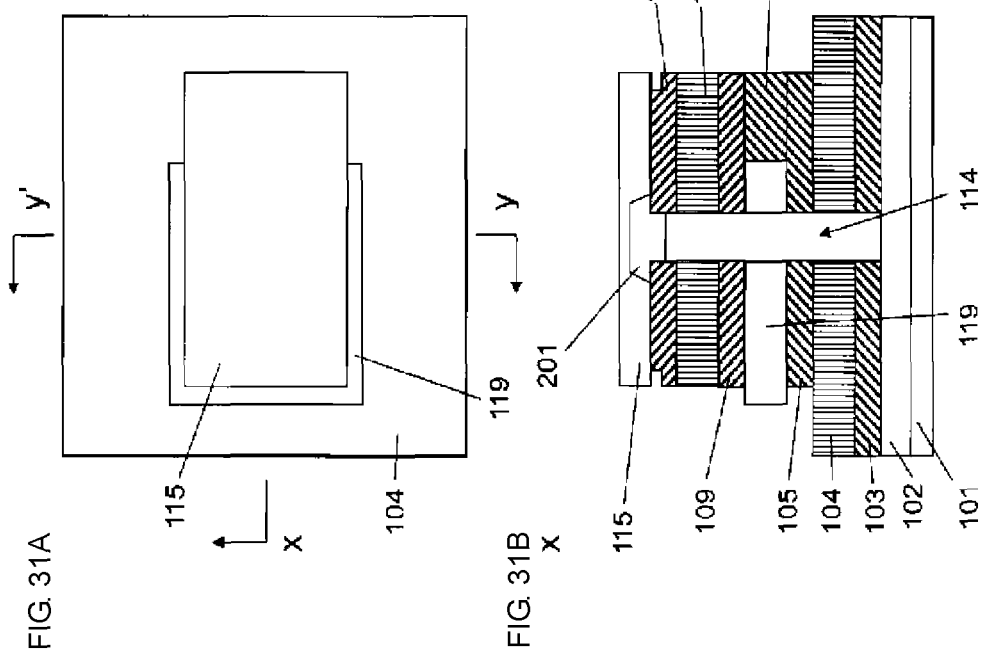
FIG. 31B is a sectional view taken along line x-x' of FIG. 31A.

As illustrated in FIGS. 31A to 31C, the tenth insulating film 118 is removed. Isotropic etching such as wet etching is preferably employed.

As illustrated in FIGS. 32A to 32C, the eighth insulating film 110 and the fifth insulating film 104 are removed. Wet etching that uses hot phosphoric acid is preferably employed. Dry etching may also be used. Since silicon is not etched with hot phosphoric acid used when a nitride film is removed, the output terminal formed of silicon is not etched.

As illustrated in FIGS. 33A to 33C, a gate insulating film 120 is formed. The gate insulating film 120 is preferably an oxide film, an oxynitride film, or a high-K dielectric film.

As illustrated in FIGS. 34A to 34C, a metal 121 to be a gate is formed. The metal 121 is preferably titanium nitride or titanium aluminum nitride.

As illustrated in FIGS. 35A to 35C, the metal 121 is etched to form a first gate 121b and a second gate 121a. Herein, the gate insulating film 120 includes a first gate insulating film 120b and a second gate insulating film 120a.

As illustrated in FIGS. 36A to 36C, a heat treatment is performed to form a first first-conductivity-type silicon layer 125, a second first-conductivity-type silicon layer 124, a first second-conductivity-type silicon layer 123, and a second second-conductivity-type silicon layer 122 through solid-state diffusion. The heat treatment may be performed before the formation of the first gate 121b and the second gate 121a. Furthermore, the second first-conductivity-type silicon layer 124 and the first second-conductivity-type silicon layer 123 are formed in the output terminal 119. A diffusion layer 126 is also formed in the polysilicon 115.

Figure 37A:
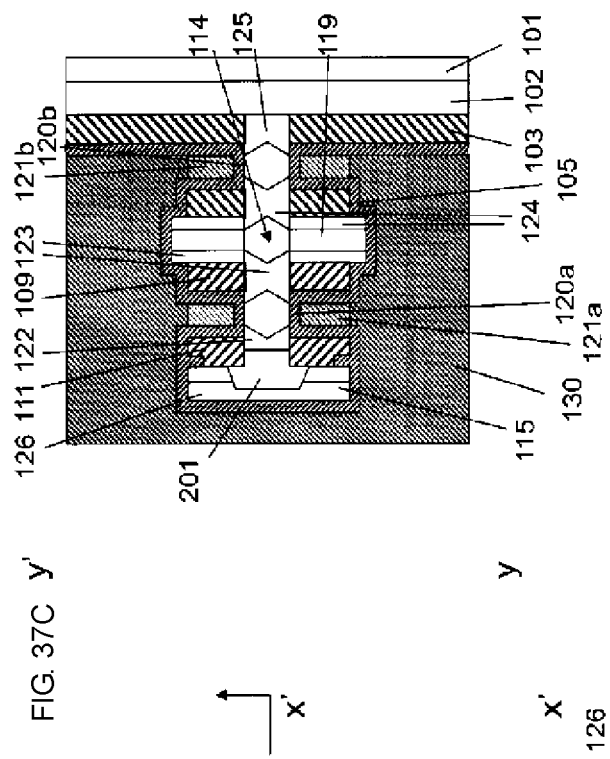
FIG. 37A is a plan view illustrating a method for producing a semiconductor device according to an embodiment of the present invention.
Figure 37C:
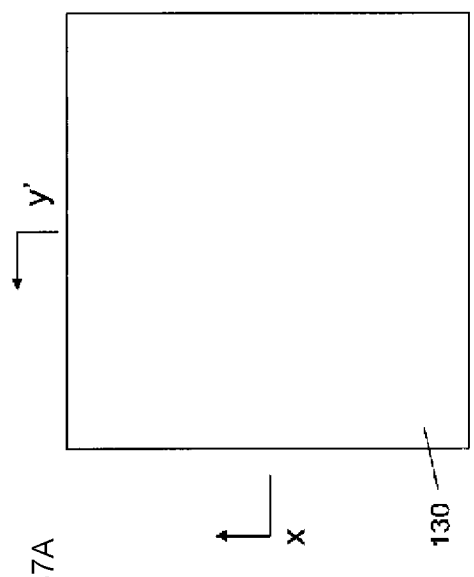
FIG. 37C is a sectional view taken along line y-y' of FIG. 37A.
Figure 37B:
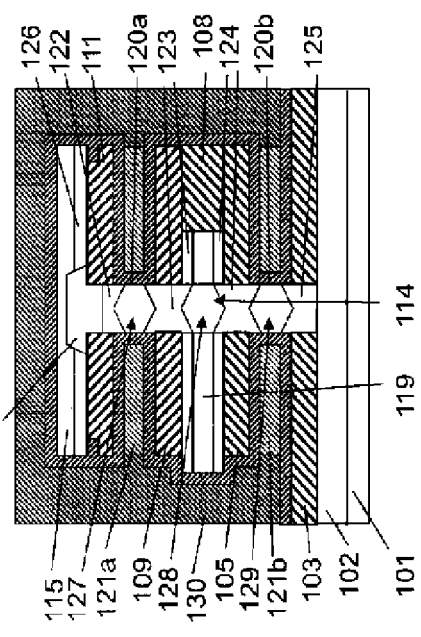
FIG. 37B is a sectional view taken along line x-x' of FIG. 37A.

As illustrated in FIGS. 37A to 37C, a first interlayer insulating film 130 is formed.

As illustrated in FIGS. 38A to 38C, the first interlayer insulating film 130 is planarized and etched back. Herein, an upper portion of the gate insulating film 120, the polysilicon 115, and an upper portion of the third second-conductivity-type silicon layer 201 are removed.

As illustrated in FIGS. 39A to 39C, a second interlayer insulating film 131 is deposited.

As illustrated in FIGS. 40A to 40C, a fourth resist 132 is formed.

As illustrated in FIGS. 41A to 41C, the second interlayer insulating film 131, the first interlayer insulating film 130, the fourth insulating film 111, and the second gate insulating film 120a are etched.

As illustrated in FIGS. 42A to 42C, the second gate 121a, the second gate insulating film 120a, and the third insulating film 109 are etched to form a contact hole 133.

Figure 43A:
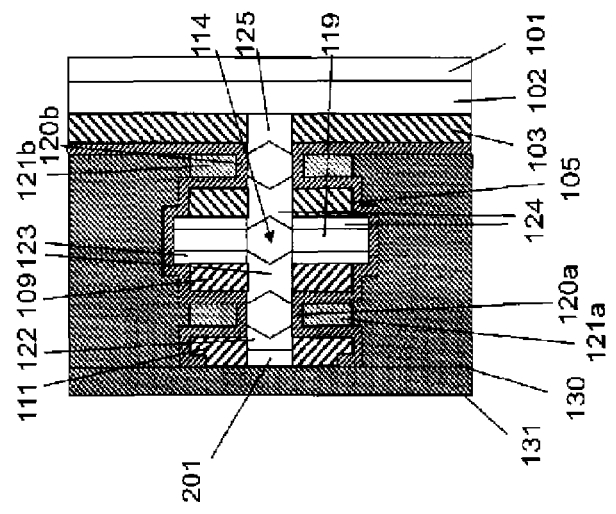
FIG. 43A is a plan view illustrating a method for producing a semiconductor device according to an embodiment of the present invention.
Figure 43B:
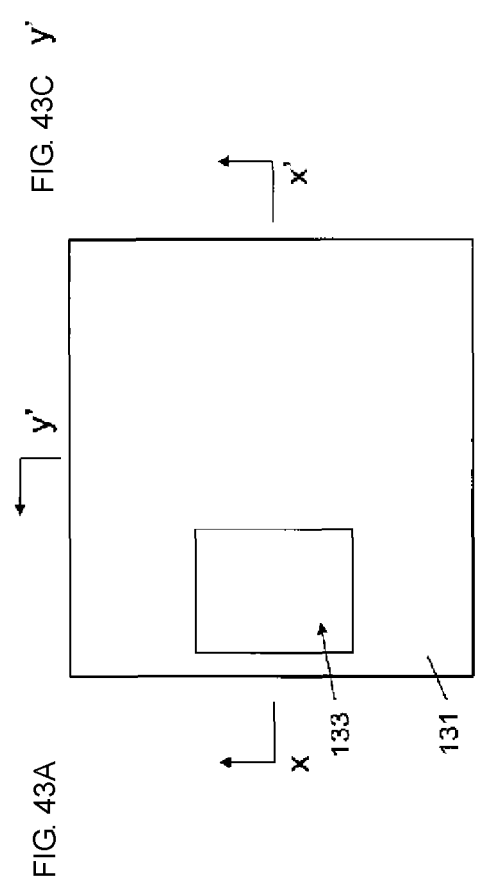
FIG. 43B is a sectional view taken along line x-x' of FIG. 43A.
Figure 43C:
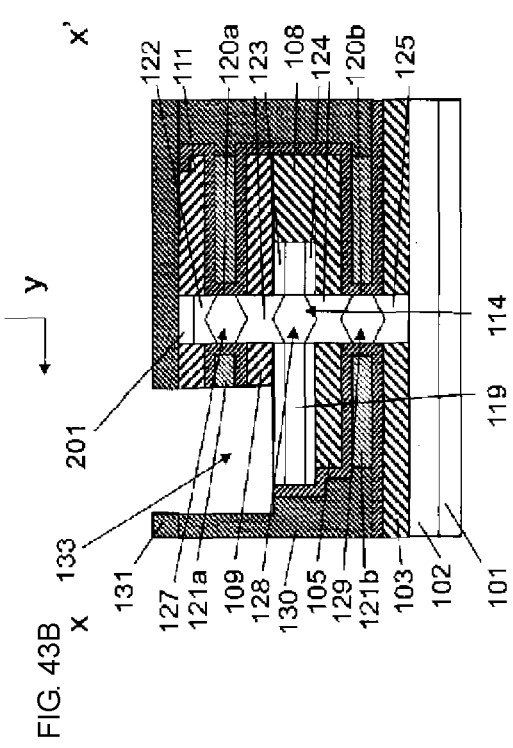
FIG. 43C is a sectional view taken along line y-y' of FIG. 43A.

As illustrated in FIGS. 43A to 43C, the fourth resist 132 is removed.

Figure 44A:
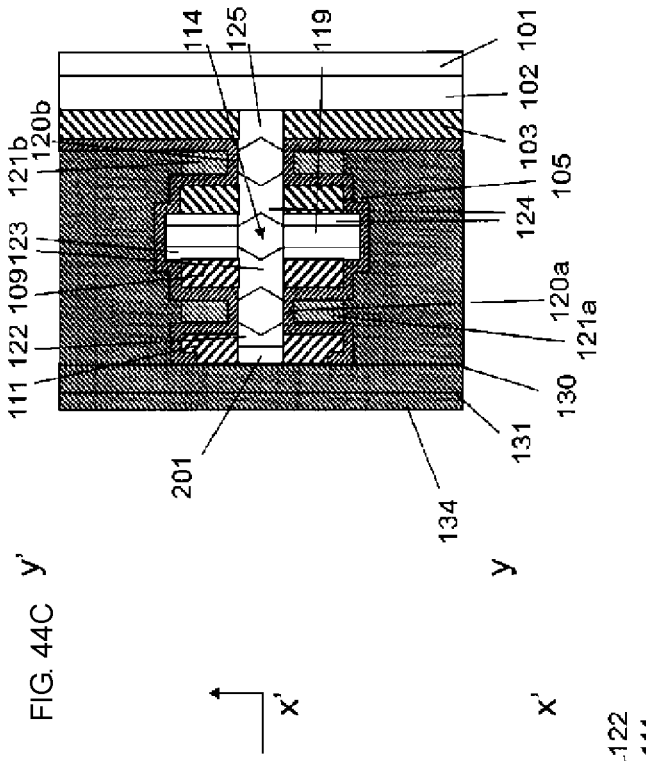
FIG. 44A is a plan view illustrating a method for producing a semiconductor device according to an embodiment of the present invention.
Figure 44B:
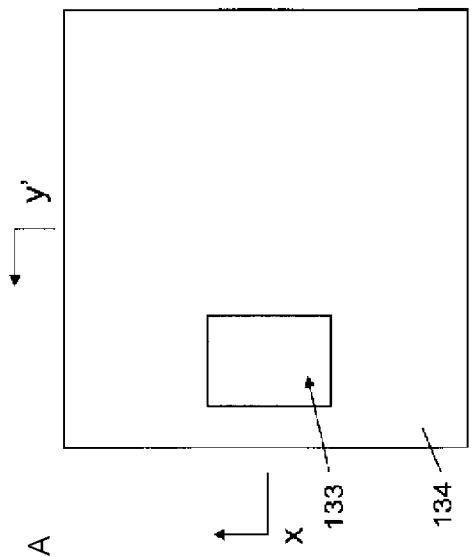
FIG. 44B is a sectional view taken along line x-x' of FIG. 44A.
Figure 44C:
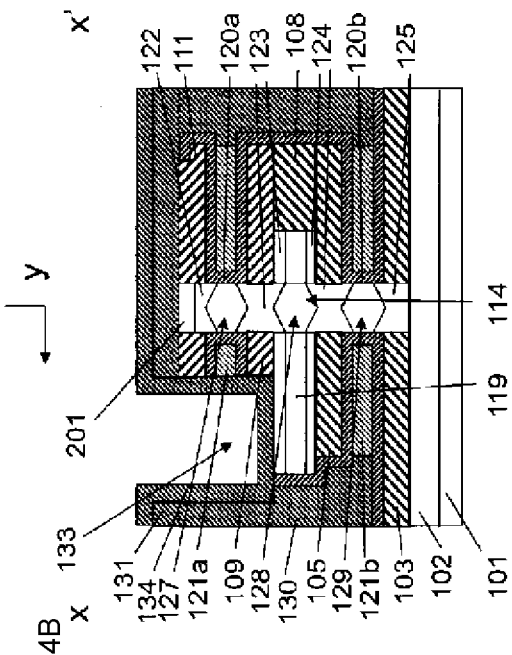
FIG. 44C is a sectional view taken along line y-y' of FIG. 44A.

As illustrated in FIGS. 44A to 44C, an eleventh insulating film 134 is deposited. The eleventh insulating film 134 is preferably an oxide film or a nitride film.

As illustrated in FIGS. 45A to 45C, the eleventh insulating film 134 is etched so as to be left as a sidewall.

As illustrated in FIGS. 46A to 46C, a silicide 135 is formed in the output terminal 119, and thus the second first-conductivity-type silicon layer 124 and the first second-conductivity-type silicon layer 123 are connected to each other.

As illustrated in FIGS. 47A to 47C, a metal is deposited to form a contact 136.

As illustrated in FIGS. 48A to 48C, a fifth resist 137 is formed.

As illustrated in FIGS. 49A to 49C, the second interlayer insulating film 131 and the first interlayer insulating film 130 are etched to form a contact hole 138.

As illustrated in FIGS. 50A to 50C, the fifth resist 137 is removed.

As illustrated in FIGS. 51A to 51C, a sixth resist 139 is formed.

Figure 52A:
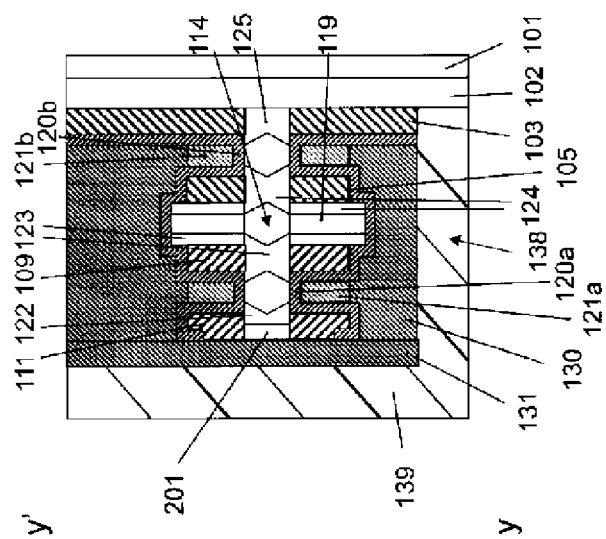
FIG. 52A is a plan view illustrating a method for producing a semiconductor device according to an embodiment of the present invention.
Figure 52B:
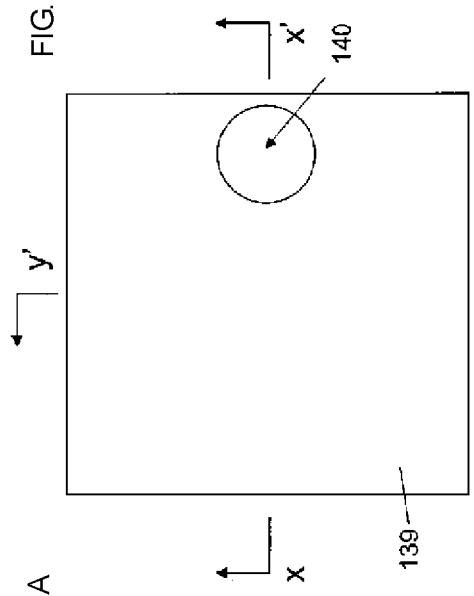
FIG. 52B is a sectional view taken along line x-x' of FIG. 52A.
Figure 52C:
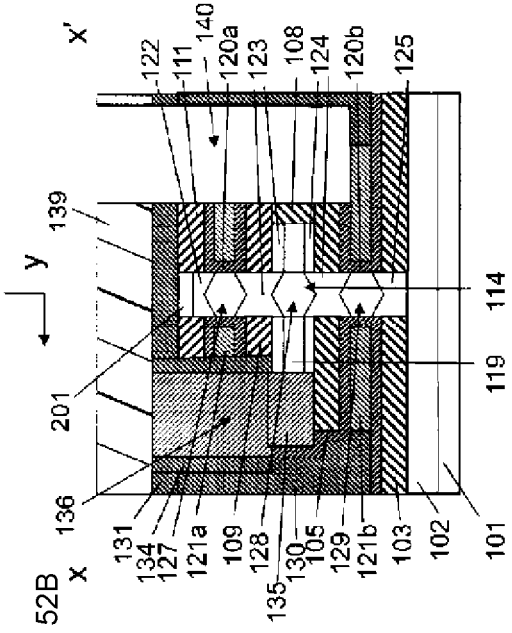
FIG. 52C is a sectional view taken along line y-y' of FIG. 52A.

As illustrated in FIGS. 52A to 52C, the second interlayer insulating film 131, the first interlayer insulating film 130, the fourth insulating film 111, the second gate insulating film 120a, the second gate 121a, the second gate insulating film 120a, the third insulating film 109, the seventh insulating film 108, the second insulating film 105, and the first gate insulating film 120b are etched to form a contact hole 140.

As illustrated in FIGS. 53A to 53C, the sixth resist 139 is removed.

As illustrated in FIGS. 54A to 54C, a metal is deposited to form a first contact 141 and a contact 142.

As illustrated in FIGS. 55A to 55C, the second interlayer insulating film 131 is etched to expose the third second-conductivity-type silicon layer 201.

As illustrated in FIGS. 56A to 56C, a metal 143 is deposited.

As illustrated in FIGS. 57A to 57C, seventh resists 144, 145, 146, and 147 are formed.

As illustrated in FIGS. 58A to 58C, the metal 143 is etched to form metal wirings 143a, 143b, 143c, and 143d.

As illustrated in FIGS. 59A to 59C, the seventh resists 144, 145, 146, and 147 are removed.

The method for producing a semiconductor device according to an embodiment of the present invention has been described above.

In the present invention, various embodiments and modifications can be made without departing from the broad sprit and scope of the present invention. Furthermore, the above-described embodiment is provided to describe one embodiment of the present invention, and the scope of the present invention is not limited thereto.

For example, a method for producing a semiconductor device in which the p-type (including the p$^+$-type) and the n-type (including the n$^+$-type) are each changed to the opposite conductivity type in the above embodiment, and a semiconductor device produced by the method are also obviously included in the technical scope of the present invention.

The invention claimed is:

1. A method for producing a semiconductor device, the method comprising:
    depositing a first oxide film containing an impurity having a first conductivity type on a substrate;
    depositing a nitride film;
    depositing a second oxide film containing an impurity having a second conductivity type that differs from the first conductivity type;
    etching the first oxide film containing the impurity having a first conductivity type, the nitride film, and the second oxide film containing the impurity having the second conductivity type to form a contact hole;
performing epitaxial growth in the contact hole to form a first pillar-shaped silicon layer; and
removing the nitride film while leaving the first and second oxide films to expose a sidewall portion of the first pillar-shaped silicon layer and performing epitaxial growth to form an output terminal.

2. A method for producing a semiconductor device, the method comprising
depositing a first oxide film containing an impurity having a first conductivity type on a substrate;
depositing a nitride film;
depositing a second oxide film containing an impurity having a second conductivity type that differs from the first conductivity type;
etching the first oxide film containing the impurity having the first conductivity type, the nitride film, and the second oxide film containing the impurity having the second conductivity type to form a contact hole;
performing epitaxial growth in the contact hole to form a first pillar-shaped silicon layer;
removing the nitride film while leaving the first and second oxide films to expose a sidewall portion of the first pillar-shaped silicon layer and performing epitaxial growth to form an output terminal; and
performing a heat treatment after performing the epitaxial growth to form a second first-conductivity-type semiconductor layer and a first second-conductivity-type semiconductor layer in the first pillar-shaped silicon layer and the output terminal.

* * * * *